United States Patent [19]
Kido et al.

[11] Patent Number: 5,255,202
[45] Date of Patent: Oct. 19, 1993

[54] DIGITAL SIGNAL PROCESSING METHOD AND SYSTEM, ELECTRIC POWER SYSTEM SIGNAL PROCESSING SYSTEM AND ELECTRIC POWER CONTROL SYSTEM

[75] Inventors: Mitsuyasu Kido, Hitachi; Tomio Chiba, Katsuta; Hiroyuki Kudo, Hitachi; Junzo Kawakami, Mito; Tadao Kawai, Katsuta, all of Japan

[73] Assignee: Hitachi, Ltd., Tokyo, Japan

[21] Appl. No.: 640,595

[22] Filed: Jan. 11, 1991

[30] Foreign Application Priority Data

Jan. 16, 1990 [JP] Japan .................. 2-6685
Feb. 16, 1990 [JP] Japan .................. 2-35785
Mar. 15, 1990 [JP] Japan .................. 2-64939

[51] Int. Cl.$^5$ .............................................. G06F 15/20
[52] U.S. Cl. ..................... 364/483; 364/572; 364/724.01; 364/574
[58] Field of Search ............... 364/480, 481, 482, 483, 364/484, 485, 486, 487, 572, 574, 724.01, 724.03, 724.19; 324/76 R, 77 B, 78 F; 73/611, 659

[56] References Cited

U.S. PATENT DOCUMENTS

| | | | |
|---|---|---|---|
| 4,674,062 | 6/1987 | Premerlani | 324/76 R |
| 4,866,435 | 9/1989 | Frick | 364/724.05 |
| 4,878,185 | 10/1989 | Brand et al. | 364/572 |
| 4,950,999 | 8/1990 | Agnello et al. | 324/77 B |
| 5,007,007 | 4/1991 | van Zanten et al. | 364/724.19 |
| 5,010,507 | 4/1991 | Kenny | 364/724.01 |

*Primary Examiner*—Thomas G. Black
*Assistant Examiner*—Michael Zanelli
*Attorney, Agent, or Firm*—Antonelli, Terry, Stout & Kraus

[57] ABSTRACT

Analog signals are sampled and converted into digital data which is then filtered by a digital filter. The filtered digital data is then subjected to an arithmetic operation. The blocking band of the digital filter is set to a frequency band which is above the pass band of the analog signal components. Frequency of sampling, as well as the frequency of noise caused by the sampling, is elevated, so that the noise frequency falls within the blocking band of the digital filter.

44 Claims, 41 Drawing Sheets

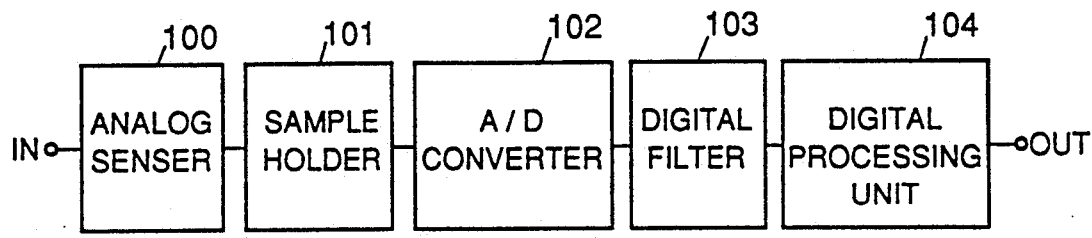
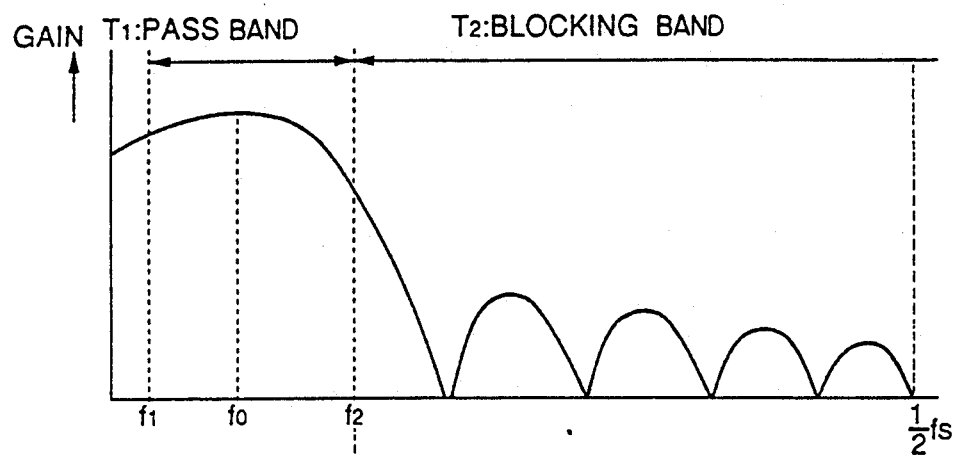
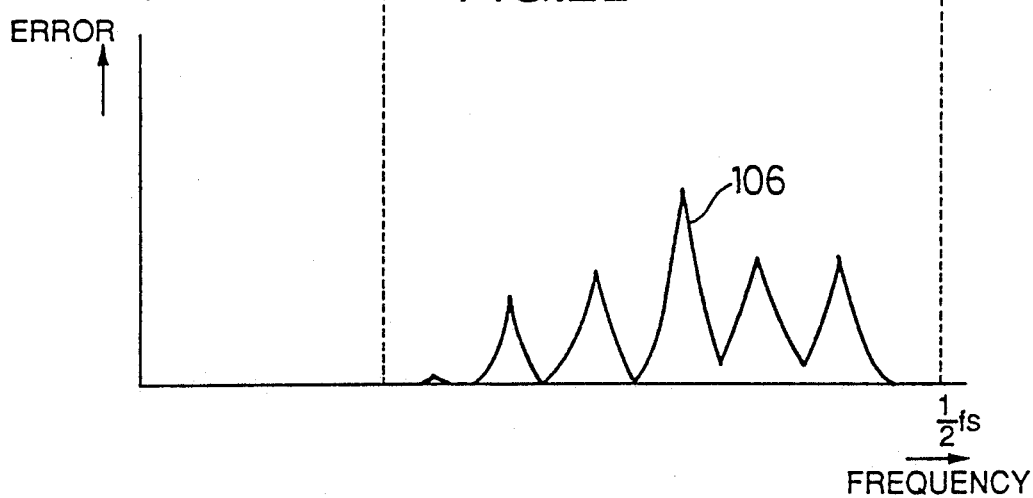

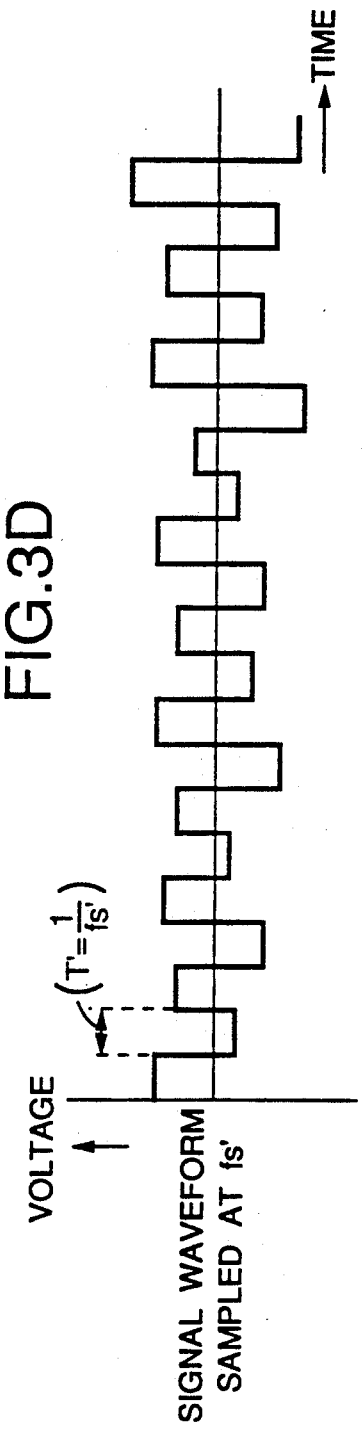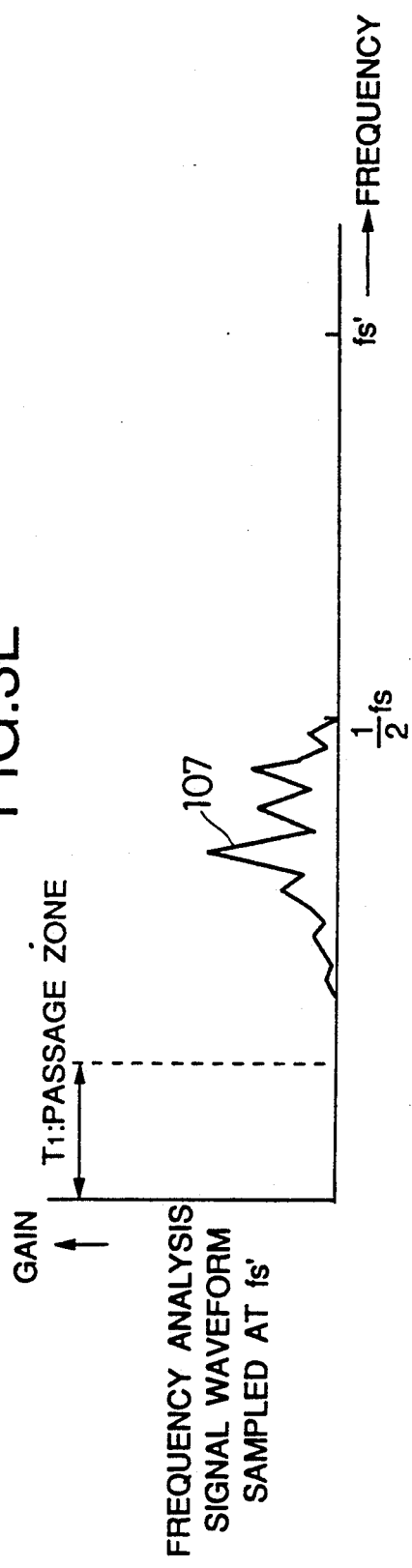

FIG.8
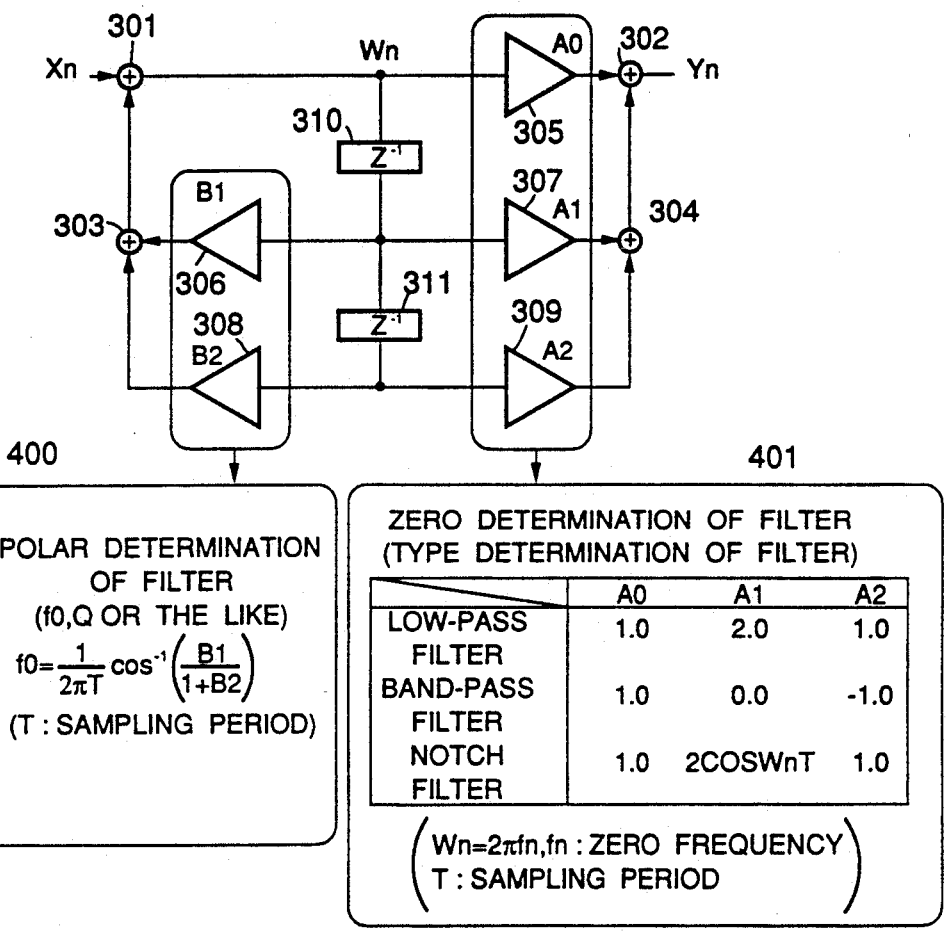
FIG.9A FIG.9B FIG.9C
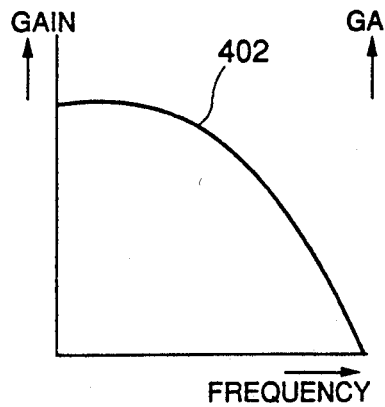
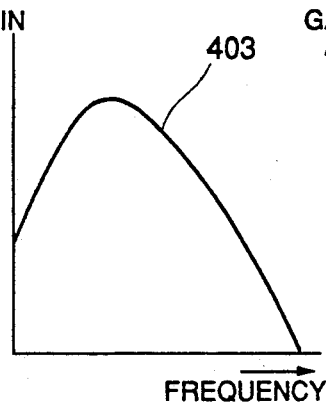
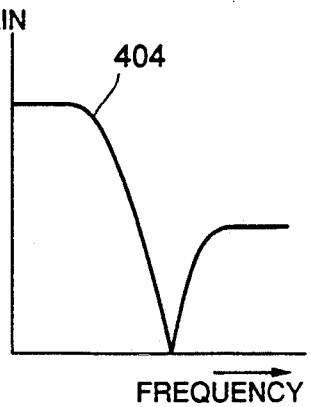

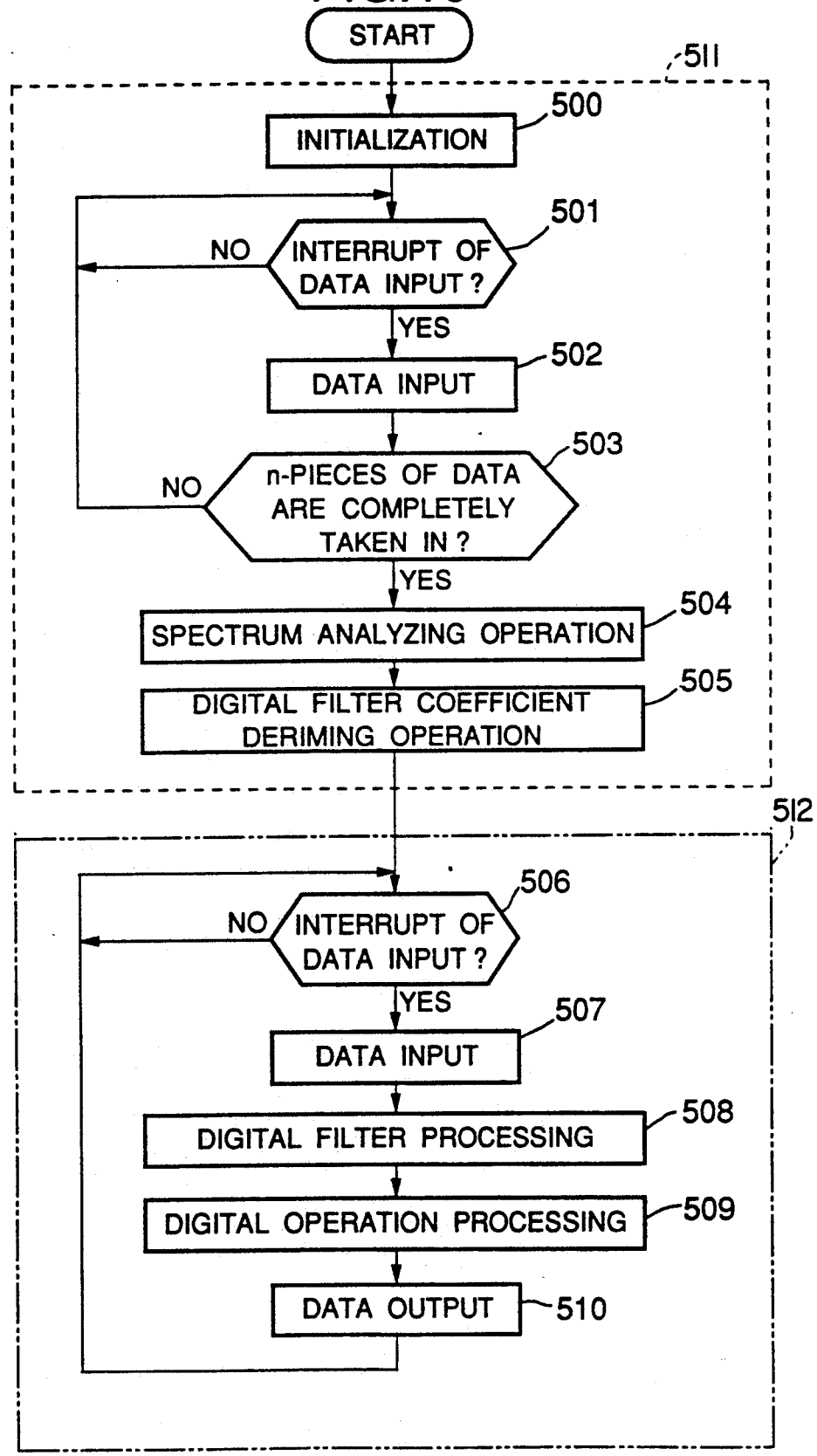

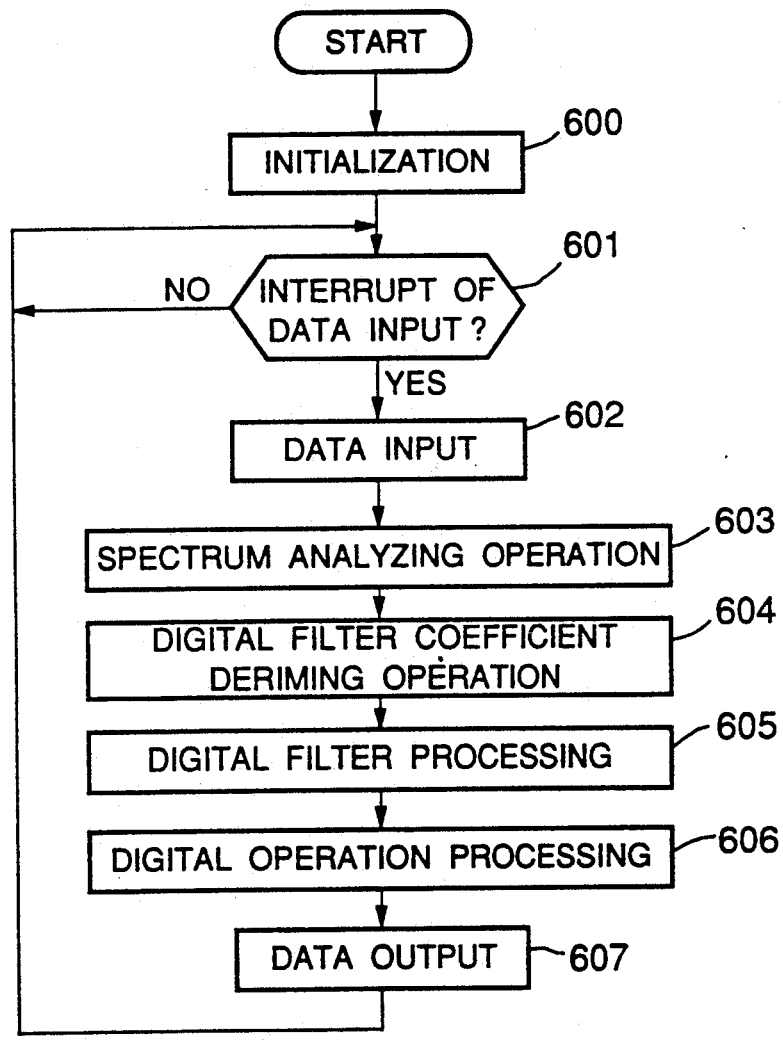

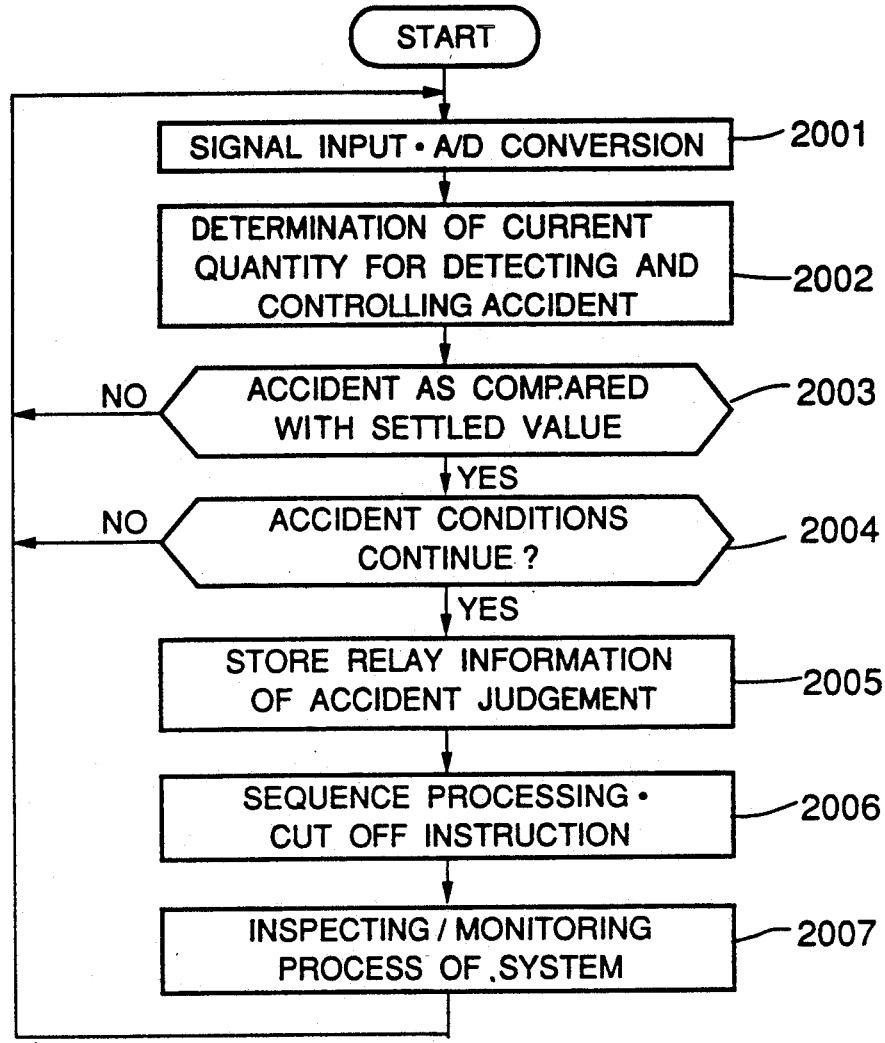
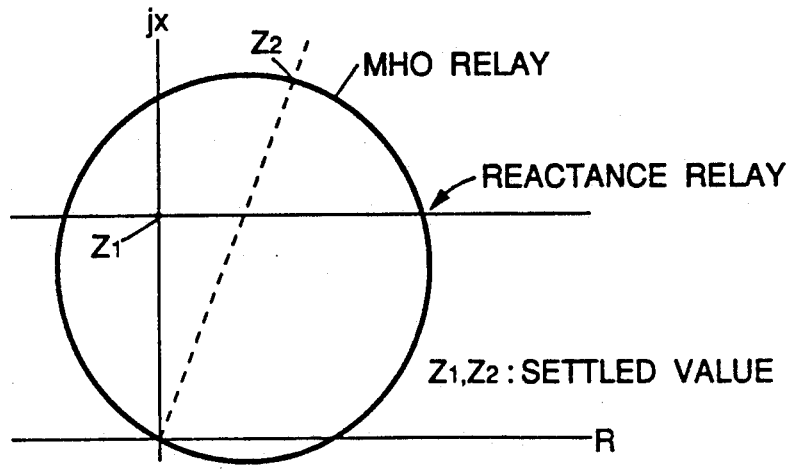

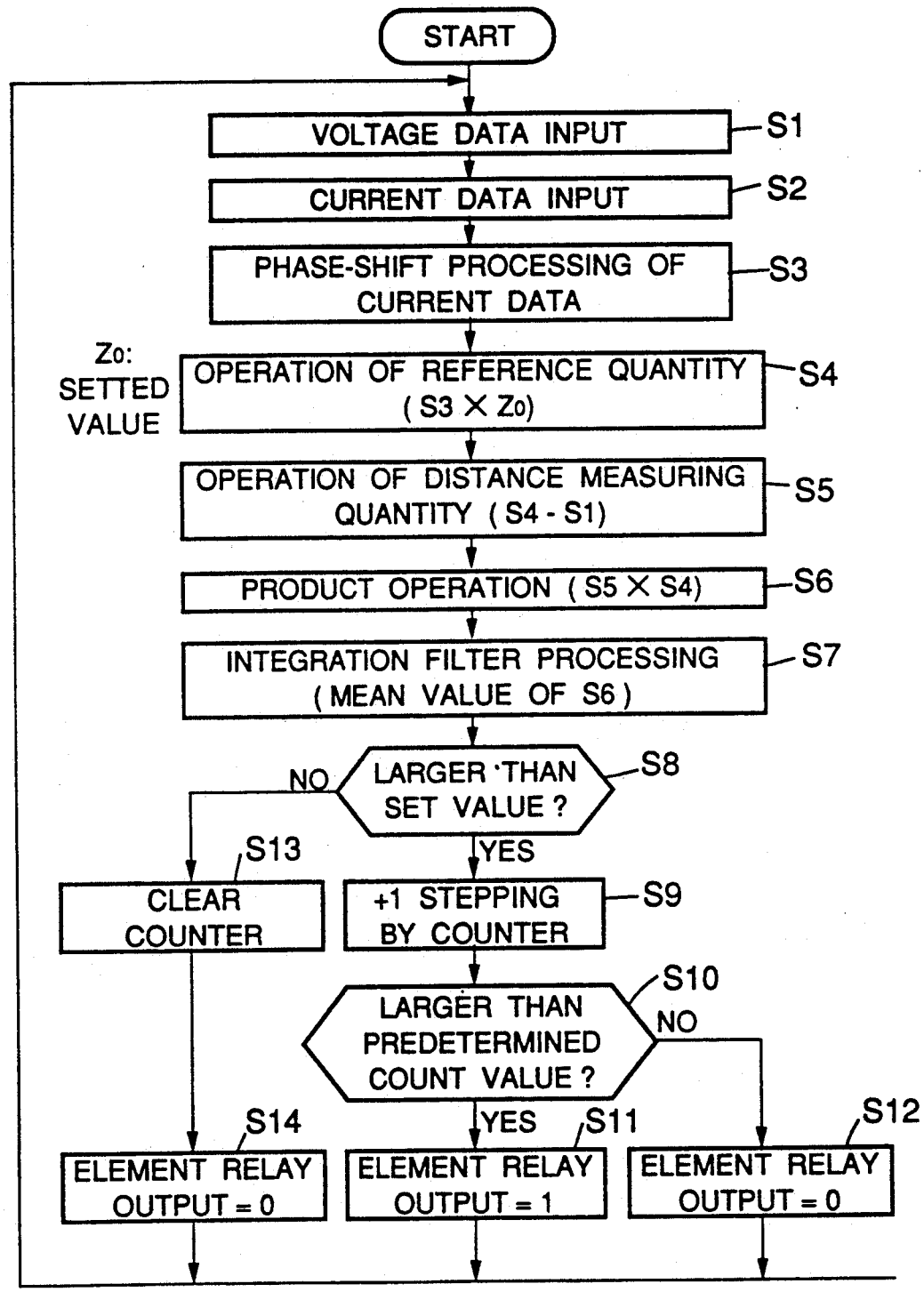

INPUT SIGNAL

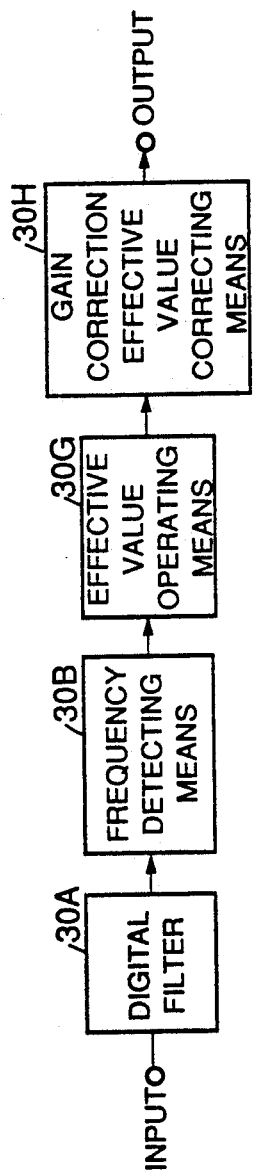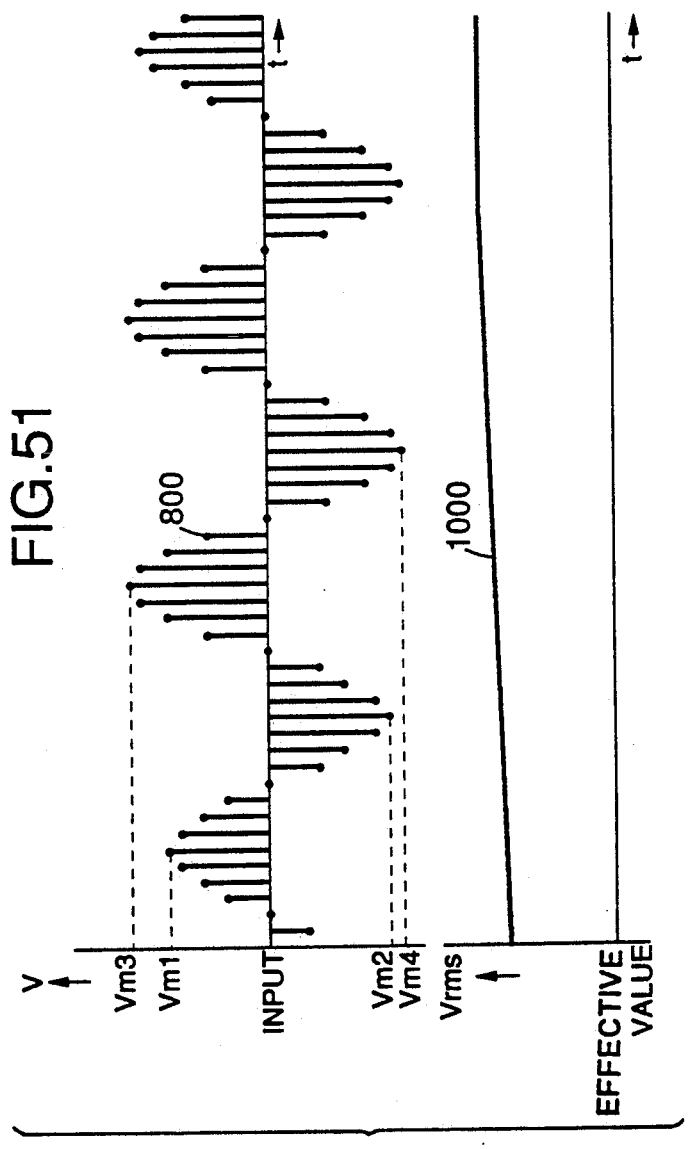

DIGITAL SIGNAL PROCESSING METHOD AND SYSTEM, ELECTRIC POWER SYSTEM SIGNAL PROCESSING SYSTEM AND ELECTRIC POWER CONTROL SYSTEM

BACKGROUND OF THE INVENTION

1. Field of the Invention

The present invention is directed generally to a digital signal processing method and system, and more particularly, to a digital signal processing method and system suited to convert AC signals of an electric power system into digital signals and detect an electric quantity of the AC signals from the converted digital signals.

This invention also relates generally to a signal processing system for obtaining a physical quantity of effective values of input signals of voltages and currents which are inputted from an electric power system, an electric power system digital control system and a digital relay system which utilize this signal processing system, and more particularly, to those suitable for digital signal processing to digitally converting the input signals.

2. Description of the Prior Art

As disclosed in Japanese Patent Laid-Open Publication NO. 121420/1988 or stated from p. 12 onwards in "A Report of the Electric Engineering Association", No. 12, Vol. 105, a known convectional system of this type is employed for an electric power system digital protective relay. This type of system comprises an input unit, processing unit, a settling unit and an output unit. Incorporated into this input unit is a digital signal processor including an analog filter for eliminating high frequencies, a sample hold circuit, a multiplexer, and A/D converter and a buffer. This system adopts the following construction. Higher harmonic components overlapped with fundamental harmonics are eliminated from analog input signals by means of the analog filter. Output signals of the analog filter are sampled with a period of 600 Hz, thereby converting the analog signals into digital signals. Impedances or magnitudes of a voltage or current of the electric power system are obtained from the digital signals. The relay is thus operated.

Based on the conventional techniques given above, the analog filter is capable of eliminating the higher harmonic components overlapped with the analog input signals and disturbance noises as well. No consideration is, however, given to noises caused in the portions subsequent to the analog filter, such noises including, e.g., the disturbance noises and those incidental to errors in quantization of the A/D converter. This in turn causes a disadvantage of generating an error in arithmetic value of digital data due to those noises. The following is a description in greater detail. A sampling frequency is set at 600 Hz. In a frequency band, the noises are produced concomitantly with the quantization errors and the disturbance noises when effecting sampling. This frequency band is overlapped with a pass band (frequency band of analog input signal) of the analog filter. In consequence, the analog input signals can not be separated from the noises concomitant with the disturbance noises and the quantization errors. It follows that these noises cause arithmetic errors. For this reason, it is impossible to sufficiently enhance a performance of resolving power of the A/D converter.

Known as an electric power control system which utilizes this type of system is a voltage/reactive power control system stated on pp. 1200–1201 in a report of "The 946th National Meeting of The Electric Engineering Association" in 1987.

When driving this type of electric power control system, a common practice is detection of effective values of the AC signals of the electric power system. On the occasion of the detection of effective values of the AC signals, the following method has hitherto been adopted. The AC signals are inputted to the filter for attenuating the higher harmonic components thereof. A frequency of the AC signal is detected from an output signal of the filter. A gain of the output signal of the filter is corrected based on the detected frequency. On the basis of the corrected signal, the effective value of the AC signal is calculated. According to this method, even when the frequency of the AC signal fluctuates, the gain is corrected to keep the filter output signal at a constant level. It is therefore possible to obtain the effective values corresponding to the fluctuations in frequency.

There arise, however, the following problems inherent in the prior art. Sufficient concerns are, as will be explained later, not paid to characteristics of the input filter. If the frequency of the AC signal fluctuates, the electric quantity of the AC signals can not accurately be obtained in some cases.

(1) Since the input filter is composed of an analog filter, there are caused a scatter in elements, a deterioration in property due to a change with a passage of time and an inter-channel scatter.

(2) The input signal is sampled at 600 Hz (or 720 Hz: electrical angle of 30° of fundamental harmonic). It is therefore required that an intricate algorithm be executed to obtain the frequency with a high accuracy. Besides, a multiplicity of arithmetic units are required to be added.

(3) A gain characteristic of the input filter is fixed. Hence, when the frequency of the input signal fluctuates, it is also required that the gain be corrected.

(4) When the frequency of the AC signal fluctuates, the fundamental harmonic of the fluctuated AC signal can not sufficiently be attenuated. This results in an increase in detection error of the effective value.

SUMMARY OF THE INVENTION

It is a primary object of the present invention to provide a digital signal processing method and system to which this method is applied, the method and the system being capable of enhancing an arithmetic accuracy of digital data by separating noises incidental to quantization errors and disturbance noises from analog input signals.

It is another object of the present invention to provide a digital signal processing method, a digital signal processing system, an electric power system voltage/reactive power control system to which the same digital signal processor is applied and a digital multimeter as well, which are all capable of precisely obtaining an electric quantity of the AC signals even when a frequency of an AC signal fluctuates.

It is still another object of the present invention to provide an electric power system signal processing system capable of detecting physical quantities of the AC signals with a high accuracy by preventing a decline in detection accuracy due to the fluctuations in system frequency.

It is a further object of the present invention to provide, in addition to the above-described objects, an electric power system signal processing system exhibiting a much higher detection accuracy.

To accomplish the foregoing objects, according to one aspect of the present invention, there is provided a method of processing a digital signal, comprising the steps of: converting an analog signal into a digital signal after sampling the analog signal; effecting a filtering process on the digital data by use of a digital filter; setting a blocking band of the digital filter to a higher frequency band than a pass band of the analog signal when arithmetically processing the filtering-processed digital data; and setting a sampling frequency so that a region in which noises are caused due to disturbance noises and a quantization error falls within the blocking band of the digital filter.

Based on this method adopted therein, a 1/N frequency (N: the integer greater than 2) of the sampling frequency is set to a zero point frequency of the digital filter.

The attenuation characteristics and the zero point frequency of the digital filter are settable in accordance with actually measured values of the noises incidental to the quantization error and the disturbance noises.

Besides, the noise generating region associated with the disturbance noises and the quantization error and its magnitude are arithmetically obtained, and the zero point frequency and the attenuation characteristics of the digital filter are settable based on these arithmetic results.

To accomplish the foregoing objects, according to another aspect of the present invention, there is provided a system for processing a digital signal, comprising: a sample bold means for sample-holding an analog signal; an analog-to-digital converting means for converting the data held by the sample hold means into digital data; a digital filter means for effecting a filtering process on the digital data outputted from the analog-to-digital converting means; and a digital processing means for executing arithmetic processing on the basis of the digital data outputted from then digital filter means, characterized by the digital filter means in which a blocking band of the digital filter is set to a higher frequency band than a pass band of the analog signal, and a sampling frequency of the sample hold means is set so that a noise generating region associated with disturbance noises and a quantization error falls within the blocking band of the digital filter means.

Based on the system thus constructed, a zero point frequency of the digital filter means is set to a 1/N frequency (N; the integer greater than 2) of the sampling frequency.

Adopted is the digital signal processing system in which the zero point frequency of the digital filter means is set to a 1/N frequency (N: the integer greater than 2) of the sampling frequency.

To accomplish the foregoing objects, according to still another aspect of the invention, there is provided a method of processing a digital signal, comprising the steps of: converting an AC signal into a digital signal by sampling the AC signal; effecting a filtering process on the digital signal by use of a gain variable type digital filter; detecting a frequency of the AC signal from an output signal of the digital filter when obtaining an electric quantity of the AC signal from the output signal of the digital filter; and adjusting a gain characteristic of the digital filter in accordance with the detected frequency.

Based on this method adopted therein, a frequency of the AC signal is detected from an output signal of the digital filter. A filter coefficient for making the detected frequency coincident with a set frequency of the digital filter is calculated. A gain characteristic of the digital filter is adjusted in accordance with the calculated filter coefficient.

Furthermore, a frequency of the AC signal is detected from an output signal of the digital filter. A filter coefficient for making the detected frequency coincident with a set frequency of the digital filter is selected on the basis of a detection frequency from a group of filter coefficients preset corresponding to specified frequencies. A gain characteristic of the digital filter is adjusted in accordance with the selected filter coefficient.

A filtering process is effected on the digital filter signal after inputting the digital filter signal to a gain fixed type digital filter. A frequency of the AC signal is detected from an output signal of the digital filter. Calculated is a filter coefficient for making the detected frequency coincident with a set frequency of the gain variable type digital filter. A gain characteristic of the gain variable type digital filter is adjusted in accordance with the calculated filter coefficient.

To accomplish the foregoing objects, according to a further aspect of the invention, there is provided a system for processing a digital signal, comprising: a sample hold means for sample-holding an AC signal; an analog-to-digital converting means for converting the signal held by the sample hold means into a digital signal; a gain variable type digital filter means for extracting the digital signal of a specific frequency component by effecting a filtering process of the digital signal; a frequency detecting means for detecting a frequency of the AC signal from the output signal of the digital filter means; a gain adjusting means for adjusting a gain characteristic of the digital filter means on the basis of a detection output of the frequency detecting means; and an electric quantity calculating means for calculating the electric quantity of the AC signal from the output signal of the digital filter means.

According to still a further aspect of the invention, there is provided a system for processing a digital signal, comprising: a sample hold means for sample-holding an AC signal; an analog-to-digital converting means for converting the signal held by the sample hold means into a digital signal; a gain variable type digital filter means for detecting the digital signal of a specific frequency component by effecting a filtering process on the digital signal; a frequency detecting means for detecting a frequency of the AC signal from the output signal of the gain variable type digital filter means; a filter coefficient calculating means for detecting a filter coefficient for making the detected frequency coincident with a set frequency of the digital filter means on the basis of the detection output of the frequency detecting means; a gain adjusting means for adjusting a gain characteristic of the digital filter means in accordance with the filter coefficient calculated by the filter coefficient calculating means; and an electric quantity calculating means for calculating an electric quantity of the AC signal from the output signal of the digital filter means.

To accomplish the foregoing objects, according to yet another aspect of the invention, there is provided a system for processing a signal of an electric power system, comprising: a filter for eliminating a higher harmonic of an inputted AC signal of the electric power system; a physical quantity detecting means for detecting a physical quantity of the effective value and the like of the AC signal processed by the filter; a frequency detecting means for detecting a frequency of the AC signal; and a gain correcting means for correcting any one of the AC signal inputted to the physical detecting means and the detected physical quantity.

As the filter, both an analog filter and a digital filter are applicable. In the case of the digital filter, the AC signals of the electric power system are inputted with a constant sampling period. In this instance, the sampling period is preferably less than 1/24 of the fundamental frequency of the AC signal of the electric power system in terms of the detection accuracy.

The physical quantity is an effective value of the AC signal. The physical quantity detecting means includes a peak value detecting means for obtaining a peak value of the gain-corrected AC signal and an effective value arithmetic means for obtaining the effective value of the AC signal from the obtained peak value. In this case, the physical quantity detecting means includes an averaging processing means for detecting peak values and effective values for a plurality of periods of the AC signals inputted thereto, averaging the effective values for the plurality of periods and outputting the averaged value thereof.

The effective value can be produced by integrating the gain-corrected AC signal. Besides, the physical quantity detecting means includes a peak value detecting means for obtaining the peak value of the AC signal outputted from the filter and an effective value arithmetic means for obtaining the effective value of the AC signal. The gain correcting means corrects the obtained effective value. Moreover, the effective value is obtained by integrating the AC signal outputted from the filter. The effective value is gain-corrected by the gain correcting means.

The gain correction data are approximate functions set by rectilinear approximation in a plurality of sections formed by dividing a constant frequency range the reference of which is the fundamental frequency of the AC signal.

According to yet a further aspect of the invention, there is provided a system for processing a signal of an electric power system, comprising: a digital filter for eliminating a higher harmonic of an AC signal of the electric power system which is inputted with a constant sampling period; and a physical quantity detecting means for detecting a physical quantity such an effective value of the AC signal outputted from the digital input filter. A filter coefficient is set so that a frequency-gain characteristic of the digital input filter becomes a constant value within a constant range the reference of which is the fundamental frequency of the AC signal.

According to the present invention having the above-described constructions, the foregoing objects are fulfilled by the following action.

Namely, the analog signal undergoes sampling and the A/D conversion, whereby the analog signal becomes a discrete signal having the 1/N frequency (N: integer greater than 2) of the sampling signal. For this reason, if sampling is performed at a high velocity, the frequencies of the synthesis noises including the disturbance noises and those incidental to the quantization error can be increased. Hence, the sampling frequency is set so that the synthesis noise generating region is larger than the blocking band of the digital filter. As a result, the synthesis noises can be produced in the blocking band of the digital filter. The blocking band of the digital filter is set in the higher frequency band than the pass band of the analog signal. The synthesis noises can thereby be removed. This in turn makes it possible to increase the S/N ratio of the digital data. The highly accurate data can be also obtained.

When setting the attenuation characteristics of the digital data, the zero point frequency of the digital filter is set to the 1/N frequency of the sampling frequency. The synthesis noises can remarkably be reduced.

The noise components and the frequency components of the noises concomitant with the quantization error are caused at random. The attenuation characteristics of the digital filter are set from the results of analyzing the frequencies. It is therefore feasible to decrease the errors, corresponding to the state where the noises are generated.

The analog signal is sampled with the period smaller than the arithmetic period of digital arithmetic processing. The errors can considerably be reduced. The resolving power greater than that of the A/D converting means can be obtained.

The frequency of the AC signal is detected from the output signal of the digital filter. The gain characteristic of the digital filter is adjusted in accordance with the detected frequency. Consequently, even when the frequency of the AC signal fluctuates, the higher harmonics of the AC signals can invariably be eliminated. The precise electric quantity of the AC signals can be also acquired from the output signals of the digital filter.

Besides, even if the gain characteristic of the input filter is not constant with respect to the frequency, the physical quantity gain of the effective value obtained from the AC signal or the filtering-processed AC signal is corrected by the gain correcting means on the basis of the frequency-gain characteristics. The physical quantity obtained increases in accuracy.

The effective value is procured from the gain-corrected peak value, and hence the detection accuracy is further improved. In this case, fast sampling is effected with the period which is 1/24 or under of the fundamental frequency of the AC signal. With this arrangement, the zero-cross point relative to the frequency detection can be detected with the high accuracy. The frequency associated with the gain correction is also detectable with the high accuracy. As a result, the gain is corrected accurately.

The sampling process is carried out at the high speed. Hence, the peak value is acquired simply by making a comparison with the absolute value of the input AC signal. In this case, where the digital signal processor is employed for calculating the peak value, the intricate numerical calculations can be executed at the high velocity. The peak value is arithmetically obtained from the data of several samples.

When the digital input filter is constructed by use of the digital signal processor, the problems inherent in the above-mentioned analog filter can be obviated. Besides, highly accurate and stable filter characteristics are easily attainable for the plurality of channels. The characteristics, which could not be obtained by the analog filter, are procured.

The frequency-gain characteristics of the digital input filter are so set that the gain is constant within the range of constant frequencies. As explained earlier, the necessity for the gain correction is eliminated. The peak value and the effective value can be acquired with the high accuracy.

BRIEF DESCRIPTION OF THE DRAWINGS

Other object and advantages of the present invention will become apparent during the following discussion taken in conjunction with the accompanying drawings, in which:

FIG. 1 is a block diagram showing one embodiment of the present invention;

FIGS. 2A and 2B are diagrams showing characteristics of a digital filter depicted in FIG. 1;

FIGS. 3A through 3E are waveform diagrams of assistance in explaining sampling methods both of the present invention and of the prior art;

FIG. 8 is a diagram showing an applied example of the IIR type filter;

FIGS. 9A through 9C are diagrams showing characteristics of frequencies when using the filter illustrated in FIG. 8;

FIGS. 10 and 11 are flowcharts which assist in explaining the action when the present invention is applied to an adaptive filter;

FIG. 13 is a flowchart which assists in explaining the action exhibited in FIG. 12;

FIG. 14 is a diagram showing phasic characteristics of the electric power system control/protective system;

FIG. 15 is a flowchart which assists in explaining the action of a reactance relay;

FIG. 50 is a block diagram depicting a voltage effective value detecting unit relative to this invention;

FIG. 51 is an explanatory time chart showing operations in the embodiment;

DETAILED DESCRIPTION OF THE PREFERRED EMBODIMENTS

Figure 3A:
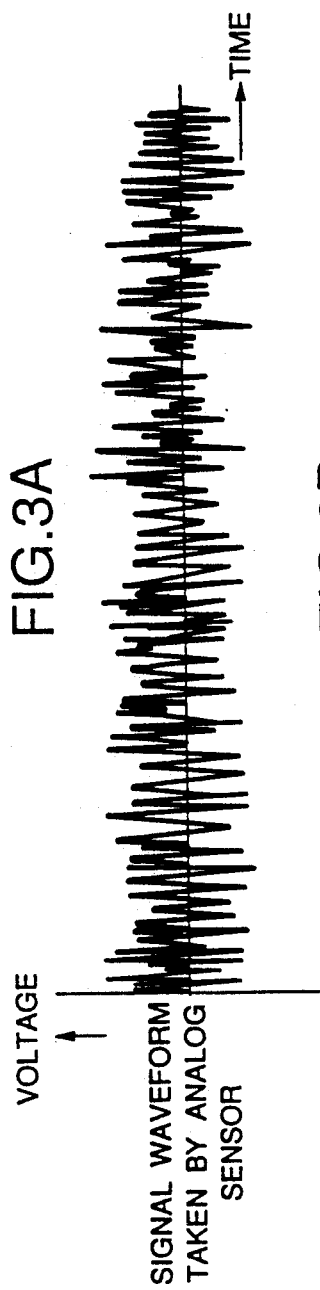

One embodiment of the present invention will hereinafter be described with reference to the accompanying drawings.

Referring first to FIG. 1, a digital signal processing system is composed of a sample holder 101, an A/D converter 102, a digital filter 103 and a digital processing unit 104. An analog signal is inputted to the sampler holder 101 from an analog sensor 100. The analog sensor 100 is constructed to convert data of a variety of analog quantities of, e.g., an electric current, a voltage, a speed, a pressure and a temperature into voltages. The analog signals of the analog sensor 100 are inputted to the sample holder 101. The sample holder 101 sample-holds these signals. The held data are then outputted to the A/D converter 102. The A/D converter 102 converts the input data into digital data. The thus converted data are outputted to the digital filter 103. The digital filter 103 effects filtering on the input data, thereby extracting data of a specified frequency component from a group of input data. The extracted data is outputted to the digital processing unit 104. Based on the input data, the digital processing unit 104 effects a variety of arithmetic operations. The processing unit 104 then outputs the arithmetic results.

Figure 3B:
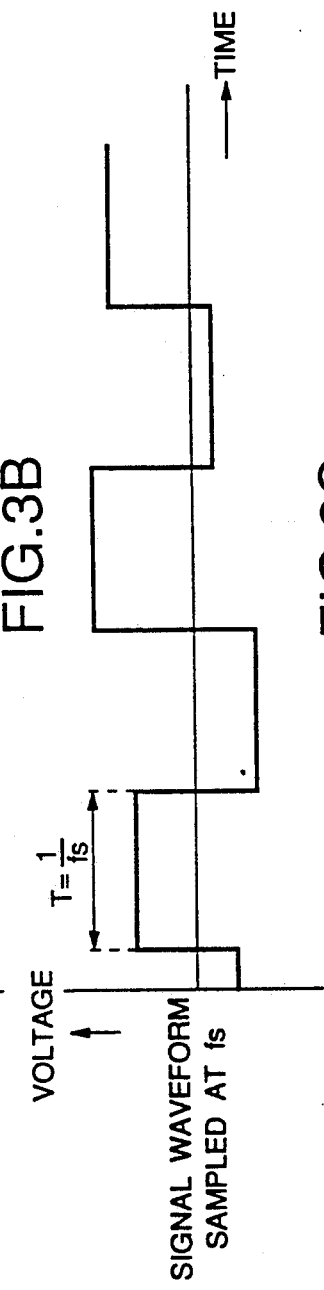
Figure 3C:
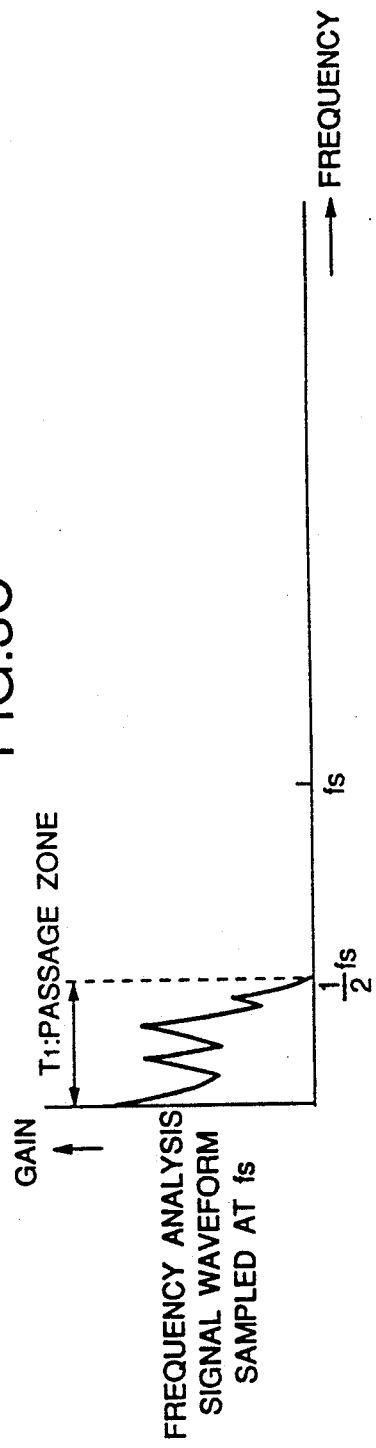

After making an attempt to measure the output signals of the analog sensor 100, as clarified from FIG. 3A, the signal components of the analog signals turned out to contain higher-order harmonic components. To be specific, the analog signals contain noises, so-called disturbance noises induced to a power supply as noise components. Such disturbance noises are also caused in an input of the A/D converter 102 as well as in an output of the sample holder 101. The analog signal is sampled at a sampling frequency fs=600 Hz. A waveform at this time is illustrated in FIG. 3B. When analyzing the frequency, as shown in FIG. 3C, the noise is produced within a passage zone of the analog signal. It could be confirmed that this noise component is generated depending on a frequency that is 1/N (N is the integer larger than 2) as small as the sampling frequency fs.

To cope with this, as illustrated in FIGS. 2A and 2B, in accordance with this embodiment, a blocking zone T2 of the digital filter 103 is set to have a frequency higher than in a passage zone T1 of the analog signal. Simultaneously, the sampling frequency fs of the sample holder 101 is so set that a noise generating region associated with a quantization error and the disturbance noises as well is within the blocking band T2 of the digital filter 103. More specifically, where frequencies f1–f2 are set in the pass band, a frequency region f2–½ fs is set to serve as the blocking band T2. In the case of setting characteristics of the digital filter 103, it is enough to allow for a portion that is less than one-half of the sampling frequency fs as a frequency band handled on the sampling theorem. Therefore, it follows that the frequency-gain characteristics are set to attenuate, e.g., a portion of the frequencies f2–½ fs.

Based on the foregoing configuration, as illustrated in FIG. 3D, the analog signal is sampled at a sampling frequency fs=3 kHz. In this case, as shown in FIG. 3E, synthesis noises 107 containing the disturbance noises and the noises incidental to the quantization error deviate from the pass band T1. It was confirmed that the noises 107 are produced within the blocking band T2 of the digital filter 103. Namely, the synthesis noises can be separated from the analog signal. This in turn makes it possible to process the digital signal with a high accuracy.

Figure 4:
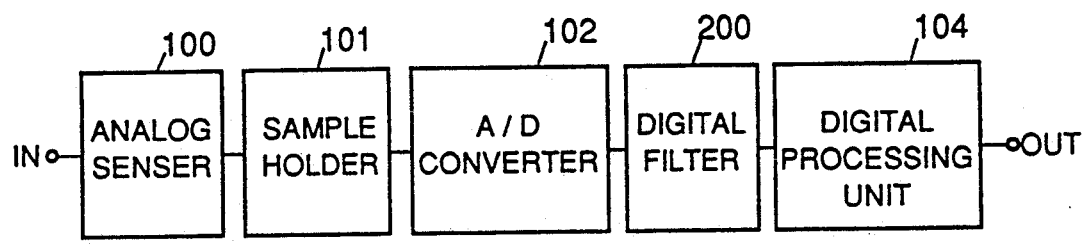
FIG. 4 is a block diagram illustrating another embodiment of this invention.

An embodiment developed from the one shown in FIG. 1 will next be explained referring to FIG. 4.

In this embodiment, a different component is a digital filter 200, and other components are the same as those in the previous embodiment. The same components are therefore marked with the like symbols, and the description thereof is omitted.

Figure 5A:
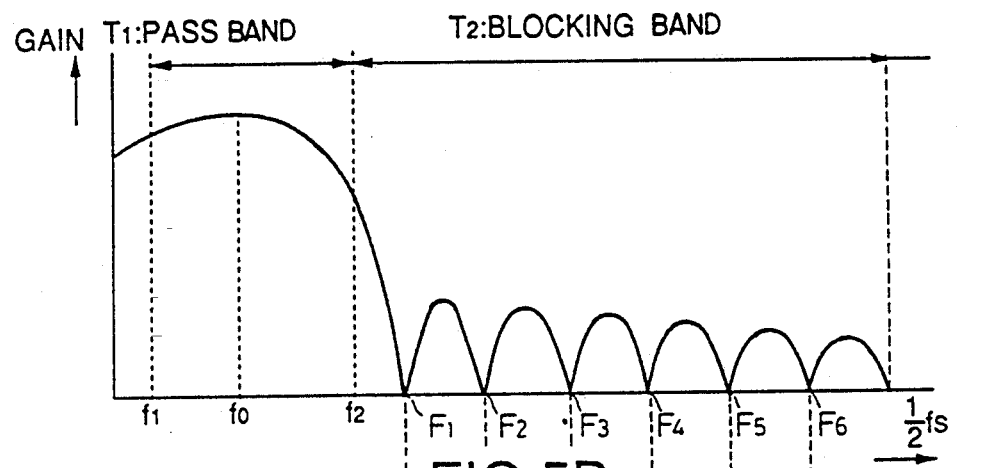
FIGS. 5A and 5B are diagrams showing characteristics of the digital filter depicted in FIG. 4.
Figure 5B:
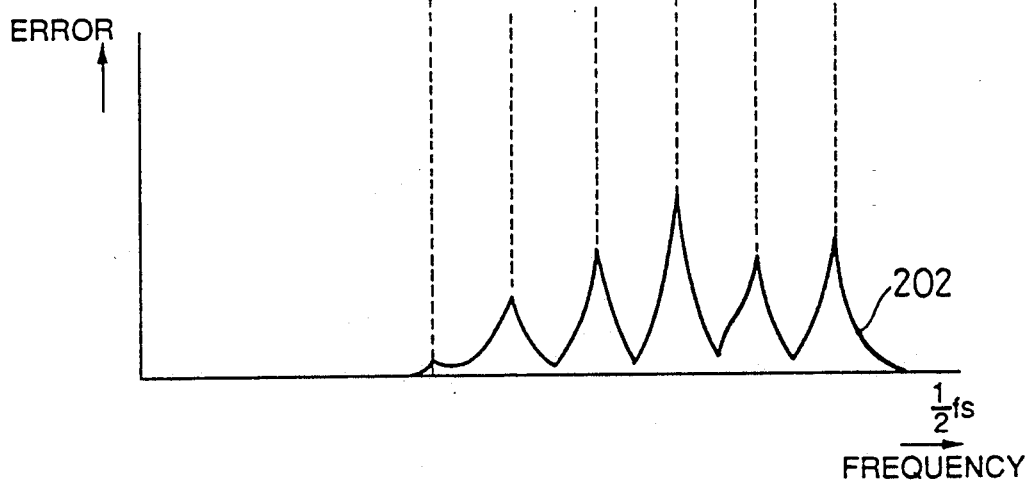

The synthesis noises containing both the disturbance noises and the noises concomitant with the quantization error are generated depending on the 1/N frequency (N is the integer) of the sampling frequency fs. As illustrated in FIGS. 5A and 5B, zero point frequencies F1–F6 of the digital filter 200 are set to match with the frequencies of noises 202. Owing to this setting, the noises can be attenuated. In this case, all the frequencies, which are contained in the blocking band T2 and are 1/integer the sampling frequency fs, are selected as the zero point frequencies of the digital filter 200. Alternatively, only the zero point frequencies assuming higher levels are selectable from actually measured values of the noise levels. The synthesis noises are produced at random. For this reason, the zero point frequencies can be set by predicting the frequencies at which a good deal of synthesis noises are caused. Besides, as will be mentioned later, the noise generating frequencies are detected. A configuration and characteristics of the digital filter 200 can be adaptively modified so that the detected frequencies become the zero point frequencies of the digital filter 200.

Moreover, the A/D converter 102 is constructed to have a 12-bit resolving power. In this case, when employing the digital filter 200 exhibiting the characteristics shown in FIGS. 5A and 5B, it is feasible to obtain a resolving power greater than that of the A/D converter 102.

Figure 6:
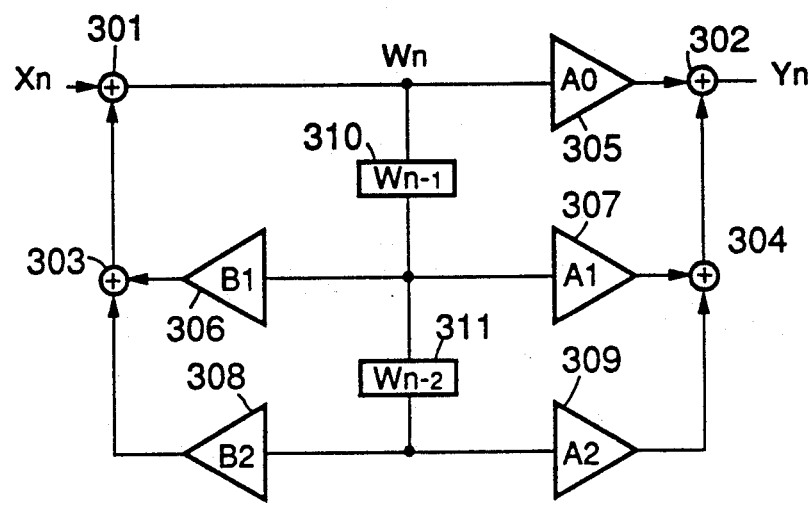
FIG. 6 is a block diagram illustrating an IIR type filter.
Figure 7:
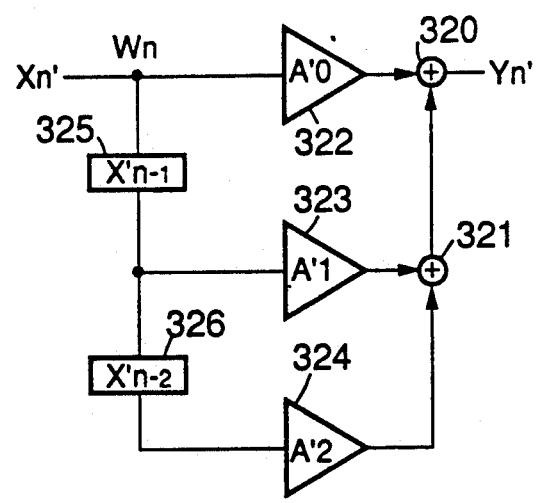
FIG. 7 is a block diagram illustrating an FIR type filter.

The following is a description of an embodiment of the digital filter 200 with reference to FIGS. 6 and 7.

FIGS. 6 and 7 each show a typical block conceptual configuration of the digital filter 200. FIG. 6 illustrates an IIR (Infinite-extent Impulse Response) type filter. FIG. 7 illustrates an FIR (Finite-extent Impulse Response) type filter.

Turning to FIG. 6, when the degree is secondary, the filter consists of adder blocks 301 through 304, filter coefficient blocks 305 through 309, a delay block 310 for delaying a signal Wn by 1/T (T: period) and a delay block 311 for delaying a signal Wn-1 by 1/T. Input signals Xn are subjected to filtering to generate filter output data Yn.

The signal Wn and the data Yn in the filter described above are expressed by the following arithmetic formulae (1) and (2):

$$Wn = Xn + Wn-1 \cdot B1 + Wn-2 \cdot B2 \qquad (1)$$

$$Yn = Wn \cdot A0 + Wn-1 \cdot A1 + Wn-2 \cdot A2 \qquad (2)$$

Based on the foregoing configuration, there are attainable a variety of filters expressed by the following formulae (3) to (7) by adjusting the filter coefficients 305 through 309:

(low-pass filter)
$$H(z) = \frac{1 - B_1 + B_2}{4} \cdot \frac{(1 + Z^{-1})^2}{1 - B1 \cdot Z^{-1} + B2 \cdot Z^{-2}} \quad (3)$$

(band-pass filter)
$$H(z) = \frac{1 - B_2}{2} \cdot \frac{1 - Z^{-2}}{1 - B1 \cdot Z^{-1} + B2 \cdot Z^{-2}} \quad (4)$$

(high-pass filter)
$$H(z) = \frac{1 + B_1 + B_2}{4} \cdot \frac{(1 - Z^{-1})^2}{1 - B1 \cdot Z^{-1} + B2 \cdot Z^{-2}} \quad (5)$$

(notch filter)
$$H(z) = \frac{1 + B_2}{2} \cdot \frac{1 - r \cdot Z^{-1} + Z^{-2}}{1 - B1 \cdot Z^{-1} + B2 \cdot Z^{-2}} \quad (6)$$

where
$r = 2 \cdot \cos 2\pi f_0 \cdot T$
T: sampling period
fo: blocking frequency (all-pass filter)
$$H(z) = \frac{Z^{-2} - B1 \cdot Z^{-1} + B2}{1 - B1 \cdot Z^{-1} + B2 \cdot Z^{-2}} \quad (7)$$

Note that z is the transfer function, and Z corresponds to s of the analog system ($s = jw$, $z = e^{jw}$)

The filter depicted in FIG. 7 comprises adder blocks 320 and 321, filter coefficient blocks 322 to 324, a delay block for delaying an input signal $X'n$ by $1/T$ and a delay block 326 for delaying a signal $X'n-1$ by $1/T$. The input signals $X'n$ are filtering-processed, and output data $Y'n$ are thereby outputted.

The input signal $X'n$ in the thus constructed filter is given by the following arithmetic formula (8):

$$X'n = A'0 \cdot X'n + A'1 \cdot X'n - 1 + A'2 \cdot X'n - 2 \quad (8)$$

To obtain desired attenuation characteristics, the filter explained above is cascade-connected.

When employing the filters given above, this embodiment adopts the following arrangement. As will be stated later, a digital filter means using a DSP (digital signal processor) performs filtering on the input signals. The arithmetic operation is repeatedly performed per sampling period on the basis of the predetermined filter coefficient. As a result, the time-division filtering process is effected softwarewise according to the number of input points. It is therefore possible to correspond to an increase or decrease in the number of input points, changes in characteristic and standardization of a printed board. Namely, if a signal system for 12 channels is needed, the analog filters for 12 channels are also required. When using the filter in this embodiment, however, the filter may be constructed softwarewise corresponding to the number of channels.

Filtering is attainable by employing no analog filter. Hence, there exists absolutely no factor for an initial value deviation, as seen in the analog filter, of an element such as a resistor or capacitor, fluctuations in the element value due to the ambient temperatures and a deterioration of the element because of reductive changes. A higher performance can be attained, and any adjustment can be eliminated. Besides, an externally attached inspection circuit becomes unnecessary. It is feasible to correspond to the changes in characteristic by use of the internal software. In consequence, the manufacturing steps can remarkably be reduced, and the maintenance is also unnecessary.

The following is an explanation of an embodiment wherein error frequency components are detected, the configuration and characteristics of the digital filter 200 are modified to further reduce the errors.

The explanation starts with touching on an example of changing the characteristics of the digital filter 200 with reference to FIG. 8.

The digital filter 200 depicted in FIG. 8 is of an IIR type. The Filter 200 can be constructed depending entirely on the coefficients of the filter coefficient blocks 305, 307 and 309. For instance, the filter is configured as a low-pass filter. In this case, a coefficient A0 of the filter coefficient block 305 is set such as A0=1.0. In the filter coefficient block 307, a coefficient A1=2.0. In the filter coefficient block 309, a coefficient A2=1.0 For forming a notch filter in order to provide a zero point, the coefficients may be set as follows: A0=1, A2=2 cos wnT, and A2=1.0. (However, wn=2πfn, fn: zero point frequency).

The filter characteristics—e.g., a central frequency $f_0$ and a selectivity Q—are attainable by modifying coefficients B1 and B2 of the filter coefficient block 306 to fulfill desired characteristics.

FIGS. 9A to 9C show examples of frequency-gain characteristics of a low-pass filter 402, a band-pass filter 403 and a notch filter 404.

Next, a processing content in the embodiment of FIG. 4 will be described in detail with reference to FIGS. 10 and 11.

FIG. 10 shows an example where in an initial process indicated by a block 511, a frequency analysis of error is carried out; a filter coefficient to reduce the error is derived; and a normal process indicated by a block 512 is executed based on this filter coefficient. The following is a description of a specific content.

At a step 500, the digital data are at first stored in a data memory. At this moment, initialization of clearing of the data memory and the like is effected. There is made a judgment as to whether or not the digital data are inputted from the A/D converter 102 (step 501). When inputting the digital data (step 502), whether n-pieces, e.g., 512 pieces of digital data are inputted or not is judged (step 503). Processes up to the steps 501-503 continue till the n-pieces of digital data are inputted. When the number of data reaches the value of n, a spectrum analysis about the data is carried out (step 504). This spectrum analysis is performed by use of FET arithmetic (fast Fourier transform). Based on the spectrum analysis, the frequencies of noises generated in regions other than the pass band T1 are detected. Thereafter, the filter coefficients are derived to make the detected frequencies match with the zero point frequencies of the digital filter 200 (step 505). To be specific, when setting the zero point frequencies by use of the notch filter, the filter coefficients can be obtained by the following equations (9) through (13):

$$A0 = 1.0 \quad (9)$$

$$A1 = 2 \cos \omega_n T \quad (10)$$

$$A2 = 1.0 \quad (11)$$

$$B1 = \frac{4Q \cos \omega_0 T}{2Q + \sin \omega_0 T} \quad (12)$$

$$B2 = \frac{2Q - \sin\omega_0 T}{2Q + \sin\omega_0 T} \qquad (13)$$

where
wn: $2\pi$fn
fn: the zero point frequency
wo: $2\pi$fo
fo: the cut-off frequency
Q: the selectivity
T: the sampling period The initial process is carried out to make zero the error generating frequency by use of the above-mentioned arithmetic formulae. At this stage, the characteristics and configuration of the filter are determined. Namely, a specific number of stages at which the filter is connected to the cascades is determined. As a matter of fact, the error generating frequency does not largely vary. Hence, even when setting the characteristics and configuration of the filter at the initial time, there is caused no problem in terms of practical use.

Next, the action moves to a process of block 512. As an on-line process, whether there is a data input interrupt or not is judged (step 506). If the interrupt exists, the data are inputted (step 507). Subsequent to this step, the digital filtering process is executed by using the digital filter coefficients obtained at the initial time, thereby reducing the errors (step 508). The digital operation is performed based on the data in which the input data undergo filtering (step 509) The data pursuant to the arithmetic result are outputted (step 510).

In the embodiment of FIG. 10, the frequency analysis of the error is effected at the initial time. The filter coefficients are set pursuant to the analytic result. A contrasting arrangement of an embodiment shown in FIG. 11 will be given. The error frequency analysis is performed per sampling. The filter coefficients are adaptively modified to constantly considerably reduce the error frequency components. The following is an explanation of a concrete example.

To begin with, initial setting such as clearing of the data memory is executed (step 600). A judgment as to whether there is a data input interrupt or not is made (step 601). If the interrupt exists, the data are inputted (step 602). An on-line spectrum analysis is effected based on the input data (step 603). This spectrum analysis helps the error frequency analysis. In accordance with this analytic result, the digital filter coefficients are obtained to reduce the frequency components of the detected noises (step 604). Subsequently, after acquiring the filter coefficients, the input data undergo the filtering process (step 605). Next, the digital operation is carried out based on the filtering-processed data (step 606). This arithmetic result is outputted (step 607). A series of these operations are repeated per period T, thus calculating the digital data.

In this embodiment, the configuration and characteristics of the filter are adaptively modified. It is therefore possible to decrease the noises corresponding to a situation where the noises are produced concomitantly with the quantization error and the disturbance noises caused at random. Besides, the highly accurate digital arithmetic process can be actualized.

Figure 12:
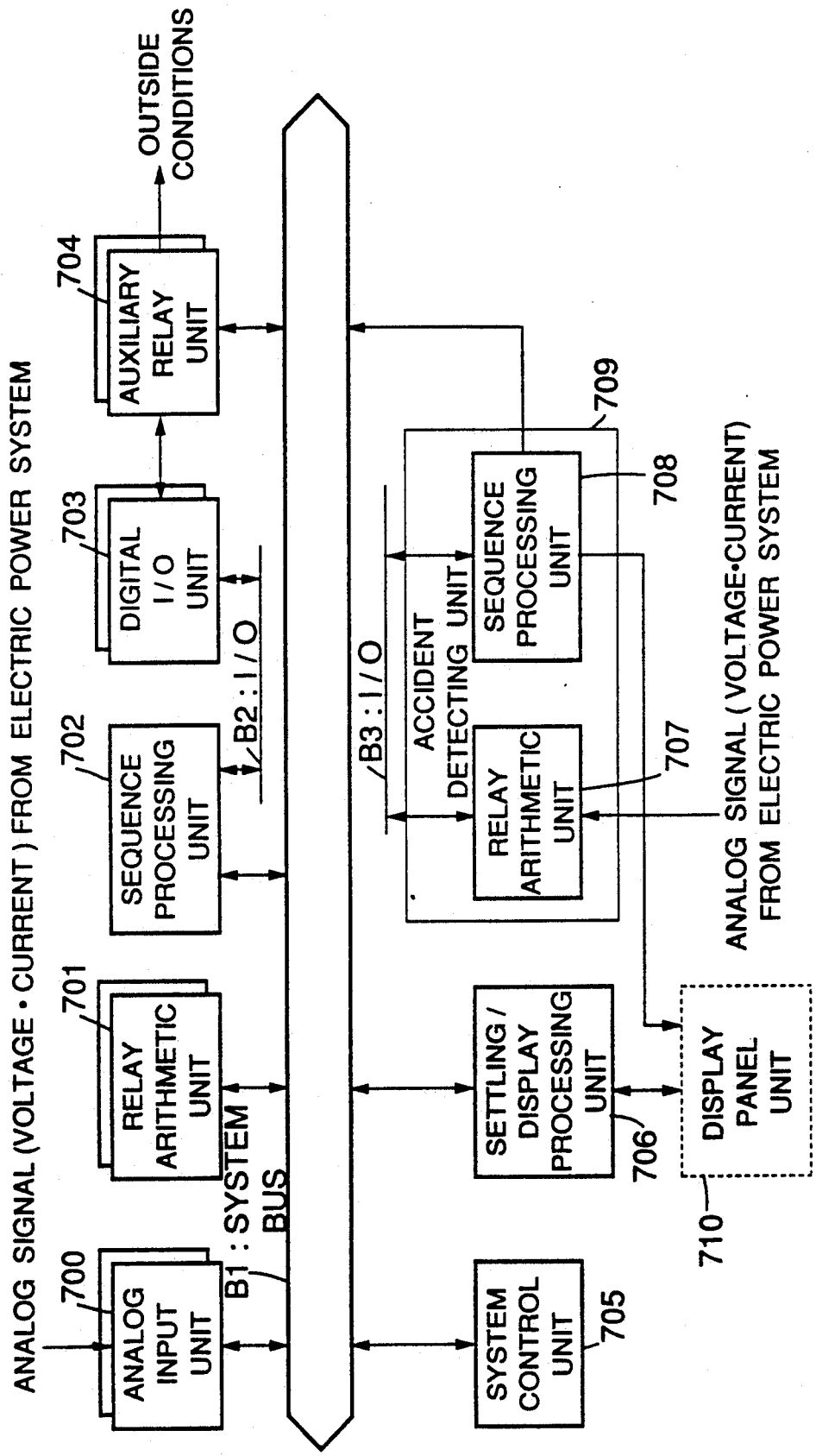
FIG. 12 is a block diagram depicting an electric power system control/protective system to which the present invention is applied.

FIG. 12 illustrates a block construction where the digital signal processing system of this invention is applied to an electric power digital protective relay system.

The system depicted in FIG. 12 incorporates protective relay processing functions allocated to nine kinds of units. The digital signal processing system of this invention is applied to an analog input unit 700 among these units. These units are a system control unit 705 for a multiprocessor system, the analog input unit 700 for performing an A/D conversion of the analog input and also a digital filtering process, a relay arithmetic unit 701, a sequence processing unit 702, a settle/display processing unit 706, a digital I/O unit 703, an accident detecting unit 709, an auxiliary relay unit 704 and a surface panel unit 710.

The units 700 to 702 and 704 to 706 are connected to each other via a general-purpose system bus B1.

The sequence processing unit is connected to the digital I/O unit 703 via an I/O bus B2 different from the system bus B1.

A relay arithmetic part 707 and a sequence processing part 708 within the accident detecting unit 709 are connected to each other through an I/O bus B3 different from the buses B1 and B2.

Note that the system incorporates a power supply unit by which the respective units are driven.

Next, an outline of the electric power digital protective relay system will be explained with reference to FIGS. 13 through 16.

At a step 2001, the electric power system information on, e.g., a voltage and current of a transmission line is inputted. Furthermore, an analog quantity is converted into a digital quantity.

At a step 2002, an electric quantity for detecting or controlling an accident is derived. The derivation of the electric quantity includes magnitudes of the voltage and current in the event of the accident in the electric power system, an impedance Z, a resistance R and a reactance X up to the point of time when causing the accident, an accident direction and further an accident frequency.

At a step 2003, the electric quantity derived at the step 2002 is compared with a predetermined settled value to give a comparative judgment. As a result of the comparative judgment, if judged as an accident, the action moves to a step 2004.

At the step 2004, whether the accident conditions judged at the step 2003 continue or not is judged. If the conditions continue, the action moves to a step 2005. At the step 2005, the information is stored because of the judgment as the accident. At a step 2006, system sequence processing (including a combination of a timer with external conditions) is carried out based on a variety of relay operations stored at the step 2005. In the case of the judgment as the accident, a cut-off instruction to a circuit breaker is issued. At a step 2007, the system is inspected and monitored.

The electric power digital control protective system repeatedly executes the above-mentioned processes during a period that is n-times (n is the integer) as large as the sampling period T of the analog input.

FIG. 14 shows an example of characteristic a known reactance relay (for one element) and a mho relay (for one element). In FIG. 14, the symbol jx represents an induction reactance of the impedance.

At the step 2002, approximately 30 to 50 relay elements are processed. An expected sequence process corresponding to the system is effected based on the outputs of these relay elements at a step 2006. The symbols $Z_1$ and $Z_2$ shown in FIG. 14 designate settled values. In the case of the protective relay, a protective range is conditional to these values. These settled values are modified on line by handling of a man from outside of the system when modifying the electric power system and the protective range incidental thereto.

Figure 16:
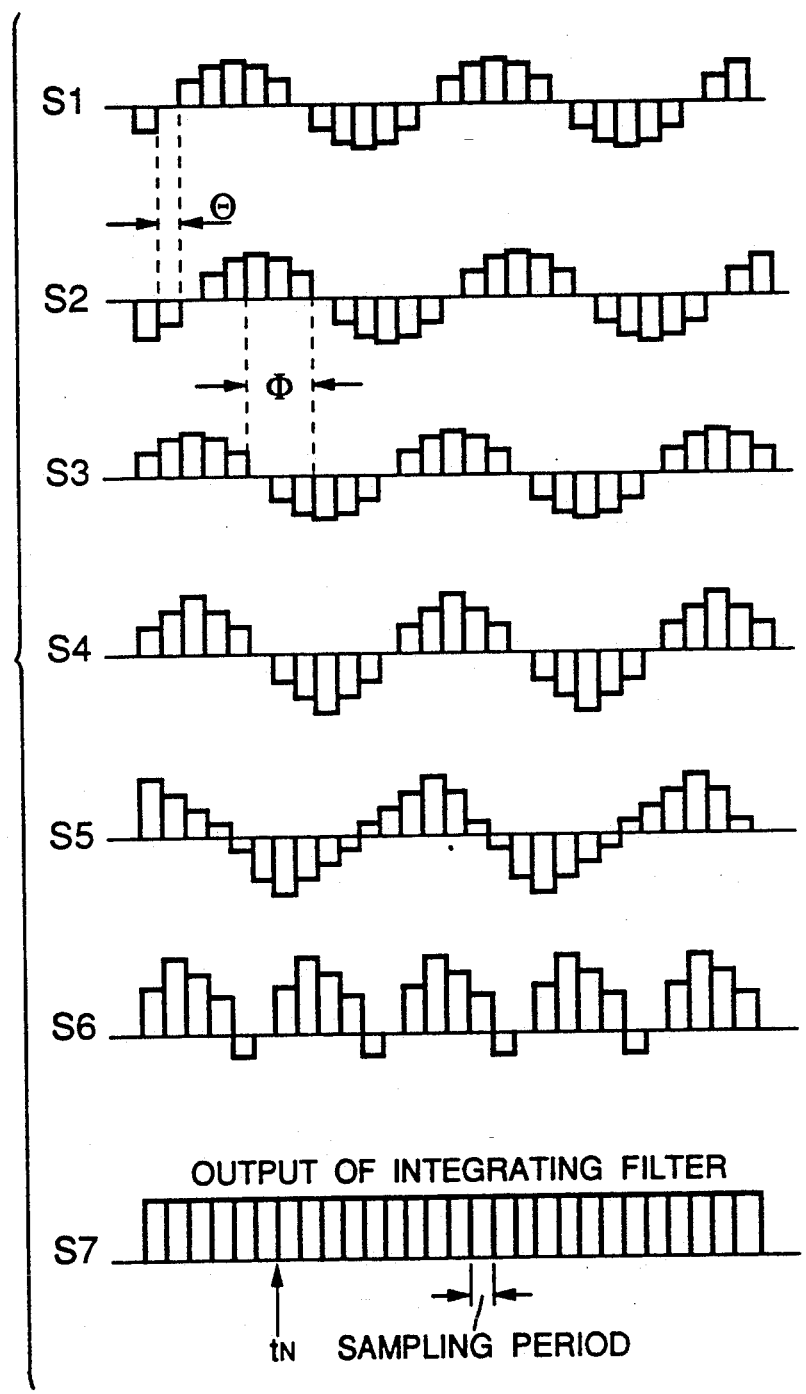
FIG. 16 is a diagram showing operating waveforms corresponding to a flow of processing.

FIG. 15 illustrates an example of a processing flow of the reactance relay depicted in FIG. 14. FIG. 16 shows an example of processed waveforms corresponding to the respective processing steps of FIG. 15. The symbols S1 through S6 in FIG. 5 correspond to those of FIG. 16.

In this reactance relay, voltage/current data are at first inputted (steps 1 and 2). A variety of arithmetic operations are effected on the voltage-current data (steps S3-S7). The arithmetic results are compared with the settled values (step S8). If the arithmetic results are larger than the settled values, a counter (not illustrated) for examining a duration of an abnormal state is incremented by +1 (step S9).

Subsequently, whether a count value of this counter becomes greater than a predetermined count value or not is examined (step S10). If greater than the predetermined value, this is judged as a status where the relay should be worked. An output of the element relay is set to 1 (step S11).

Whereas if not, the output of the element relay is set to 0. The relay remains non-operated (step S12).

If the arithmetic results are smaller than the settled values at the step S8, however, the counter is cleared (step S13). As a matter of course, the output of the element relay is 0 (step S14).

In the second place, the analog input unit of the electric power digital protective system to which the present invention is applied will be explained.

Figure 17:
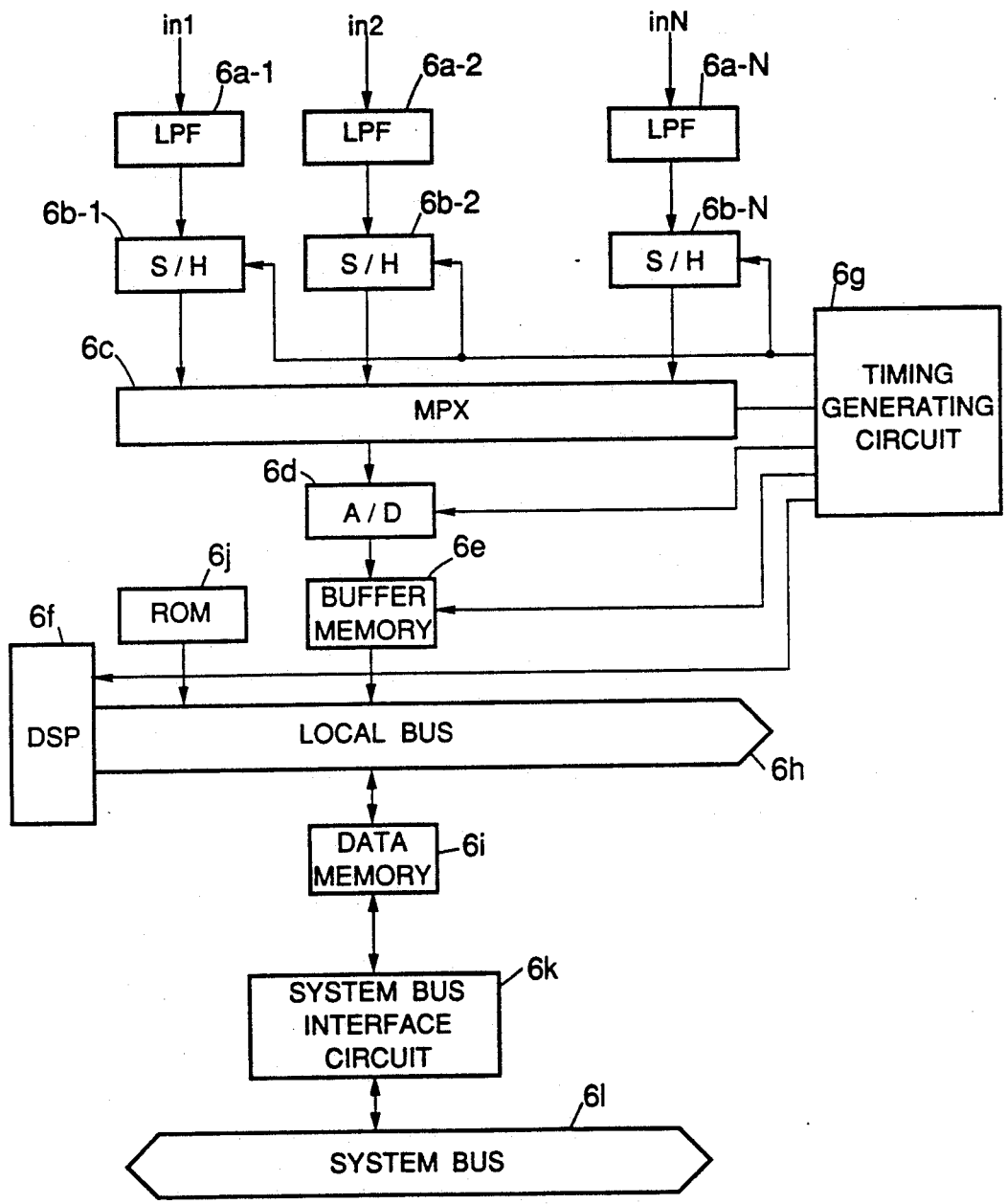
FIG. 17 is a block diagram depicting an analog input unit of the electric power system control/protective system.

Turning to FIG. 17, the symbols 6a-1 through 6a-N represent low-pass filters (employed for preventing a reflected error attributed chiefly to sampling and hereinafter abbreviated to LPFs). These filters serve to input analog signals in1 through inN inputted from outside and also eliminate the higher harmonics overlapped with the input signals. The symbols 6b-1 to 6b-N denote sample hold (hereinafter abbreviated to S/H) circuits; 6c a multiplexer (abbreviated to MPX); 6d an analog-to-digital (abbreviated to A/D) converting circuit; and 6e a dual port RAM (DPRAM) based buffer memory for A/D converted data.

The symbol 6f designates a DSP (Digital Signal Processor); 6j a program memory (ROM) for storing an instruction of the DSP 6f; 6h a local bus; 6i a dual port data memory for transferring and receiving the data to and from a system bus; 6k a system bus interface circuit; and 6l a system bus.

Designated at 6g is a timing generating circuit for controlling operations of the S/H circuits 6b-1 through 6b-N, the MPX 6c, the A/D circuit 6d and the buffer memory 6e. The timing generating circuit 6g also transmits an interrupt signal to the DSP 6f.

In the embodiment discussed above, there is exemplified a construction in which individual ICs and LSIs are combined.

The individual ICs and LSIs can, however, be integrated into one LSI.

For instance, referring to FIG., 17, the components of the analog unit—i.e., LPS, S/H, MPX and A/D converter—are integrated into one LSI. The DPS, ROM, buffer memory and data memory are also integrated into one LSI, thereby remarkably compactly miniaturizing the circuit.

An additional easy-to-understand arrangement will be given. The ICs and LSIs associated with the respective functions shown in FIG. 17 are integrated into one LSI. In this manner, the circuit is further miniaturized compactly.

The digital filter arithmetic operation explained earlier is affected by the DSP 6f of FIG. 17. Namely, the digital filter arithmetic operation, as described before, requires a multiplicity of repetitions of affecting a product-sum operation of decimal point data. For this reason, the DSP capable of performing the product-sum operation at a high speed is preferable.

The DSP is classified into a fixed point arithmetic type and a floating point arithmetic type. According to this invention, the processor for executing the digital filter arithmetic operation is applicable to both types. However, the floating point arithmetic type DSP is more desirable. It is because a wider dynamic range can be secured, and there is no necessity for particular awareness about an overflow or underflow.

Next, the DSP 6f will be described.

Figure 18:
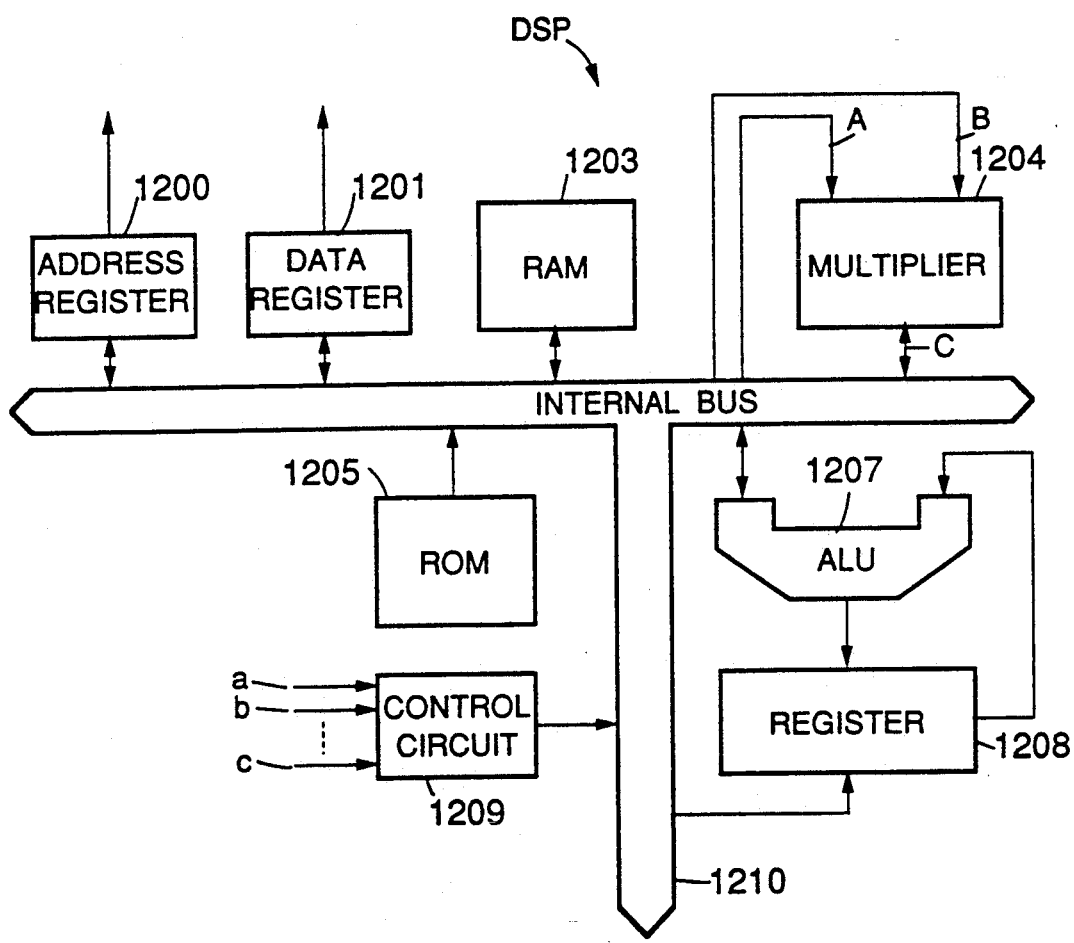
FIG. 18 is a block diagram illustrating a DSP.

FIG. 18 is a diagram showing in detail a construction of one embodiment of the DSP 6f.

The DSP in this embodiment, as illustrated in the Figure, comprises: an address register 1200 for specifying an address of an external memory; a data register 1201 used as a parallel port; a data RAM 1203; an (m-bit × m-bit) fast parallel multiplier 1204; a ROM 1205 for instruction; an ALU (Arithmetic Logic Unit) 1207 for performing addition and subtraction; a register 1208 such as an accumulator; a control circuit 1209 for controlling an interrupt of control signals (a, b and c) with respect to the outside; and an internal bus 1210 within the DSP.

The multiplier 1204 multiplies contents of input signals A and B during one instruction cycle. A result C thereof is outputted to the internal bus 1210.

The ALU 1207 adds the data from the internal bus 1210 to the data of the register 1208. A result thereof is written to the register 1208.

Note that the DSP is, as is widely known, capable of carrying out the product-sum operation during one instruction cycle and also affecting pipe line processing. Hence, the DSP is characteristically able to compute the numeric values of fixed and floating point data at a high speed. In this respect, the general-purpose microprocessor incorporating no floating point arithmetic unit is slow of processing and therefore unapplicable.

FIGS. 19A to 19D show examples of a processing timing of the analog input unit depicted in FIG. 17. As illustrated in the Figures, the analog input unit is capable of processing in the following three cases depending on the system applied.

Figure 19A:
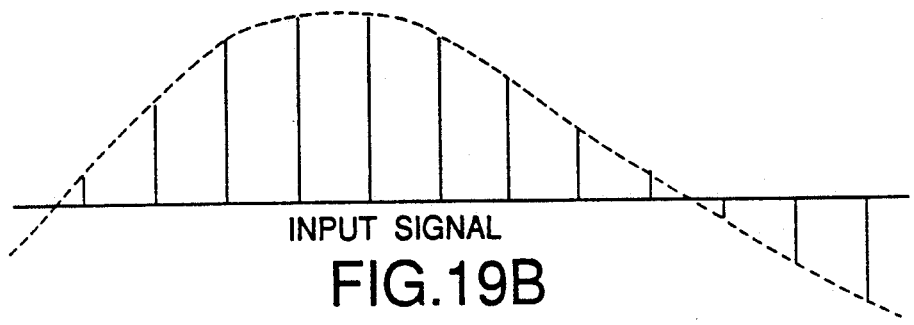
FIGS. 19A and 19B are diagrams which assist in explaining operation timings of the analog input unit.
Figure 19B:
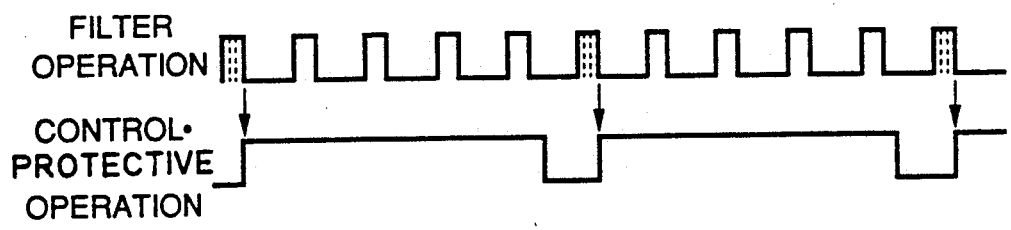

In the first case, as shown in FIG. 19B, for example, the digital filter arithmetic operation is performed with a period of 3 kHz. After finishing the digital filter arithmetic operation for 5 samples, the arithmetic results are transferred to the control/protective arithmetic unit. It is feasible to synchronize with the arithmetic unit having a period of 600 Hz.

Figure 19C:
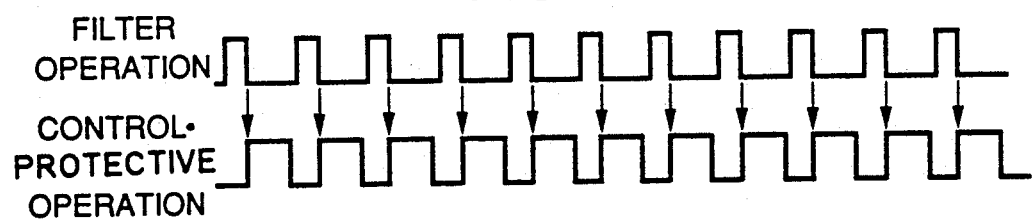
FIGS. 19C and 19D are diagrams which assist in explaining operation timings of the analog input unit for a second case.

In the second case, as illustrated in FIG. 19C, the digital filter arithmetic operation is effected with a period of 3 kHz. The arithmetic results are transferred to the control/protection arithmetic unit similarly with the period of 3 kHz.

Figure 19D:
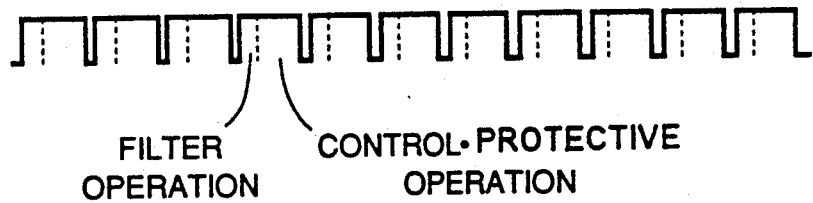

In the third case, as shown in FIG. 19D, the control/protective arithmetic operation is carried out with the period of 3 kHz together with the digital filter arithmetic operation. That is, the DSP depicted in FIG. 18 executes the filter and control/protective arithmetic operations. In the second and third cases, the arithmetic processing is thereby speeded up.

There will next be given an example of advantages of characteristics improved by applying this invention to an electric power digital protective relay.

Figure 20A:
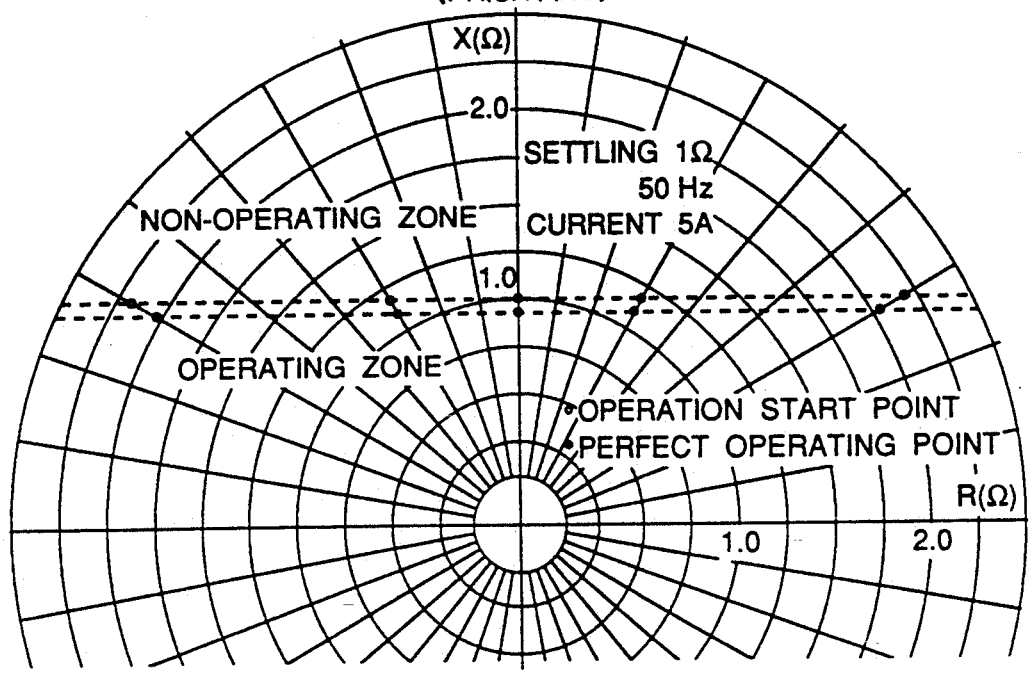
FIGS. 20A and 20B are diagrams showing phase characteristics of the electric power system control/protective system to which the present invention is applied.
Figure 20B:
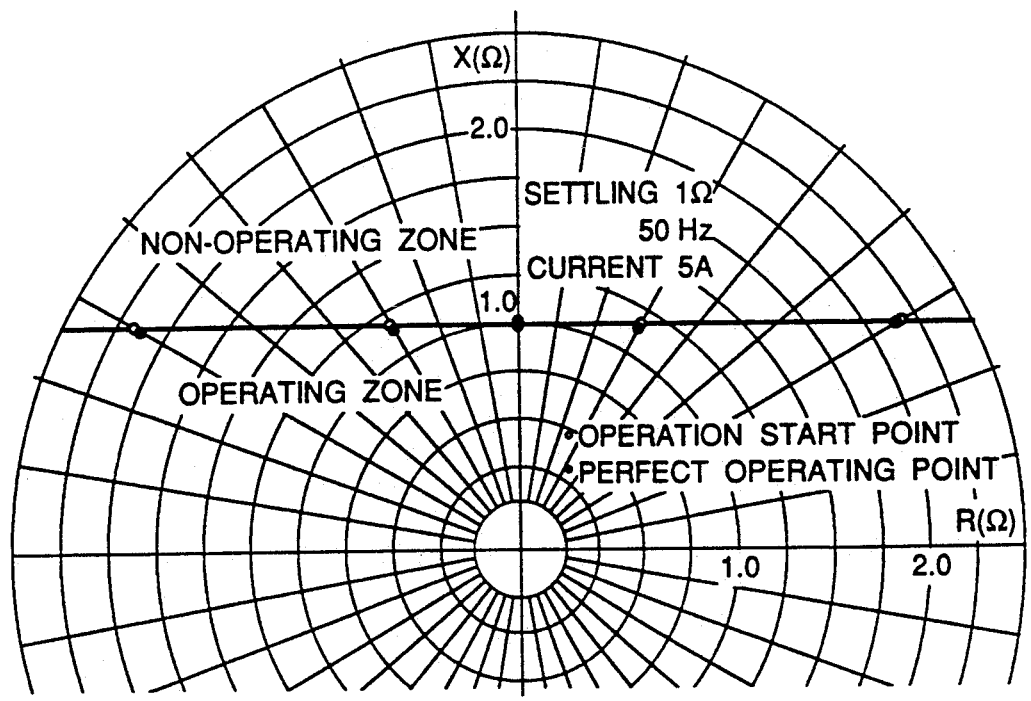

FIG. 20A and 20B show phase characteristics of a reactance relay applied to a back-up protection of the transmission line. FIG. 20A shows the phase characteristics in the prior art system (the analog filter is applied). FIG. 20B shows the phase characteristics in the system to which this invention is applied. In these two systems, the arithmetic of the reactance relay is based on absolutely the same algorithm.

The arithmetic formula and conditions of the reactance relay will be given as follows:

$$\sum_{n=1}^{N} (I \cdot Z - V) I \cdot Z > K \qquad (14)$$

where
I: the current value,
V: the voltage value,
Z: the settled value,
K: the comparative value,
N: the number of integrations,
the settled value: 1
the frequency: 50 Hz
the current: 5A As is obvious from FIG. 20A, in the prior art system an imperfect operating zone between a non-operating zone and an operating zone is wide. Namely, this implies that a dynamic impedance error is large. In accordance with this embodiment, the dynamic impedance error (an error of the operated impedance with respect to a settled impedance) at a characteristic angle (phase angle of 90°) exhibits 3–4%.

On the other hand, in the system to which the present invention shown in FIG. 20B is applied, the imperfect operating zone between the non-operating zone and the operating zone is narrow. Namely, this implies that the dynamic impedance error is rather smaller than in the prior art system.

This embodiment gives an example where the dynamic impedance error at the characteristic angle exhibits 1% or less.

Figure 21:
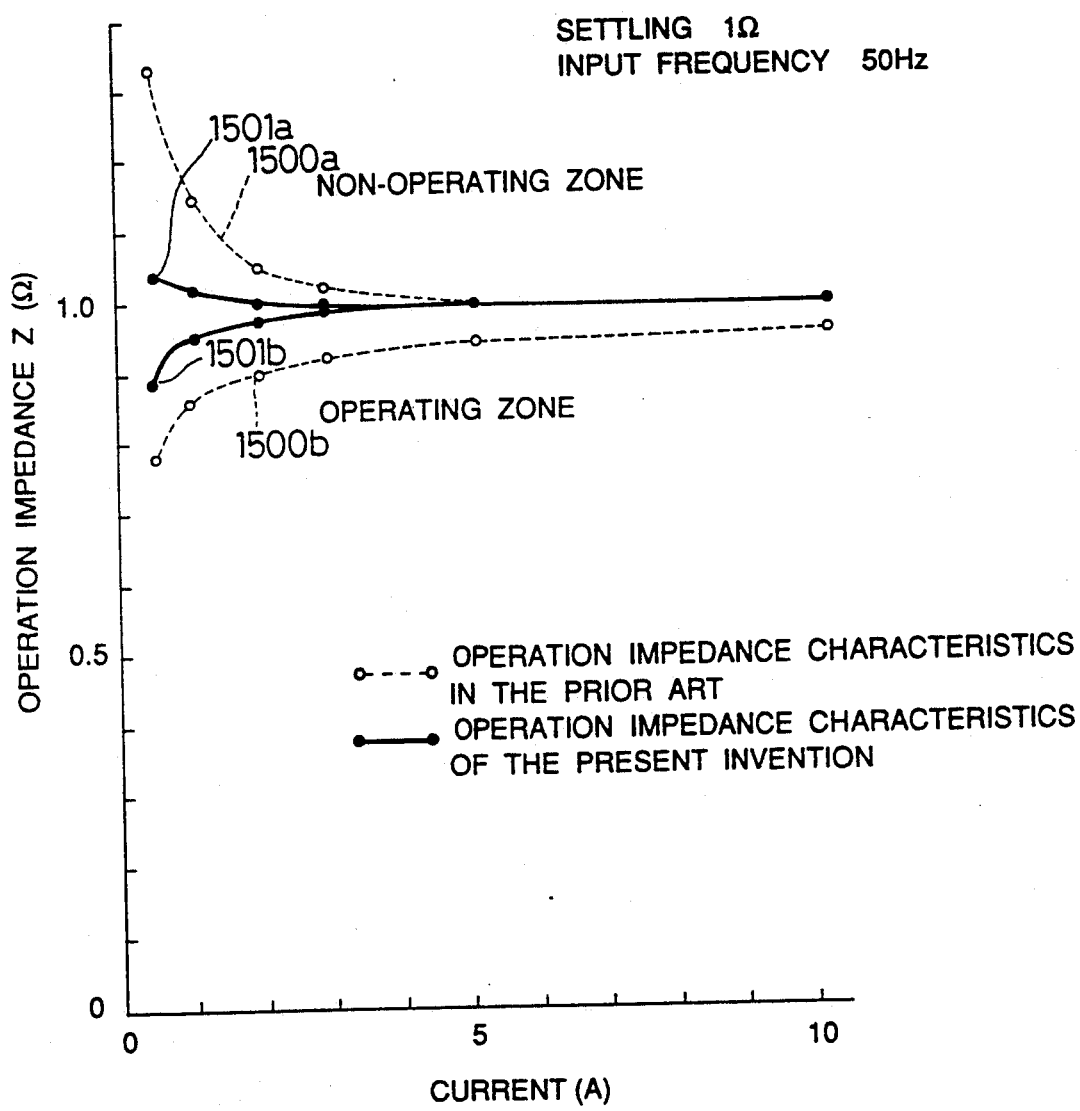
FIG. 21 is a diagram showing a dynamic impedance of the reactance relay to which the present invention is applied.

FIG. 21 shows an example of the dynamic impedance characteristics of the reactance relay.

Referring to FIG. 21, the dynamic impedance characteristics in the prior art systems are indicated by dotted lines 1500a and 1500b. Solid lines 1501a and 1501b indicate the dynamic impedance characteristics of this invention.

As can be clarified from this characteristic diagram, the imperfect operating zone in the dynamic impedance characteristics of this invention is narrower than in the prior art system. Apparently, the accuracy can be extremely increased (high sensitivity). The sensitivity is 3 to 5 times as high as that in the prior art system.

Figure 22A:
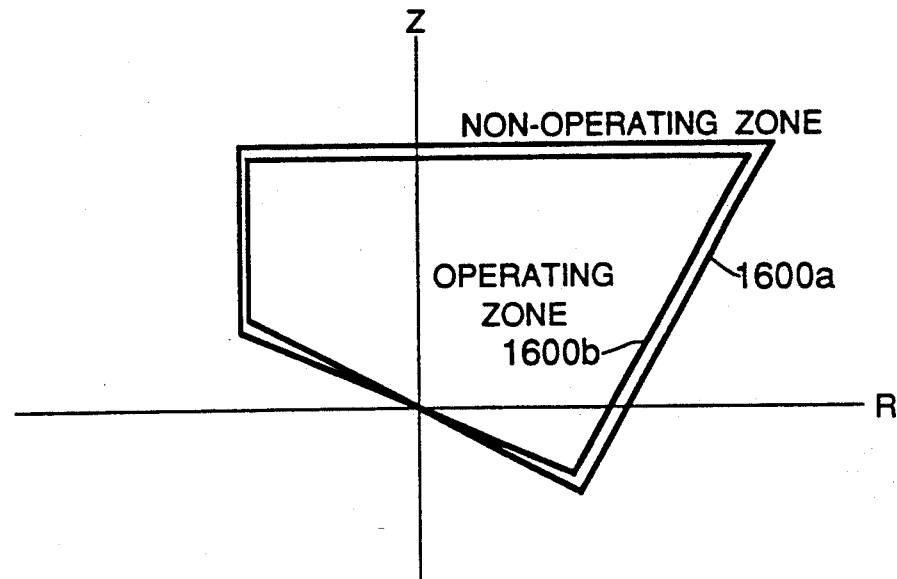
FIGS. 22A and 22B are diagrams showing phase characteristics of a distance relay to which the present invention is applied.
Figure 22B:
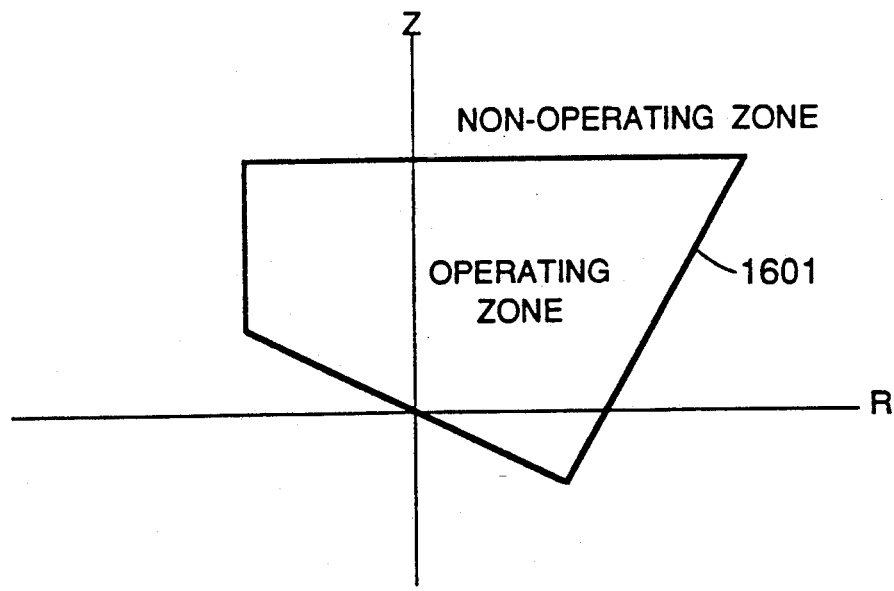

FIG. 22A and 22B show the physical characteristics when the present invention is applied to an input unit of a distance relay for obtaining a resistor R and a reactance L up to an accident point in conformity with a differential equation.

FIG. 22A shows an example of characteristics based on the prior art method. FIG. 22B shows an example according to the present invention.

As is obvious from the Figures, the example to which this invention is applied exhibits such characteristics that a width of the imperfect operating zone between the operating zone and the non-operating zone is quite narrow, and the highly increased accuracy (high sensitivity) is, it can be understood, attainable.

Figure 23:
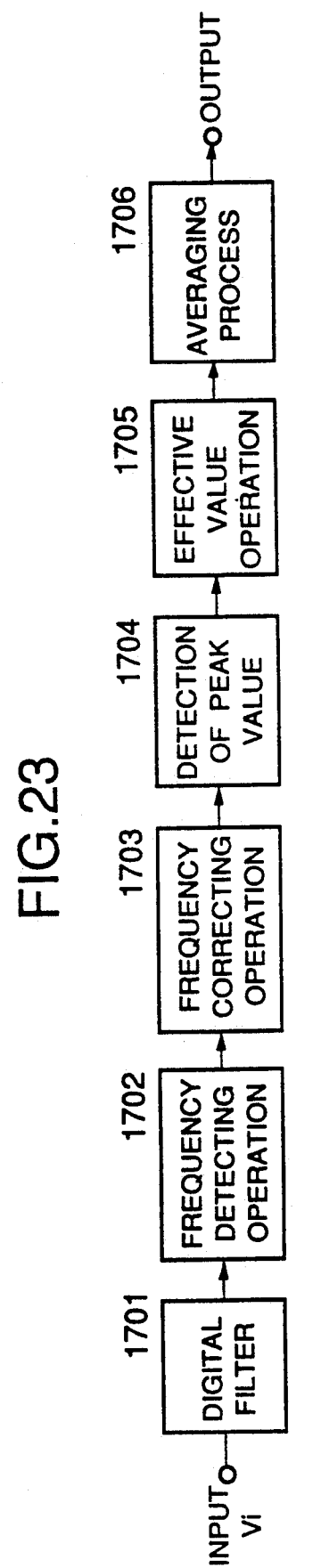
FIG. 23 is a block diagram showing a process of detecting voltage effective value of the electric power system to which the present invention is applied.

FIG. 23 shows an example of a process block configuration for detecting voltage effective values of the electric power system, to which this invention is applied, and in which the aforementioned DSP Gf depicted in FIG. 17 arithmetically executes the processes of the respective blocks. This is applied to, e.g., an electric power system voltage/reactive power control system.

Referring to FIG. 23, the numeral 1701 denotes a digital filter processing block to which this invention is applied. Attenuated in this block are the higher harmonics overlapped with the input signals Vi, offset components, the disturbance noises and the quantization error.

In particular, the filter coefficients are set so that low-order harmonics which are n-times (multiple of integer) the fundamental harmonics, the disturbance noises and the quantization error frequency becomes zero point frequencies of the digital filters or come to the vicinity thereof. A large amount of attenuation is thus obtained.

Next, a signal frequency is obtained in a block 1702 by using the filtering-processed data.

Incidentally, an input data frequency, i.e., an electric power system frequency fluctuates (+1 through 3 Hz). It is therefore necessary to correct a gain which fluctuates due to the frequency characteristics of the digital filter.

In a block 1703, the gain of the input data is corrected by employing the frequency obtained in the block 1702.

Subsequently, the filtering-processed input data the gain of which has been corrected is obtained in a block 1704.

Obtainment of the peak value involves the use of, for instance, a peak value holding method or the following arithmetic equation.

$$V = \frac{\sqrt{V(t)^2 + V(t + \Delta t)^2 - 2V(t)V(t + \Delta t)\cos\omega \Delta t}}{\sin\omega \Delta t} \qquad (15)$$

Δt: the sampling interval
ω = 2πf
f: the detected frequency

Next, the effective value is acquired by use if the peak value in a block 1705. An averaging process is effected for increasing the accuracy in a block 1706.

In this way, the effective value of the input data can be obtained with an accuracy of 0.01% or under.

As a matter of course, the digital filter, shown in the block 1701, to which this invention is applied is indispensable for attaining the increased accuracy.

The following is an explanation of an embodiment of another method of detecting the voltage effective value of the electric power system, to which this invention is applied.

An outline of processing will be explained. Synchronizing with external synchronous signals corresponding to the frequencies of the input signals, the input signals are sampled and then undergo an A/D conversion. Subsequently, the input signals undergo digital filtering to obtain the voltage effective value. The sampling frequency is, so to speak, adaptively modified under the external conditions. The filter characteristics are thus modified. The voltage effective value is obtained with a high accuracy by the same algorithm (e.g., the data for one period is squared and integrated). This is applied to a static reactive power compensating system of the electric power system.

Figure 24:
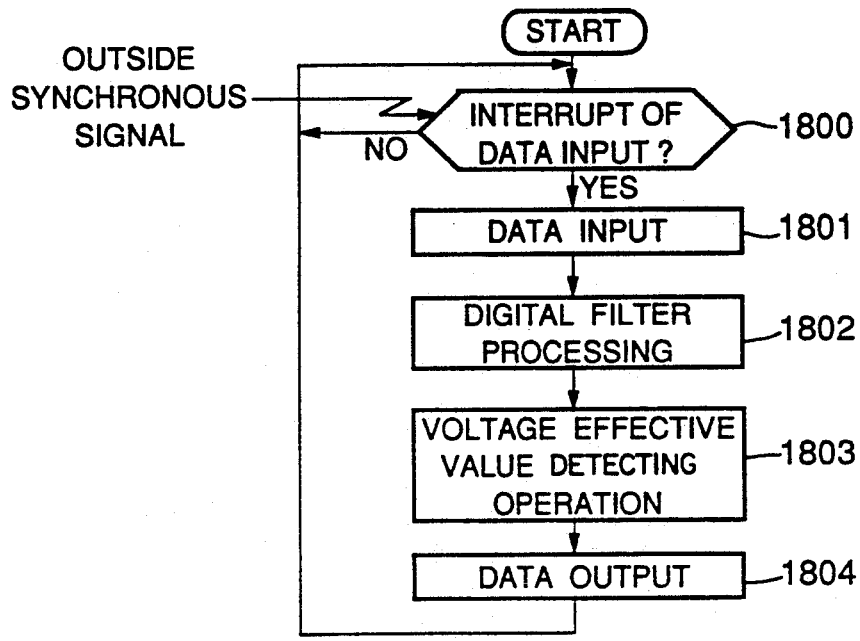
FIG. 24 is a flowchart which assists in explaining the action exhibited in FIG. 23.

Turning to FIG. 24, whether or not there exists a data input interrupt is judged at a step 1800. At this time, an interrupt signal, as explained earlier, synchronizes with the frequency of the input signal transmitted from the electric power system.

If there exists the interrupt, the data is inputted at a step 1801.

Effected thereafter at a step 1802 is the arithmetic process of the digital filter to which this invention is applied.

Namely, the frequencies at which the disturbance noises and the quantization error are generated fall within the blocking band of the digital filter. As a result, the voltage effective value detection shown in a step 1803 is subjected to no adverse influence.

At a step 1803, the voltage effective value is obtained by performing the following arithmetic:

$$V = \sum_{n=1}^{N} V n^2 \qquad (16)$$

In this case, the sampling frequency is varied corresponding to the frequency of the input signal. The algorithm is therefore constant irrespective of the frequency of the input signal.

The detected voltage effective value is outputted at a step 1804.

Figure 25:
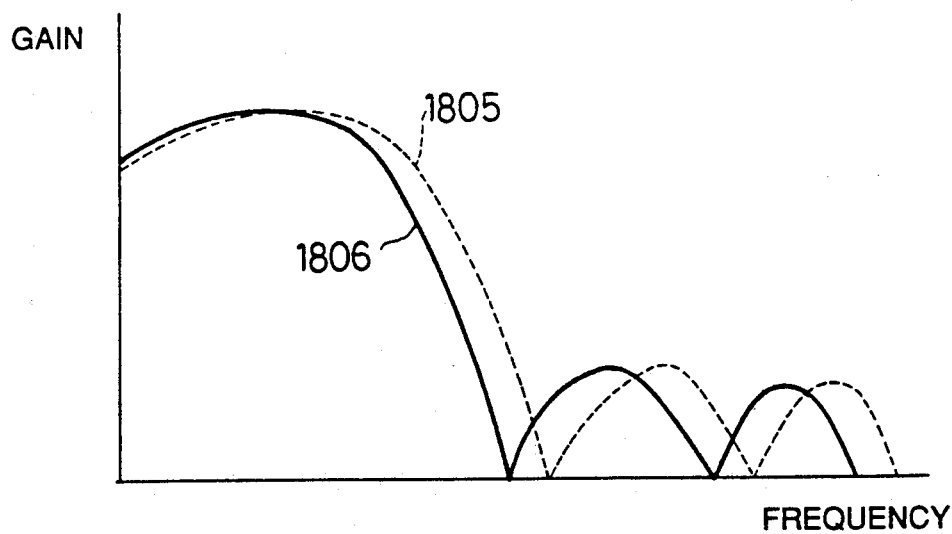
FIG. 25 is a diagram showing frequency characteristics of the system depicted in FIG. 23.

FIG. 25 shows an example of frequency-gain characteristics of the digital filter used at the step 1802.

For instance, a characteristic 1805 is modified into a characteristic 1806, corresponding to a change in the frequency of the input signal from the electric power system.

The frequencies at which the disturbance noises and the quantization error are caused change in proportion to the sampling frequencies. Hence, the error reductive effects remain as they are. The voltage effective value can, as a matter of course, be detected with an extremely high accuracy.

An embodiment of a digital signal processing system to which this invention is applied will next be explained.

Figure 26:
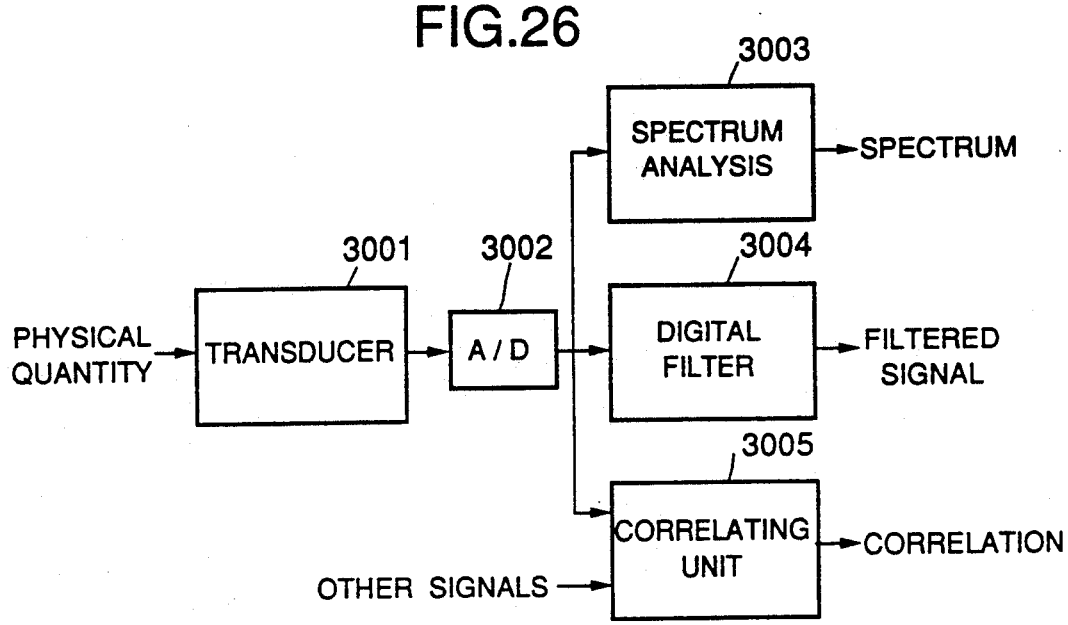
FIG. 26 is a block diagram depicting a signal analyzer to which the present invention is applied.

Turning attention to FIG. 26, there is illustrated a signal analyzing system.

In this embodiment, physical quantities (displacement, velocity, pressure, temperature, etc) are transduced into electric potentials by means of a transducer 3001. Outputs of this transducer 3001 are typically digitized at regular time intervals. That is, the outputs thereof are converted into digital quantities by an A/D converter 3002.

These digital quantities undergo a spectrum analysis by use of, e.g., a spectrum analyzer 3003, wherein the frequency analysis relative to an amplitude, phase, electric power or energy is effected. In this case, where this invention is applied to the spectrum analysis, the quantization errors caused due to the A/D conversion can remarkably be reduced. This in turn accomplishes the highly accurate spectrum analysis. A digital filter 3004 eliminates the high frequency components of the A/D converted data or extracts the specific signal frequency components, thereby obtaining the highly accurate data.

Note that the numeral 3005 represents a correlating unit for seeking correlation functions between the signal taken in and other signals.

In FIG. 26, the present invention is applicable to the portion for filtering after effecting the A/D conversion. The highly accurate signal analyzing system (e.g., the spectrum analyzer) can be therefore constructed.

Figure 27:
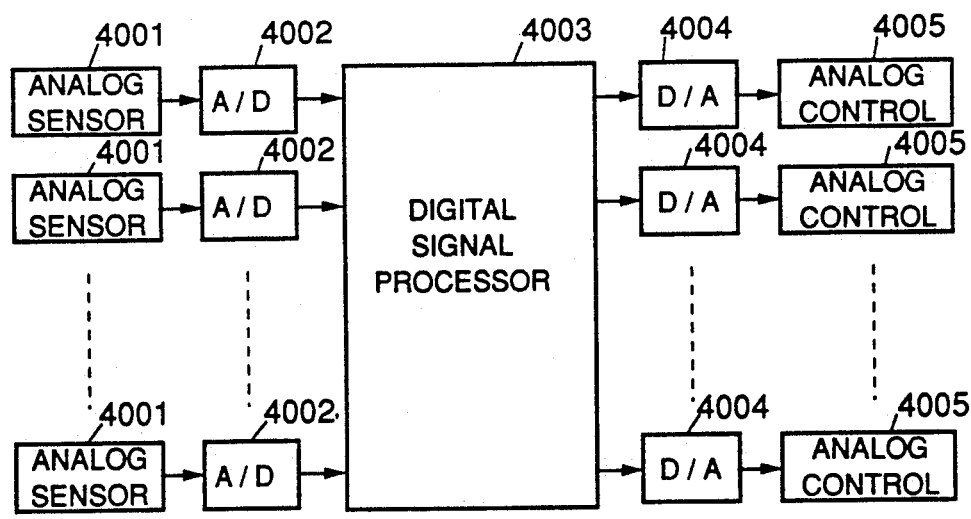
FIG. 27 is a block diagram depicting a voice signal processor to which the present invention is applied.

FIG. 27 illustrates an example of configuration of a voice signal processing system, i.e., a CODEC (coder-decoder) system.

A voice signal is taken in by an analog sensor 4001. The voice signal is, after being A/D converted by an A/D converter 4002, subjected to a process such as echo canceling in a digital signal processor 4003. The voice signal is D/A converted into an analog signal by a D/A converter 4004. Analog control is performed by an analog controller 4005 with the aid of the analog signal.

Referring to FIG. 27, this invention is applicable to the portion for echo canceling by use of the digital signal processor as well as to the A/D converting portion.

Figure 28:
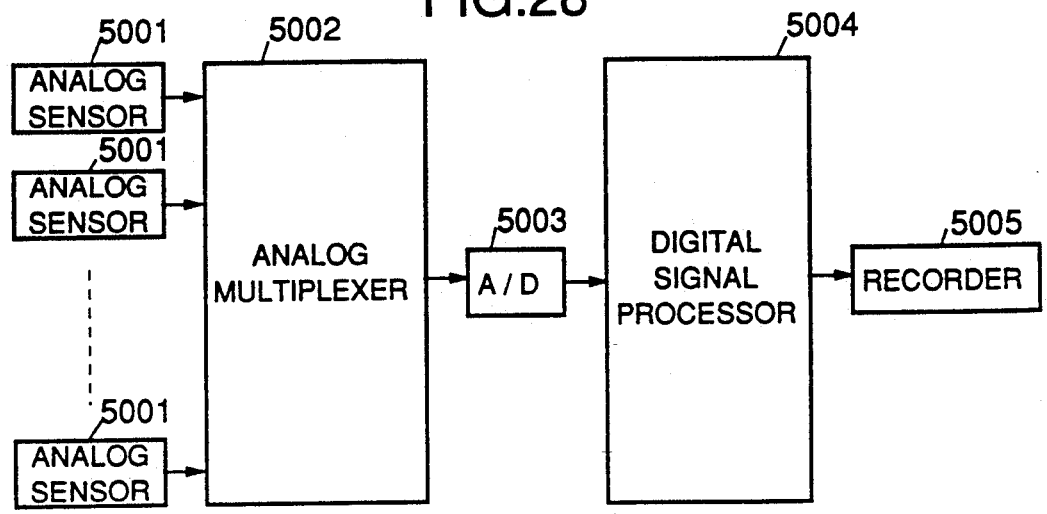
FIG. 28 is a block diagram showing a digital data recorder to which the present invention is applied.

FIG. 28 shows an example of configuration of a digital data recorder system.

Referring to FIG. 28, a plurality of analog input signals are taken in by an analog sensor 5001. These signals are changed over by an analog multiplexer 5002 and sequentially A/D converted by an A/D converter 5003. The thus converted signals undergo digital signal processing by a digital signal processor 5004. The resultant data are stored in a recorder 5005. In FIG. 28, the present invention is applicable to the portions relative to the A/D conversion and the digital signal processor. The input signals are storable with a fidelity.

Figure 29A:
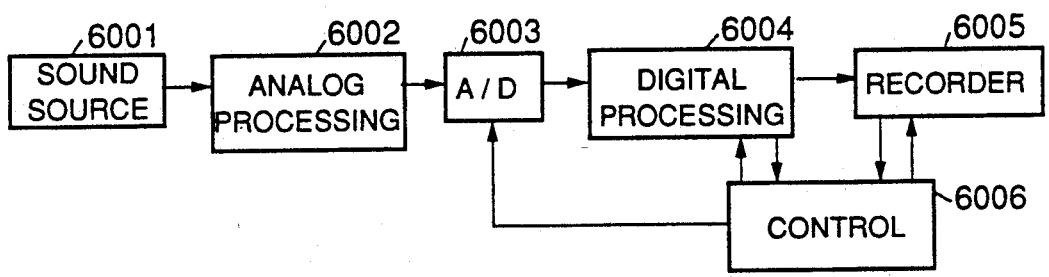
FIGS. 29A and 29B are block diagrams illustrating a digital audio system to which the present invention is applied.
Figure 29B:
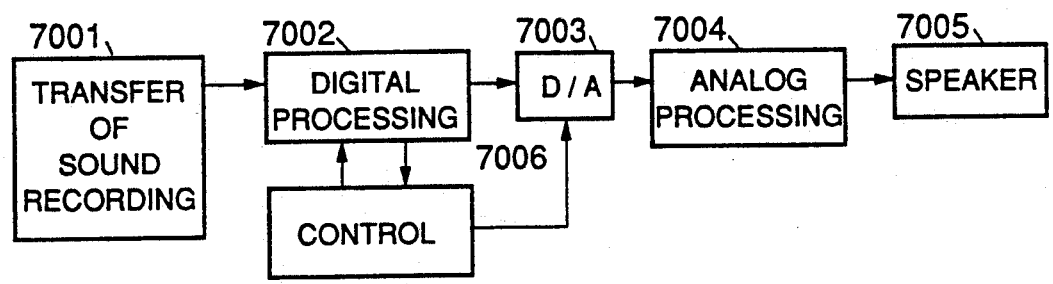

FIGS. 29A and 29B show examples of a digital audio system. In this system, a sound source 6001 is processed by an analog processing unit 6002. The resultant signals are A/D converted by an A/D converter 6003. The data thereof are subjected to digital processing in a processing unit 6004 preparatory to recording by a sound recorder 6005. When reproducing the sound, more digitally recorded signals 7001 are processed in a processing unit 7002. The data thereof are D/A converted by a D/A converter 7003. The analog signals are then processed in a processing unit 7004 and thereby outputted as a sound from a speaker 7005.

In FIGS. 29A and 29B, the present invention is applicable to portions associated with digital processing and the A/D conversion in the sound recording system. It is therefore feasible to record the sound source with a fidelity. A signal-to-noise ratio (S/N ratio) is remarkably improved.

There will next be explained an embodiment of a gain variable type digital filter with reference to the accompanying drawings.

Figure 30:
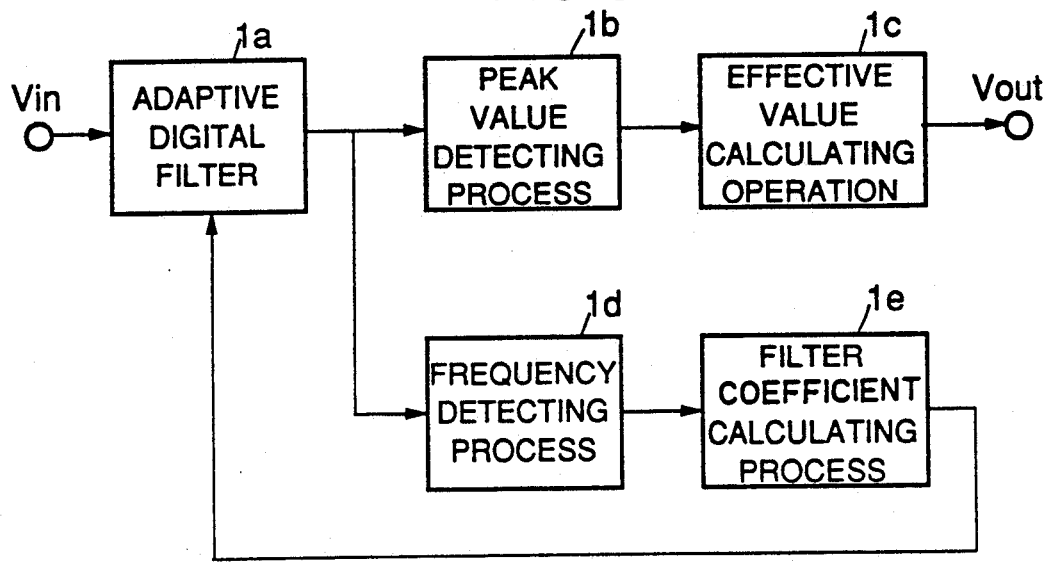
FIG. 30 is a block diagram depicting a basic construction of this invention.

Referring to FIG. 30, an adaptive digital filter 1a is configured as a gain variable type filter. Inputted to this filter 1a an output signal from an analog-to-digital converter for converting an output signal of a sample holder for sample-holding an AC signal into a digital signal. The digital filter 1a effects filtering on the digital signal inputted. The filter 1a extracts signals of specific frequency components from the digital signal components. The extracted signals are outputted to a peak value detection processing unit 1b and a frequency detecting processing unit 1d. A peak value of the AC signal is detected from the output signals of the filter 1a. On this occasion, the peak value is also obtained by detecting the maximum value per half-cycle of the output signals of the filter 1a. In this embodiment, however, a peak value V is obtained in conformity with the following formula (17) to eliminate an influence by sampling phase:

$$V = \frac{\sqrt{Va^2 + Vb^2 - 2VaVb\cos \Delta t}}{\sin \Delta t} \quad (17)$$

where Va and Vb are the sample values of arbitrary continuous two points, $\omega$ is the input angle frequency and $\Delta t$ is the sampling interval.

The output signal of the peak value detecting processing unit 1b is inputted to an effective value arithmetic unit 1c. In this arithmetic unit 1c, an effective value Vrms is calculated based on the peak value V in accordance with the following formula (18):

$$Vrms = \frac{1}{\sqrt{2}} \cdot V \quad (18)$$

On the other hand, the output signal of the filter 1a is inputted to the frequency detection processing unit 1d, wherein a frequency of the AC signal is detected. Based on this detected result, a filter coefficient calculation processing unit 1e calculates such a filter coefficient that the detected frequency coincides with a central frequency (gain is go) of the digital filter 1a. In accordance with the calculated filter coefficient, the gain characteristics of the digital filter 1a are adjusted.

Figure 31:
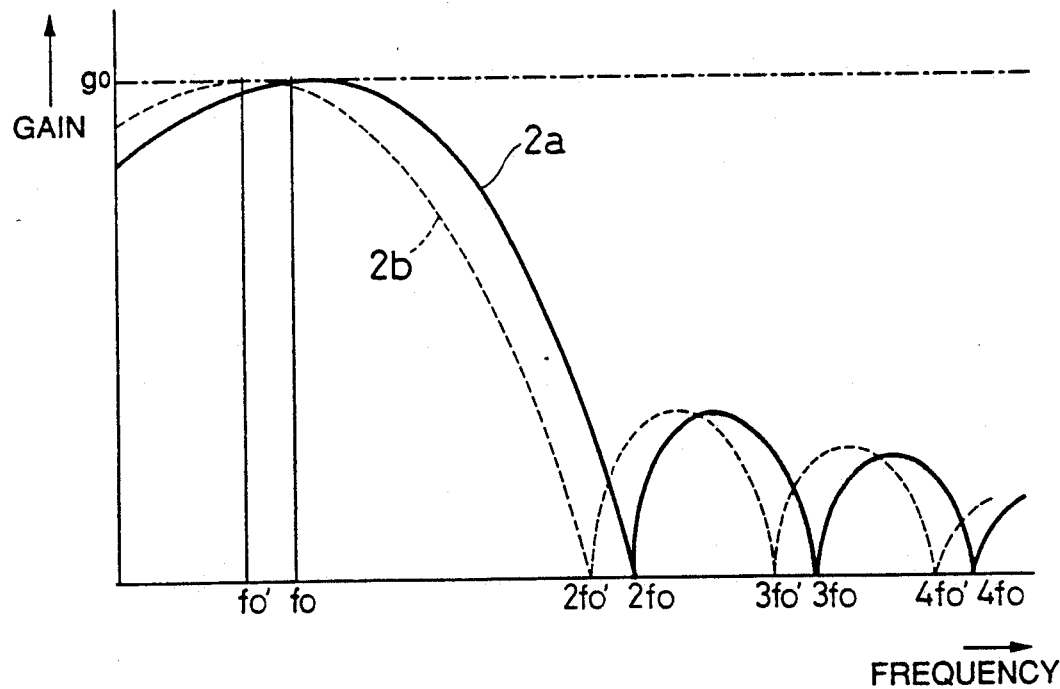
FIG. 31 is a diagram showing gain-frequency characteristics of the adaptive digital filter.

For example, as shown in FIG. 31, the frequency of the input signal taken in from the electric power system is indicated by a characteristic 2a. In this case, the filter coefficient is calculated so that the fundamental frequency of the AC signal coincides with a zero point frequency fo of the digital filter 1a. When the frequency of the AC signal fluctuates from fo to fo', the filter coefficient is calculated according to the detected frequency fo'. The gain characteristics of the digital filter 1a are adjusted based on this filter coefficient. Namely, the filter characteristic becomes one indicated by a characteristic 2b. Even when the AC signal frequency fluctuates, it is possible to sufficiently attenuate higher-harmonic components (the second, third, fourth ...) of the AC signals. For this reason, a gain (output-to-input ratio) of the AC signal inputted to the digital filter 1a can be kept constant. The effective value is obtained from the output signal of the digital filter 1a, and hence it follows that the effective value can be acquired with the high accuracy without depending on the fluctuations in the frequency.

The following is a description of a specific configuration and operation of the adaptive digital filter 1a.

Figure 32A:
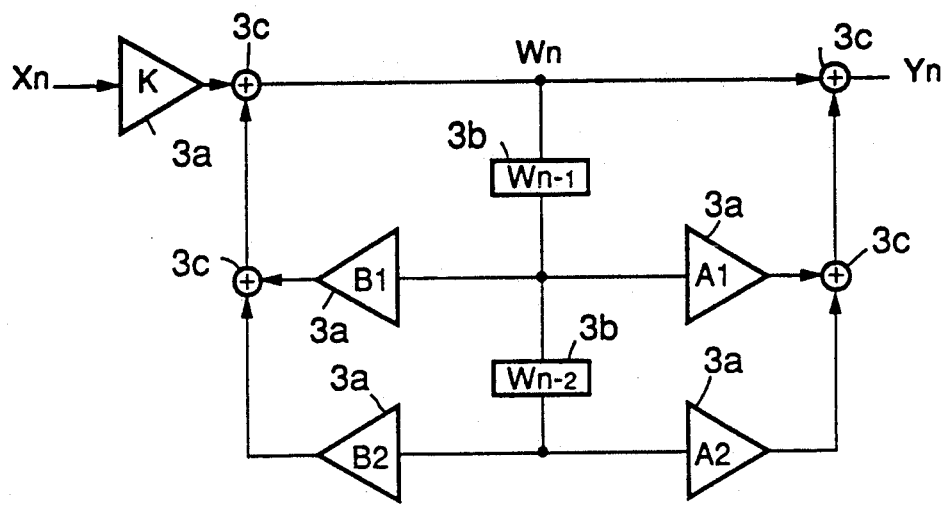
FIGS. 32A and 32B are explanatory block diagrams showing the digital filter.
Figure 32B:
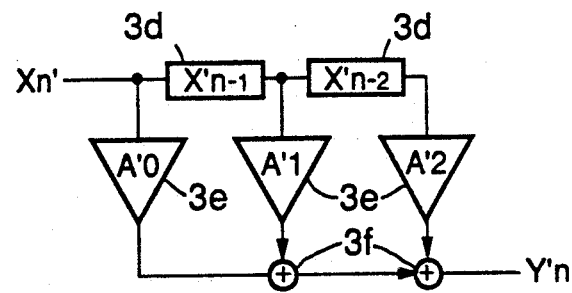

FIGS. 32A and 32B show typical block conceptual configurations of the digital filter. FIG. 32A depicts an IIR (Infinite-extent Impulse Response) type filter. FIG. 32B illustrates an FIR (Finite-extent Impulse Response) type filter.

Referring to FIG. 32A, the symbol Xn represents an input signal; 3a each coefficient block; K a gain coefficient; and $A_1$, $A_2$, $B_1$ and $B_2$ filter coefficients. The symbol 3b denotes a delay block. The delay block is classified into a block (Wn−1) for delaying the signal Wn by one timing of a period T and a block (Wn−2) for delaying the same signal by 2 timings of the period T. The symbol 3C designates an adder block. The symbol Yn represents filter output data.

As is obvious from the Figures, the filter coefficients are designed in the construction depicted therein, thereby attaining a variety of filters shown in the following formulae (19) to (23):

(low-pass filter)

$$H(z) = \frac{1 - B_1 + B_2}{4} \cdot \frac{(1 + Z^{-1})^2}{1 - B_1 \cdot Z^{-1} + B_2 \cdot Z^{-2}} \quad (19)$$

(band-pass filter)

$$H(z) = \frac{1 - B_2}{2} \cdot \frac{1 - Z^{-2}}{1 - B_1 \cdot Z^{-1} + B_2 \cdot Z^{-2}} \quad (20)$$

(high-pass filter)

$$H(z) = \frac{1 + B_1 + B_2}{4} \cdot \frac{(1 - Z^{-1})^2}{1 - B_1 \cdot Z^{-1} + B_2 \cdot Z^{-2}} \quad (21)$$

(notch filter)

$$H(z) = \frac{1 + B_2}{2} \cdot \frac{1 - r \cdot Z^{-1} + Z^{-2}}{1 - B_1 \cdot Z^{-1} + B_2 \cdot Z^{-2}} \quad (22)$$

where
r = 2. cos 2$\pi$fo.T
T: sampling period
fo: blocking frequency (all-pass filter)

$$H(z) = \frac{Z^{-2} - B_1 \cdot Z^{-1} + B_2}{1 - B_1 \cdot Z^{-1} + B_2 \cdot Z^{-2}} \quad (23)$$

The data and the signal in the same Figures are expressed by the following arithmetic equations:

$$Y_n = W_n + A_1 \cdot W_{n-1} + A_2 \cdot W_{n-2} \quad (24)$$

$$W_n = K \cdot X_n + B_1 \cdot W_{n-1} + B_2 \cdot W_{n-2} \quad (25)$$

Referring to FIG. 32B, the symbol X'n represents input data, while Y'n designates output data. Designates at 3d is a delay block classified into a block X'$_{n-1}$ for delaying the signal by one timing of the period T and a block X'$_{n-2}$ for delaying the signal by 2 timings of the period T. The symbols 3e indicate filter coefficient blocks. Respective filter coefficients are set at A'$_0$, A'$_1$ and A'$_2$.

The symbol 3f represents an adder block.

The output data in the same Figure is given by the following arithmetic equation (26):

$$Y_n = A'_0 \cdot X_n + A'_1 \cdot X_{n-1} + A'_2 \cdot X_{n-2} \quad (26)$$

As discussed above, this embodiment takes the following arrangement. The digital filter means using the DSP (digital signal processor) performs filtering on the input signals. The arithmetic operation is repeatedly performed per sampling period on the basis of the preset filter coefficient. As a result, the time-division filtering process is effected softwarewise according to the number of input points. It is therefore possible to correspond to an increase or decrease in the number of input points, changes in characteristic and standardization of a printed board.

Filtering is attainable by employing no analog filter. Hence, there exists absolutely no factor for an initial value deviation, as seen in the analog filter, of an element such as a resistor or capacitor, fluctuations in the element value due to the ambient temperatures and a deterioration of the element because of reductive changes. A higher performance can be attained, and any adjustment can be eliminated.

Besides, an externally attached inspection circuit becomes unnecessary. It is feasible to correspond thereto with the internal software. This remarkably reduces the number of manufacturing steps. The maintenance is also unnecessary. Considerable merits are created, wherein the protective relay system increases in accuracy, and the costs are decreased.

Next, a filter coefficient calculating process which is important in terms of constructing the adaptive filter will be explained.

The transfer functions of various digital filters shown in the formula (19) to (23) are, though stated before, obtained as functions on a Z-plane by a commonly known bilinear Z-plane transform and frequency transform from the transform functions of the analog filter (S function).

Table 1 shows arithmetic equations for obtaining the respective coefficients of the low-pass notch filter, the low-pass filter and the band pass filter.

pling are set to zero. The count-up resumes from a point of time when effecting the zero-cross.

On the other hand, if the zero-cross is judged as the second time, data $V(k+t-1)$ before one timing is set as V3. Data $V(k+t)$ at the present time is set as V4 (step 5f). After this step, the count values of the counter are set to zero (step 5g). The arithmetic detection of the frequency is executed based on the counter value (step 5h).

When effecting the arithmetic detection of the frequency, the frequency f is given in the following formula (27) by using the positive and negative voltages V1, V2, V3 and V4 at the zero-cross, the input signal sampling number k within one period and the sampling period T:

$$f = \frac{1}{T} \cdot \frac{\alpha \cdot \beta}{V2 \cdot \beta + k \cdot \alpha \cdot \beta + V3 \cdot \alpha} \qquad (27)$$

However, $$\alpha = |V1| + |V2| \qquad (28)$$

$$\beta = |V3| + |V4| \qquad (29)$$

TABLE 1

| Coefficient | Arithmetic Equation | | |
| --- | --- | --- | --- |
| | Low-pass notch filter | Low-pass filter | Band-pass filter |
| A1 | $-2\cos(2\pi f_n T)$ | 2.0 | 0.0 |
| A2 | 1.0 | 1.0 | $-1.0$ |
| B1 | $\dfrac{4Q \cdot \cos(2\pi f_o T)}{2Q + \sin(2\pi f_o T)}$ | $\dfrac{4Q \cdot \cos(2\pi f_o T)}{2Q + \sin(2\pi f_o T)}$ | $\dfrac{4Q \cdot \cos(2\pi f_o T)}{2Q + \sin(2\pi f_o T)}$ |
| B2 | $-\dfrac{2Q - \sin(2\pi f_o T)}{2Q + \sin(2\pi f_o T)}$ | $-\dfrac{2Q - \sin(2\pi f_o T)}{2Q + \sin(2\pi f_o T)}$ | $-\dfrac{2Q - \sin(2\pi f_o T)}{2Q + \sin(2\pi f_o T)}$ |
| H | $\dfrac{1 - B1 - B2}{2 + A1}$ | $\dfrac{1 - B1 - B2}{4}$ | $\dfrac{1 + B2}{2}$ |

As can be clarified from the arithmetic equations of Table 1, all the coefficients can be obtained on condition that the sampling period T, the filter selectivity Q and the filter central (cut-off) frequency fo (k times the input signal frequency fo) are known.

Hence, there is set in advance all of the sampling period T, the selectivity Q and the ratio (k times) between the input signal frequency and the filter central (cut-off) frequency. If only the frequency of the input signal is obtained, all the filter coefficients can also be acquired by solving the arithmetic equations shown in the Table 1.

Figure 33:
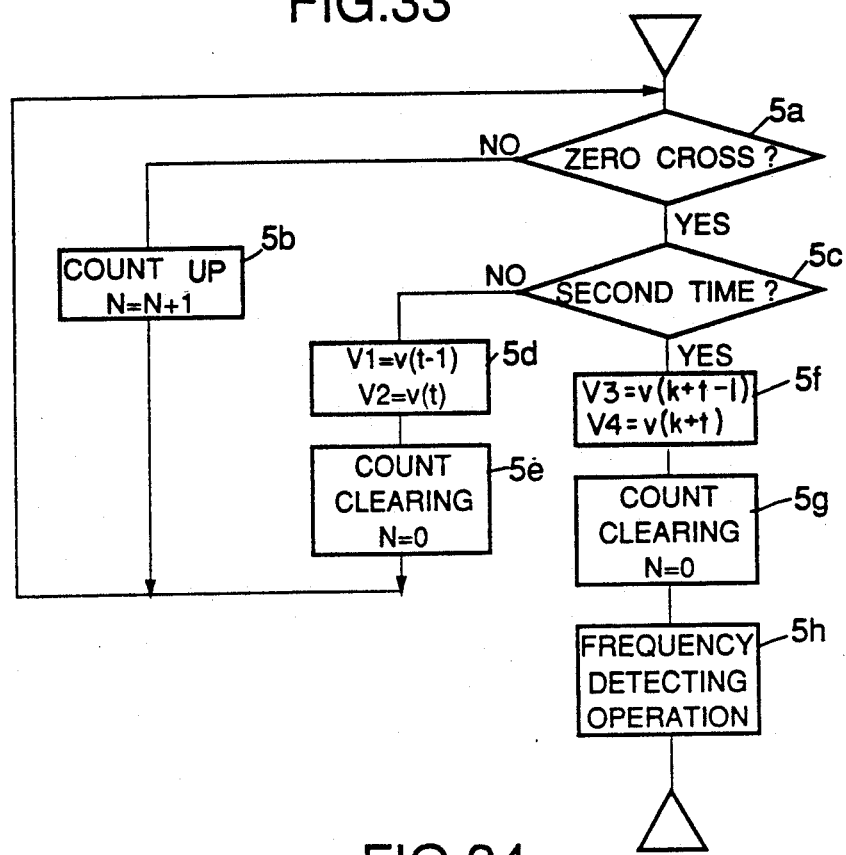
FIG. 33 is an explanatory flowchart showing a process of detecting the frequency.
Figure 34:
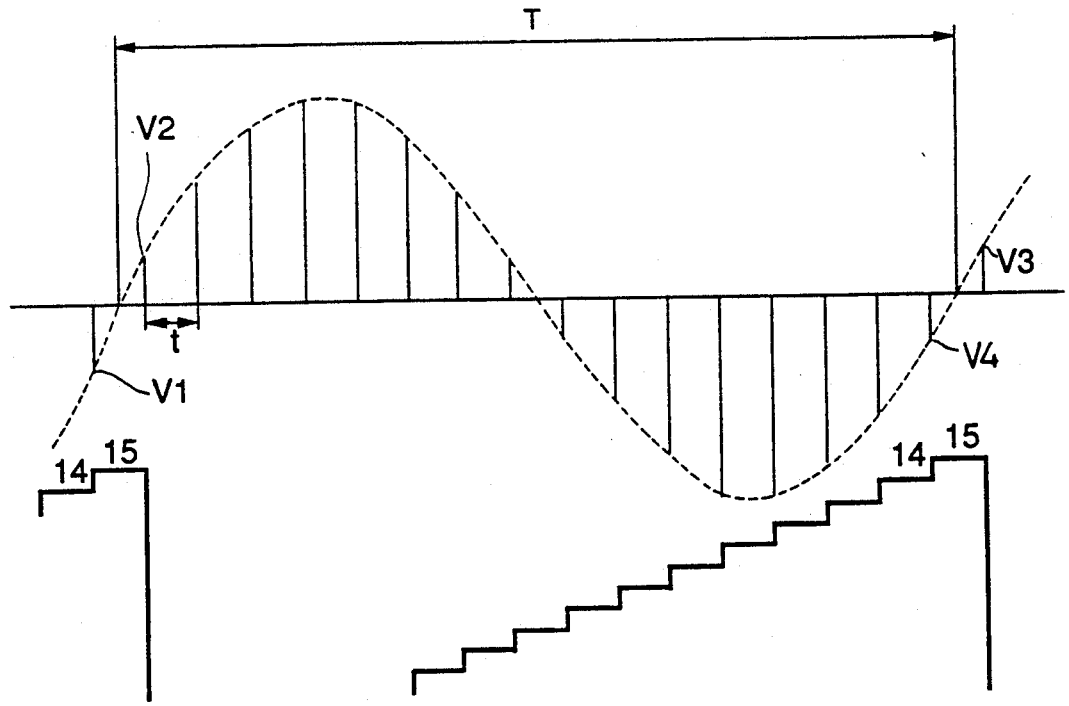
FIG. 34 is a waveform diagram which assists in explaining a method of detecting the frequency.

The frequency detecting process will next be explained with reference to FIGS. 33 and 34.

To start with, the output signals of the digital filter 1a are sequentially taken in. Whether the input data are zero-crossed or not is judged (step 5a). This count value indicates the number of sampling operations during one period of the input data.

On the other hand, when the input data are zero-crossed, whether or not the zero-cross is the second time is judged (step 5c). More specifically, a process of detecting the zero-cross for one period is executed. If the zero-cross is not the second time—viz., the zero-cross is the first time, data $V(t-1)$ before one timing is set as V1. Data $V(t)$ at the present time is set as V2 (step 5d). Thereafter, the counter value is cleared (step 5e). To be specific, the count values counted up per sam- In the case of detecting the frequency, the sampling frequency is increased by a factor of greater than 24 over the fundamental frequency (50 or 60 Hz) of the AC signal, whereby the detection accuracy can be enhanced. The embodiment discussed above has made use of a point at which the zero-crossed input data changes from the negative to the positive. Another available arrangement is that a point at which the input data changes from the positive to the negative is set as a zero-cross. The zero-cross can be also detected in a state where these two arrangement are combined.

The usable hardware for embodying the present invention is shown in FIGS. 17 and 18.

Figure 35:
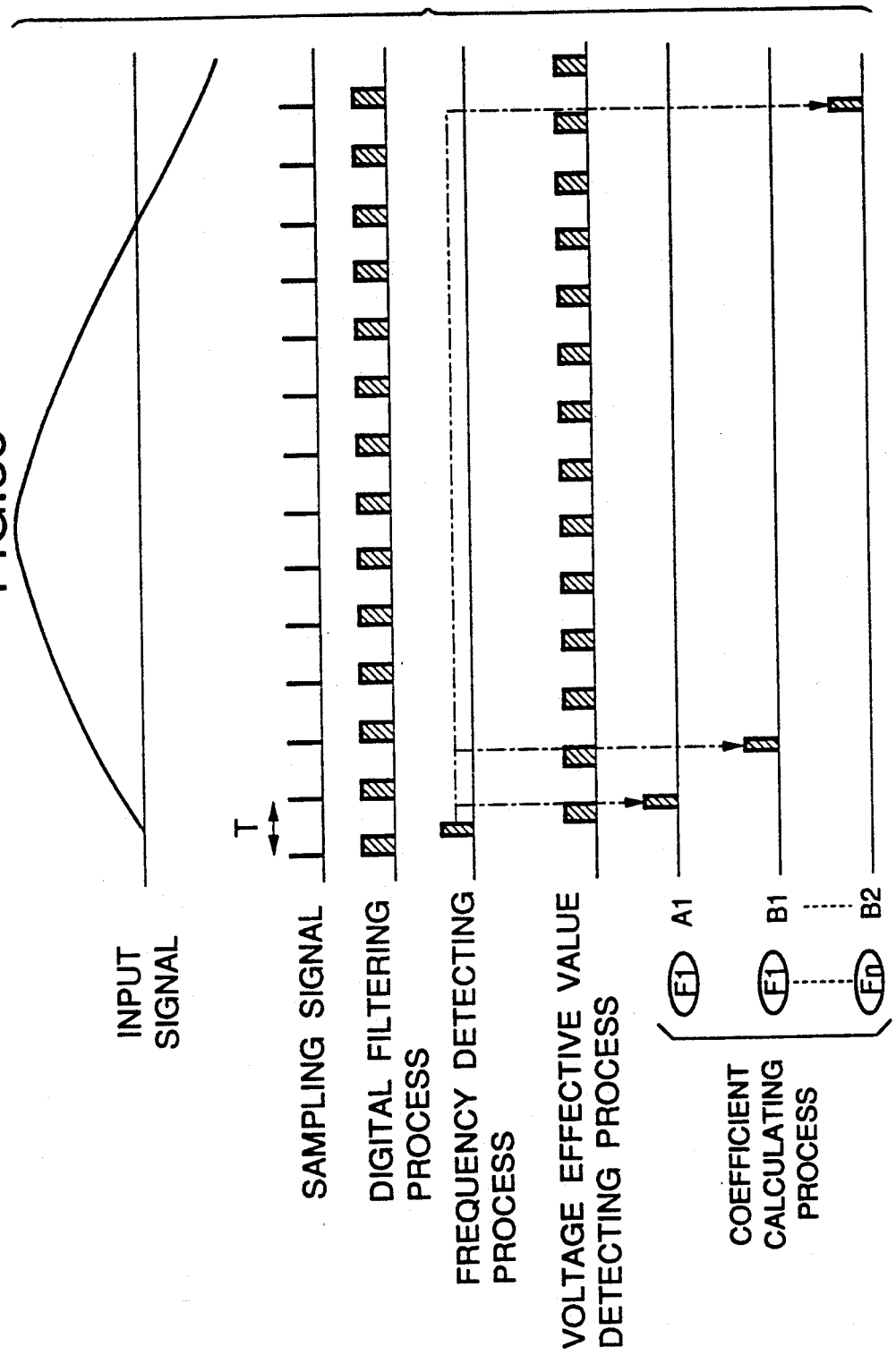
FIG. 35 is an waveform diagram which assists in explaining the action of the analog input unit.

The systems depicted in FIGS. 17 and 18 detect the electric quantities of the AC signals, e.g., an effective value of the AC voltage. In this case, as illustrated in FIG. 35, the AC signals are inputted to a low-pass filter 6a. Output signals of the low-pass filter 6a are taken in a sample hold circuit 6b. These signals are sequentially sampled by use of sampling signals of the sampling period T which are outputted from a timing signal generating circuit 6g. The sample-held signals are inputted via a multiplexer 6c to an analog digital converting circuit 6d. At this time, the analog signals are converted into digital data. The thus converted data are stored in a buffer memory 6e. The digital data stored in the buffer memory 6e are sequentially transferred to a processor 6f. The processor 6f performs a peak value detecting operation, an effective value calculating operation, a filter detecting operation and a filter coefficient calculating operation. More specifically, the peak value of the AC signal is detected based on the input data. Simultaneously, the effective value is detected based on the peak value. If the input data are zero-crossed, the frequencies of the AC signals are detected. A variety of filter coefficients are calculated based on the detected frequencies. The frequency is obtained at every one cycle-passage of the output signal. Hence, the filter coefficient can be obtained during one cycle. After obtaining all the filter coefficients, the new filter coefficients are employed instead of the old ones. The frequency-gain characteristics of the digital filter 1a are then adjusted.

Now supposing that the fundamental frequency of 50 Hz of the AC input signal fluctuates between 45 Hz and 55 Hz, an effective value detection error of the AC signal is measured by using the gain variable type and gain-fixed type digital filters of this invention. In this case, the measurement results shown in FIG. 36 are acquired.

Figure 36:
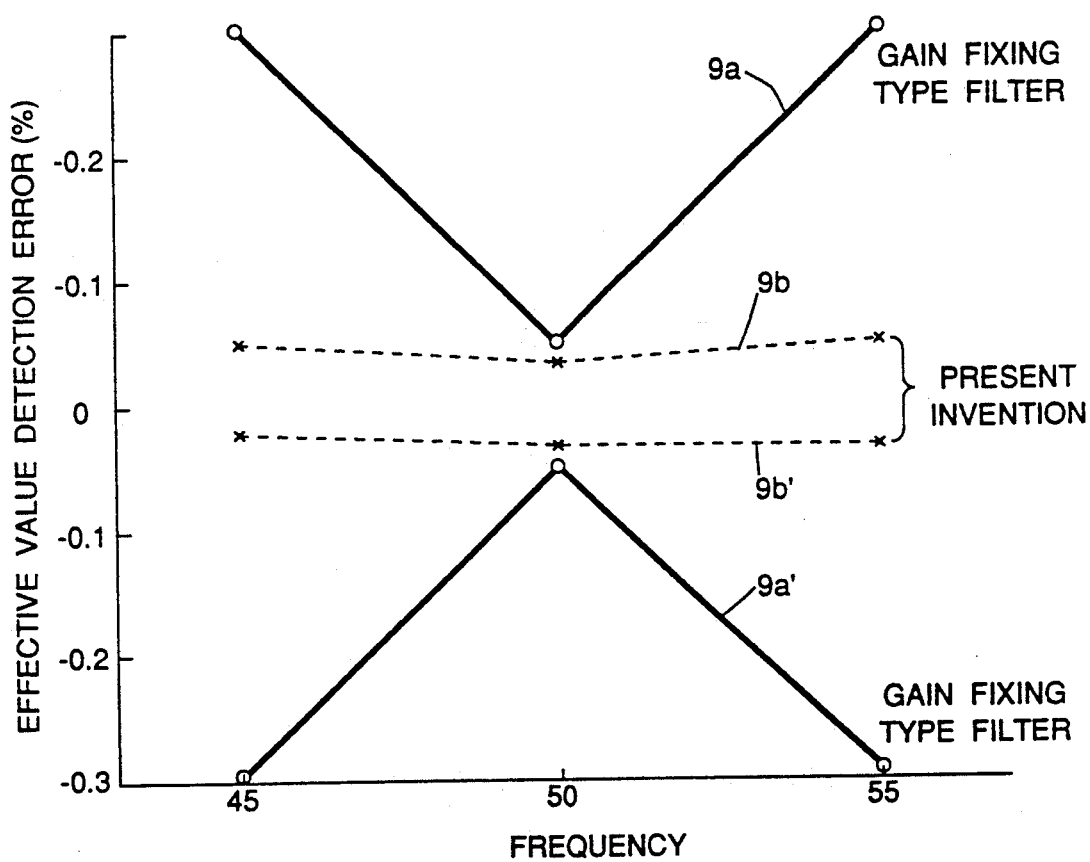
FIG. 36 is a diagram showing an example of actually measuring effective value detection errors.

As can be understood from FIG. 36, the gain of the filter is adjusted at the constant level corresponding to the fluctuations in the frequency of the input signal in the present invention. Even when the frequency of the input signal fluctuates, the effective value detection error can be reduced. Whereas in the case of employing the gain-fixed type digital filter, the detection error decreases when the input signal frequency is 50 Hz but increased as the frequency moves away from 50 Hz.

Note that when detecting the filter coefficients, the respective filter coefficients can also be obtained per sampling. If an extra processing time is prepared, all the coefficients are obtainable at one time.

Figure 37:
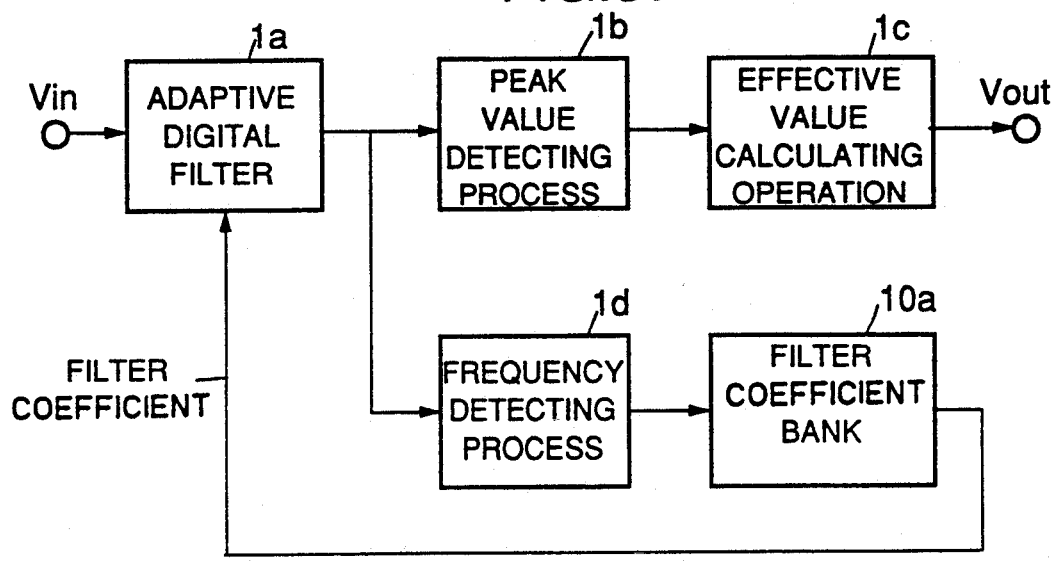
FIG. 37 is a diagram of a basic construction, showing another embodiment of this invention.
Figure 38:
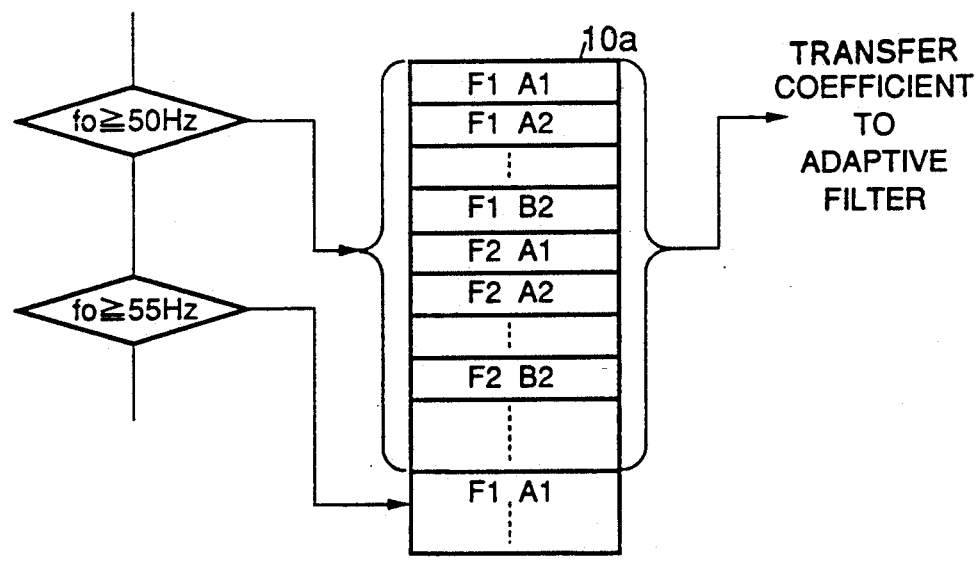
FIG. 38 is an explanatory block diagram illustrating a filter coefficient bank unit.

The embodiment discussed above has touched on a case where the filter coefficients are obtained per sampling after getting the frequency. As shown in FIG. 37, however, the processor 6f incorporates a filter coefficient bank 10a for storing the data of a group of coefficients corresponding to the detection frequencies of, e.g., 45 through 55 Hz. As shown in FIG. 38, a specified filter coefficient corresponding to the detection frequency is selected from the coefficient bank 10a. The selected filter coefficient is transferable to the digital filter 1a. In this instance, the arithmetic operation for obtaining the coefficients is unnecessary, thereby quickly modifying the gain characteristics of the digital filter 1a.

Figure 39:
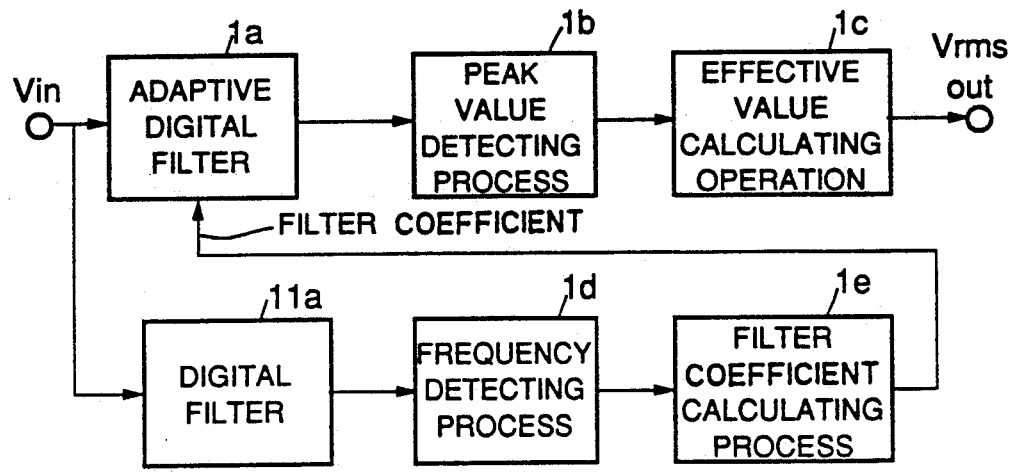
FIG. 39 is a diagrams illustrating a basic construction when employing a gain fixed type digital filter.
Figure 40:
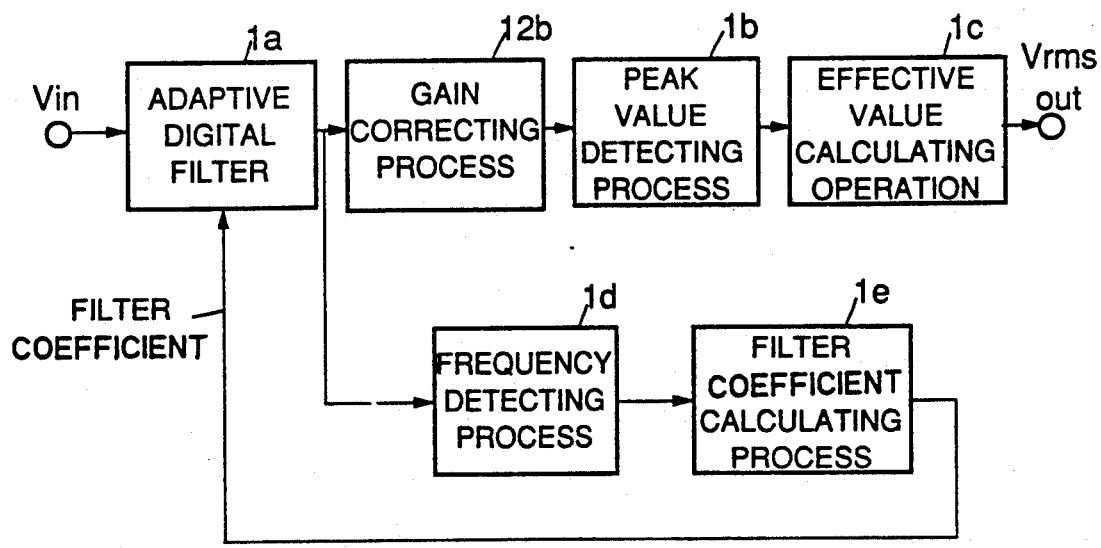
FIG. 40 is a diagram of a basic construction, showing an embodiment where a gain correction processing unit is provided.

Next, in the case of detecting the frequency of the input signal, as shown in FIG. 39, the processor 6f includes a gain-fixed type digital filter 11a. The frequency of the input signal is detected from an output signal of the digital filter 11a. A filter coefficient is calculated in accordance with this detected frequency. Based on the calculated filter coefficient, the frequency-gain characteristics of the adaptive digital filter 1a are also adjustable. In this case, the frequency of the input signal is detected from the output signal of the digital filter 11a. For this reason, the digital filter 1a can be better stabilized. Next, as illustrated in FIG. 40, a gain correction processing unit 12b is interposed between the digital filter 1a and the peak value detection processing unit 1b. The gain correction processing unit 12b corrects, to a constant value, a signal gain for the fundamental frequency among the output signals of the digital filter 1a. Owing to this correction, the peak value and the effective value can be detected with a high accuracy even if the gain of the digital filter 1a can not be kept constant in relation to the sampling frequency and the cut-off frequency of the filter 1a.

Figure 41:
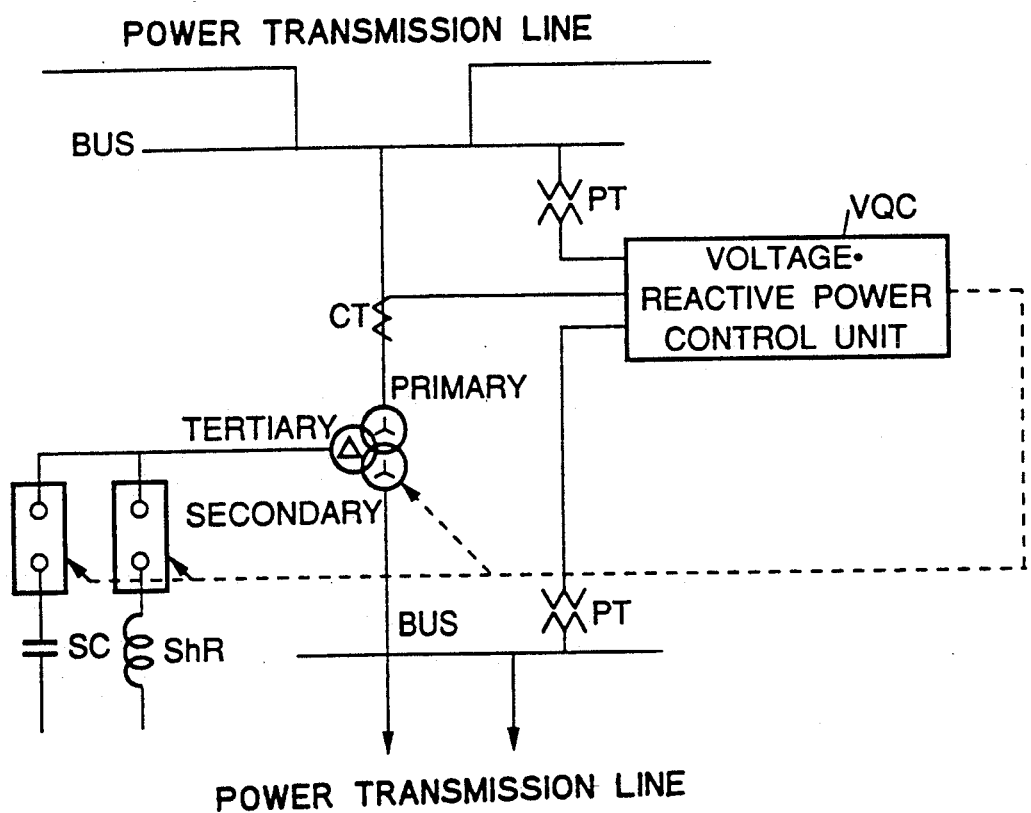
FIG. 41 is a diagram depicting a whole configuration of a voltage/reactive power control system to which the present invention is applied.

A configuration of a voltage/power control system to which this invention is applied will be described with reference to FIG. 41.

Figure 42:
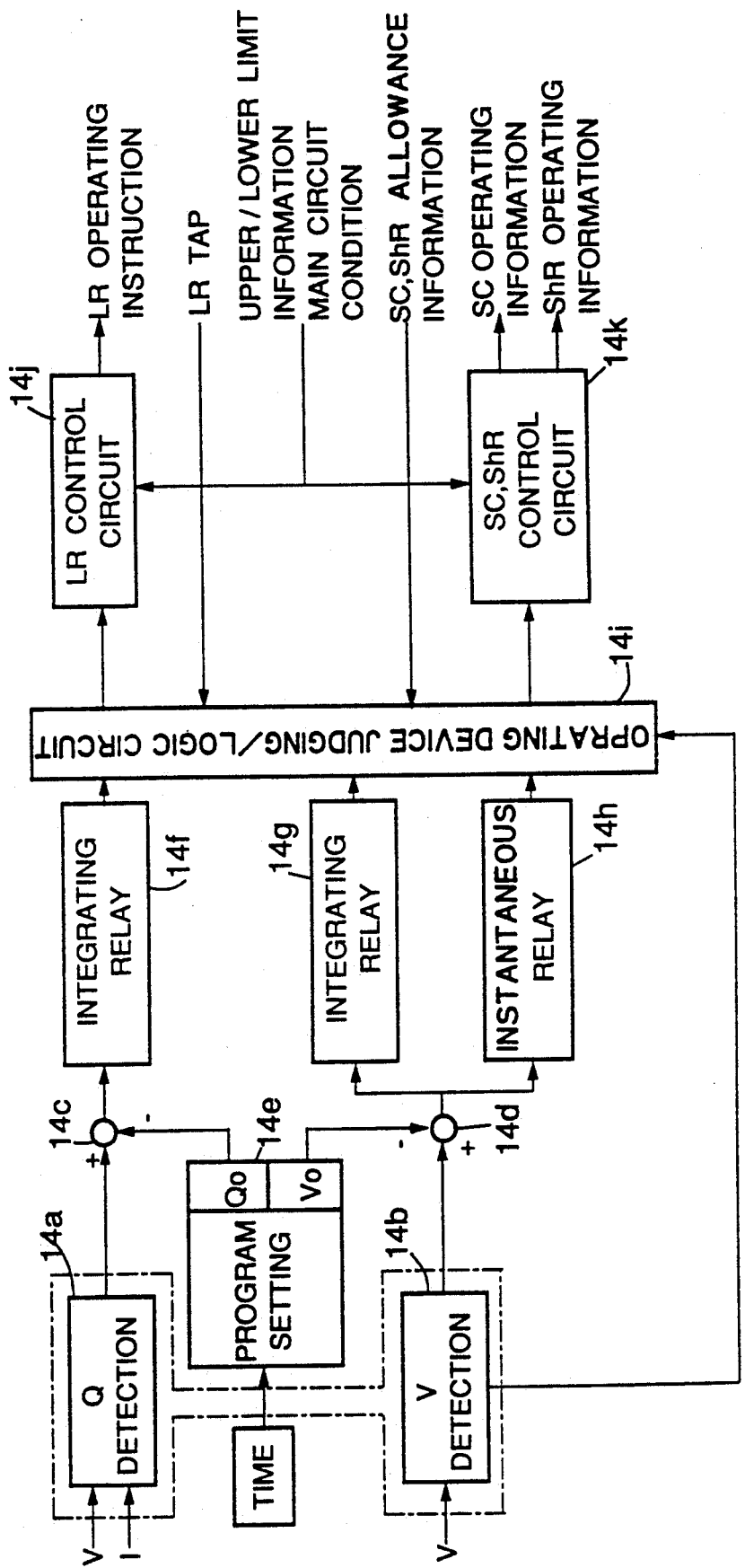
FIG. 42 is a diagram depicting a concrete construction of the voltage/reactive power control system to which the present invention is applied.

A voltage/power control system VQC takes in the AC signals of the electric power system via a current transformer CT and a potential transformer PT. The AC signals are sampled and converted into digital signals. The effective values of the AC signals are calculated from the thus converted digital data. A voltage and reactive power of the electric power system are obtained from this effective values. A variety of units are controlled based on the calculated voltage and reactive power. Specifically, the control system VQC, as illustrated in FIG. 42, comprises: a Q-detecting unit 14a; a V-detecting unit 14b; adders 14c and 14d; a program setting unit 14e; integration relays 14f, 14g and 14h; an operating unit judgment/logic circuit 14i; an LR control circuit 14j; a capacitor SC for electric power; a shunt reactor ShR; and a control circuit 14k. Used therein are the Q-detecting unit 14a and the V-detecting unit 14b incorporating the same functions as those of the processor 6f. With this arrangement, the reactive power and the effective value of the voltage are detectable with high accuracy.

A target voltage value and reactive power value are set beforehand in the control system VQC. The control system VQC controls a reactive power controller and an LR tap so that the input signal is applicable to the target value. More specifically, a deviation of a detected value from the target value is corrected while following up a voltage/reactive power flow pattern on the basis of a certain prediction. For this purpose, a load voltage regulation transformer LRT, the electric power capacitor SC and the shunt reactor ShR are adjustably controlled. Note that the priority is generally given to keeping of the target voltage. Simultaneously, a loss in power transmission is reduced.

Figure 43:
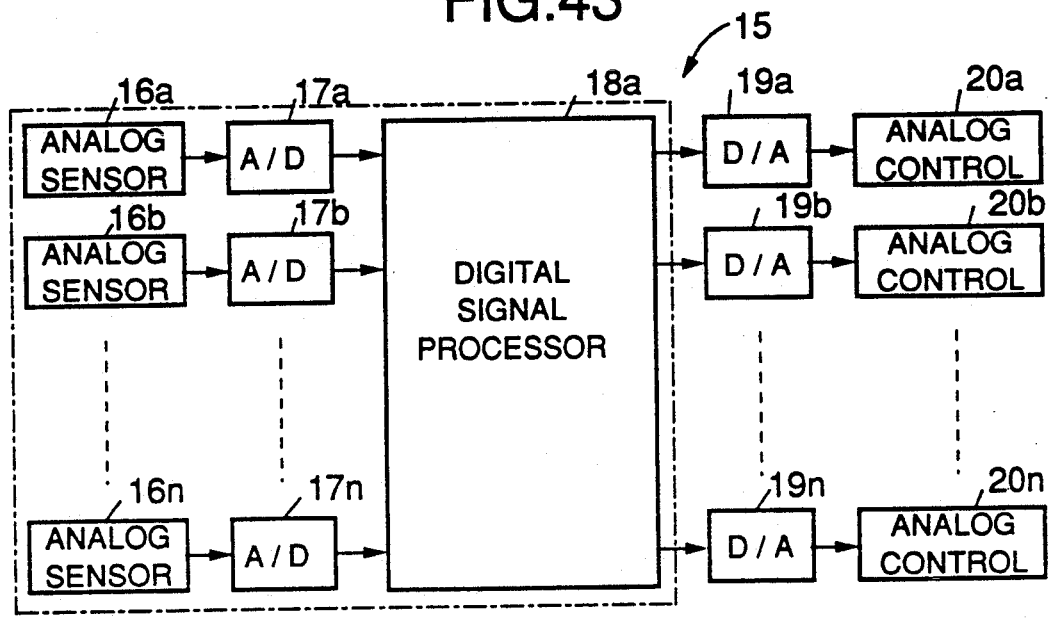
FIG. 43 is a block diagram illustrating a digital signal processing system to which the present invention is applied.

Next, an applied example of the digital signal processing system to which the present invention is applied will be explained referring to FIG. 43.

A digital signal processing system 15 in this embodiment is constructed of analog sensors 16a through 16n, A/D converters 17a through 17n and a digital signal processor 18a. An output of the processor 18a is connected via D/A converters 19a through 19n to analog control circuits 20a through 20n.

The system in this embodiment transforms physical quantities such as oscillations and the like into electric signals with the help of the analog sensors 16a to 16n. The transformed electric signals are converted into digital signals by the A/D converters 17a-17n. A variety of arithmetic operations are executed in the processor 18a. Namely, there are obtained the effective values of the AC signals which have been detected by the respective analog sensors. Generated are signals for controlling a variety of loads in accordance with these effective values. The generated digital signals are outputted via the D/A converters 19a-19n to the analog control circuits 20a-20n, thus controlling the various loads.

In this embodiment also, the effective values of the AC signals detected by the analog sensors can be obtained with the high accuracy. This in turn makes it possible to control the loads with the high accuracy.

Figure 44:
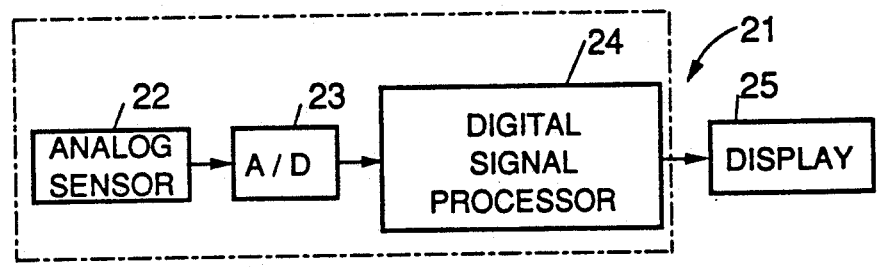
FIG. 44 a block diagram illustrating a digital multimeter to which the present invention is applied.

There will be explained an embodiment where this invention is applied to a digital multimeter in conjunction with FIG. 44. A digital multimeter 21 comprises an analog sensor 22, an A/D converter 23, a digital signal processor 24 and a display unit 25. A voltage and current of the AC signals detected by the analog sensor 22 are converted into digital signals by the A/D converter 23. The digital signals are inputted to the processor 24, wherein the effective values of the voltage and current of the AC signals are calculated. The calculated effective values of the voltage and current are displayed on a screen of the display unit 25. In this case also, the effective values of the AC signals detected by the analog sensor 22 can be obtained with the high accuracy. This contributes to an improvement of the measuring accuracy.

An embodiment where the gain-fixed digital filter is employed will be described with reference to the drawings.

Figure 45:
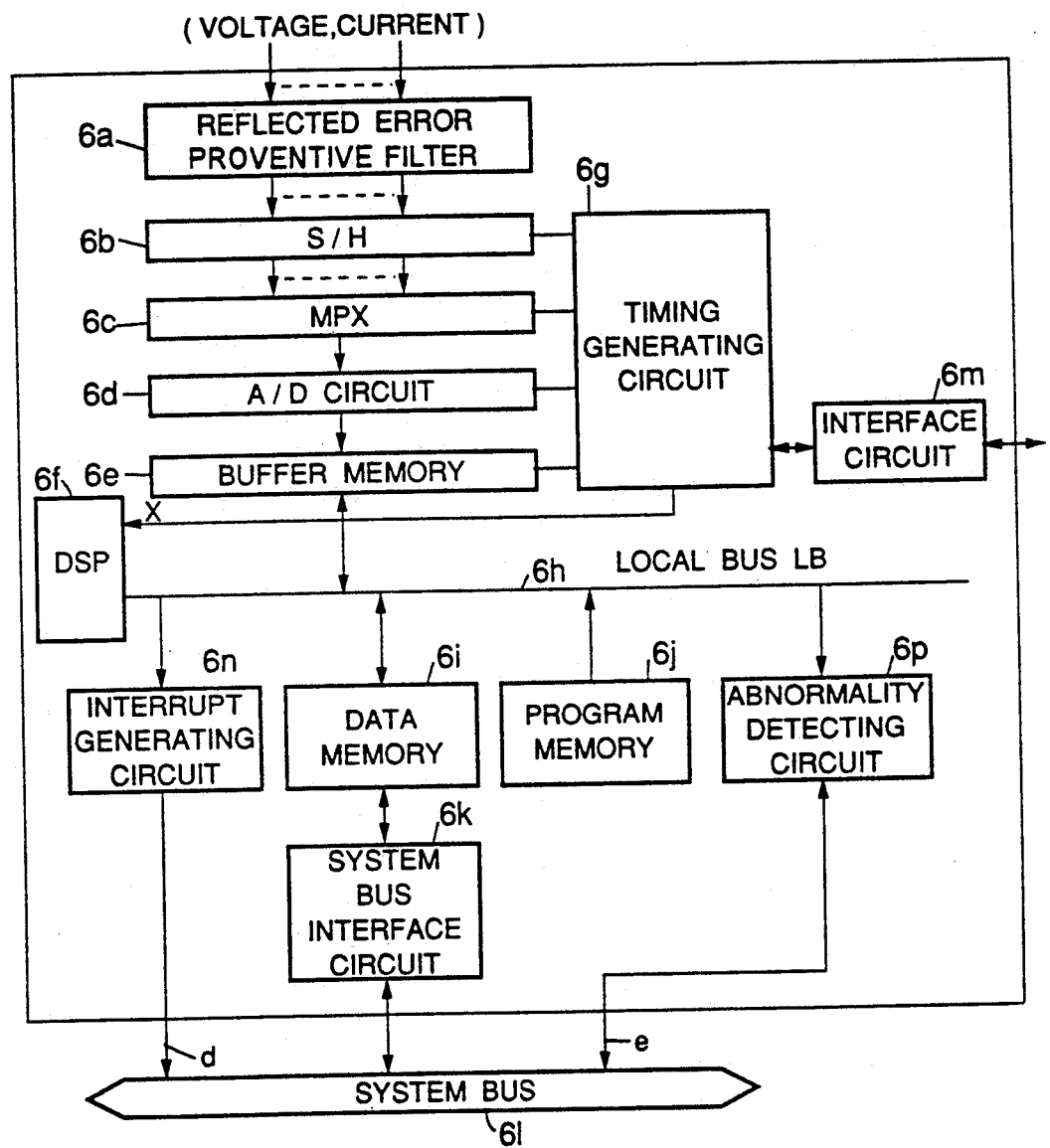
FIG. 45 is a diagram depicting a whole configuration of an analog input unit.

FIG. 45 is a block diagram depicting the overall construction of an analog input unit to which the digital signal processing system of this invention is applied. This analog input unit works to take in the input signals of a voltage and current of the electric power system. Desired physical quantities are obtained by effecting predetermined input processing and outputted to other units such as a control unit, a protective relay unit and the like.

As illustrated in the Figure, the analog input unit in this embodiment consists of: a reflected error protective filter 6a for a plurality of channels; a sample hold circuit (S/H) 6b for a plurality of channels in a full-channel simultaneous sampling method; a multiplexer (MPX) 6c; an analog-to-digital (A/D) circuit 6d; a dual port buffer memory 6e using a dual port random access memory (hereinafter abbreviated to DPRAM); a timing generating circuit 6g; and an interface circuit 6m for synchronizing the units with each other and also the analog unit with other systems (input signals, etc).

The analog input unit further includes: a digital signal processor (hereinafter abbreviated to DSP) 6f; a program memory 6j for use with the DSP 6f; a DPRAM-based dual port data memory 6i; a system bus interface circuit 6k; an interrupt generating circuit 6n; and an abnormality detecting circuit 6p.

A signal line d serves to transmit an interrupt generating signal for taking in the data to a system bus 61. An abnormality informing/discerning signal (SYS FAIL) is transmitted via a signal line e to the system bus 61.

Connected to a local bus 6h are the buffer memory 6e, the DSP 6f, the program memory 6j, the dual port data memory 6i, the interrupt generating circuit 6n and the abnormality circuit 6p. The interrupt generating circuit 6n and the abnormality detecting circuit 6p are also connected to the system bus 61. The dual port data memory 6i is connected via the system bus interface circuit 6k to the system bus 61.

The DSP 6f in this embodiment is constructed as shown in FIG. 18. The DSP 6f is capable of effecting a product-sum operation during one instruction cycle and further pipe line processing. The DSP 6f is characterized by its capability of actualizing a fast numeric value operation of fixed and floating point data. It is therefore feasible to perform filtering in real time on the input data at a multiplicity of input points. In this respect, the DSP 6f exhibits a processing velocity higher than that of the general-purpose microprocessor and is therefore preferable.

Figure 46:
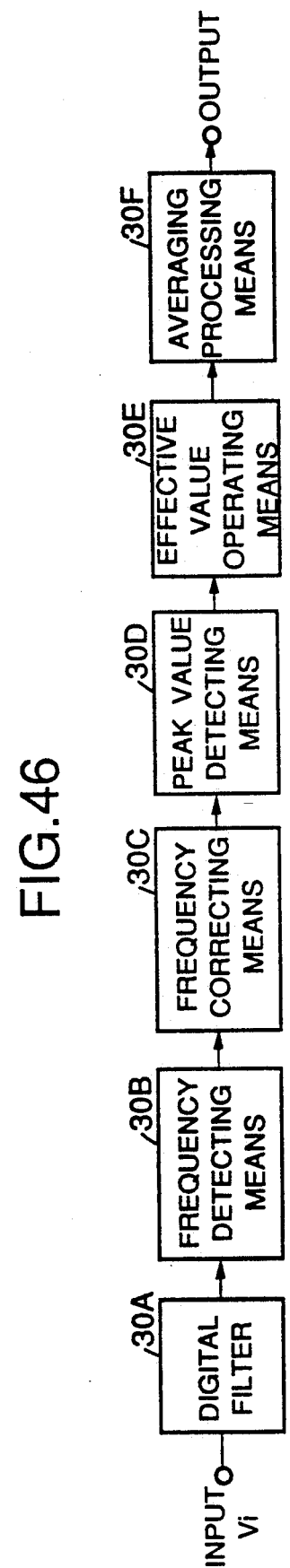
FIG. 46 is a block diagram depicting a voltage effective value detecting unit.

FIG. 46 illustrates a detailed block configuration of a digital signal processing system defined as the principal in this embodiment. Processes in the illustrated individual blocks are attained by the DSP 6f. In this embodiment, there is given a means for detecting the voltage effective value of the electric power system on the basis of the input voltage signal.

The explanation starts with touching on the outline of processing in each unit. A digital filter 30A takes in electric power system voltage signals Vi sampled with a constant period and undergoing a digital conversion from the buffer memory 6e. Offset components and high frequency components overlapped with the input signals Vi are subjected to filtering and thereby eliminated. It is to be noted that in this embodiment the sampling period T of the input signal is set smaller than 1/24 (electric angle of 15°) of one cycle of the fundamental harmonic of the AC signal in order to enhance the detection accuracy. Filter characteristics are so set that particularly the lower-harmonic which is n-times (n is the integer) as large as the fundamental harmonic coincides with the zero point frequency of the digital filter 30A. With this arrangement, a large amount of attenuation can be procured with respect to the lower harmonics. A subsequent frequency detecting means 30B arithmetically seeks a frequency of the input voltage signals Vi undergoing the filtering process. A gain correcting means 30C provided at the next stage is possessed of gain correction data set based on the frequency-gain characteristics. The gain correcting means 30C corrects the gain of the filtering-processed voltage signal Vi by use of a correction coefficient corresponding to the foregoing procured frequency. A peak value detecting means 30D subsequent thereto detects a peak value of the gain-corrected voltage signal Vi at, e.g., every half-cycle. An effective value arithmetic means 30E arithmetically obtains the effective value from the detected peak value. An averaging processing means 30F subsequent thereto averages the effective values procured per, e.g., half-cycle to further enhance the detection accuracy. The thus obtained effective values of the voltage signals Vi are stored in the data memory 6i. These stored values are used as data for the protective relay as well as for controlling the electric power system.

Usable filters as the digital filter 30A are depicted in FIGS. 32A and 32B.

In accordance with this embodiment, the input signals undergo filtering by the digital filter 30A in combination with the DSP 6f. Filtering is repeatedly carried out per sampling period T on the basis of the preset filter coefficients. Hence, the time-dividing filtering process can be performed softwarewise corresponding to the number of input points. It is possible to correspond to the increase or decrease in the number of input points, the modifications in the characteristics and the standardization of the printed board.

Filtering is attainable by employing no analog filter. Hence, there exists absolutely no factor for an initial value deviation, as seen in the analog filter, of an element such as a resistor or capacitor, fluctuations in the element value due to the ambient temperatures and a deterioration of the element due to a change with a passage of time. A higher performance can be attained, and any adjustment can be eliminated.

Besides, an externally attached inspection circuit becomes unnecessary. It is feasible to correspond thereto with the internal software. This remarkably reduces the number of manufacturing steps. The maintenance is also unnecessary. Considerable merits are created, wherein the protective relay system increases in accuracy, and the costs are decreased.

Figure 47:
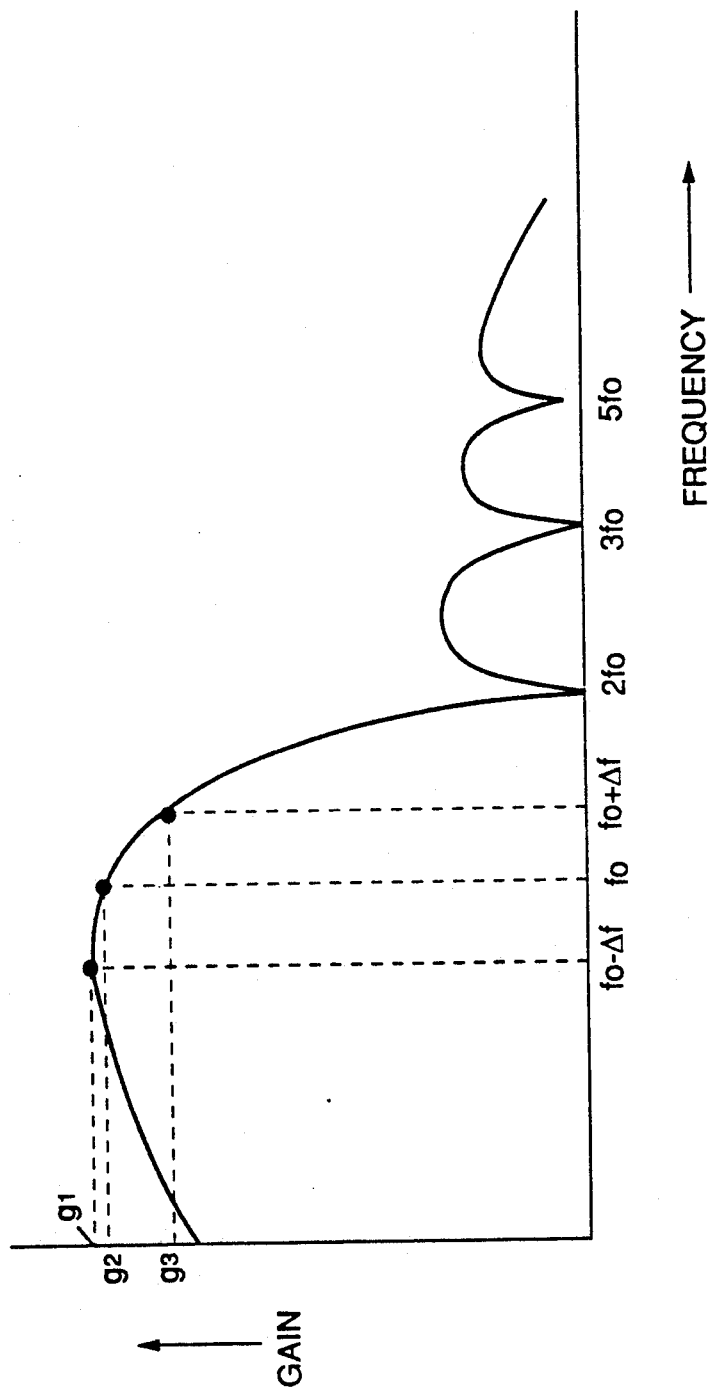
FIG. 47 is a diagram showing frequency-gain characteristics of the digital filter.

FIG. 47 shows an example of the frequency-gain characteristics of the digital filter 30A. A system frequency of the electric power system is adjusted to a central frequency fo of the filter. The symbol go represents a gain at that time. A frequency that is n-times (n is the integer) as high as the system frequency is set to the zero point frequency of the digital filter. With this arrangement, the lower harmonics can remarkably be attenuated. The characteristics containing the higher harmonics can outstandingly be improved. Note that the gain characteristic exhibits a convex curve in the vicinity of the central frequency fo. When the system frequency fluctuates, a voltage signal level of the output of the filter fluctuates correspondingly. This fluctuation is corrected by the gain correcting means 30C in cooperation with the frequency detecting means 30B.

The frequency detecting means 30B has the same construction as that of the frequency detection processing unit 1d depicted in FIG. 30. The frequency detecting means 30B is capable of detecting the frequency by executing the processes shown in FIGS. 33 and 34.

Figure 48:
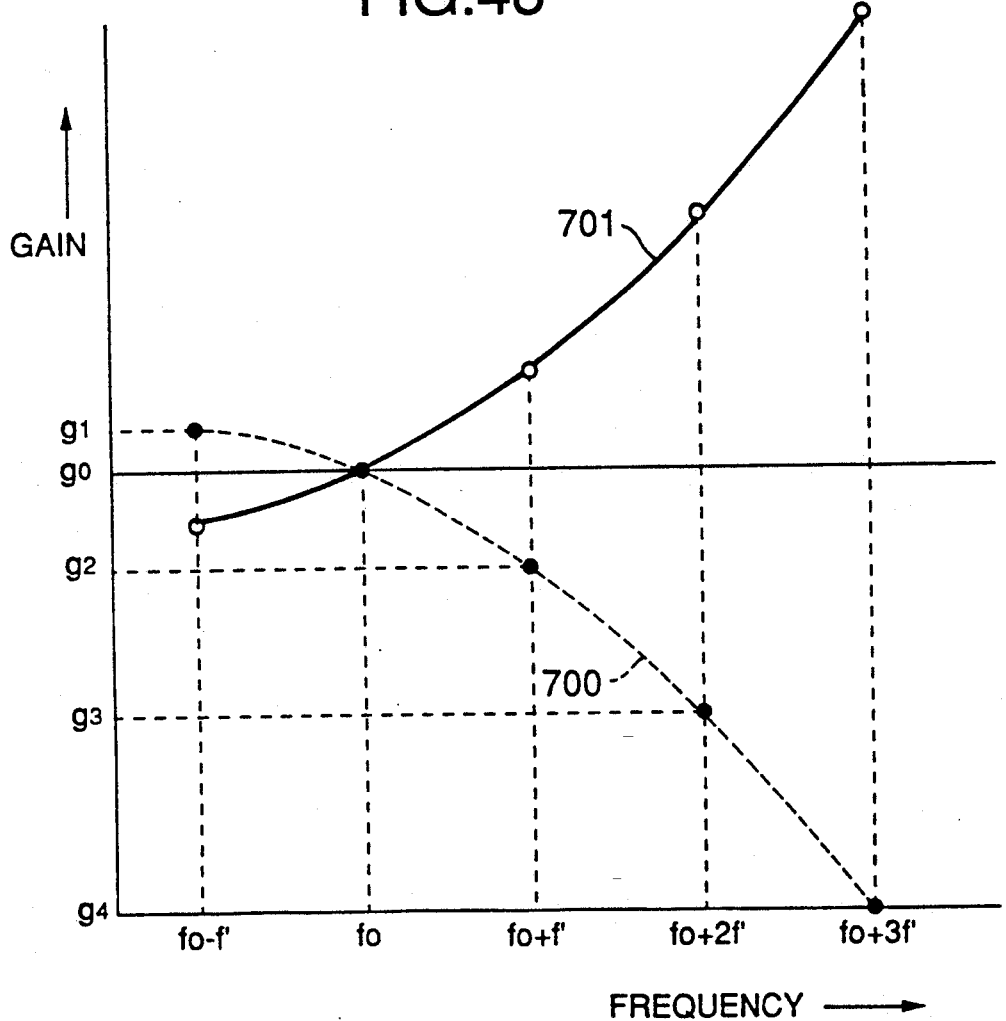
FIG. 48 is a diagram showing one example of a gain correcting function associated with the digital filter.

Next, the gain correcting means 30 of FIG. 46 will be explained with reference to FIG. 48. Referring to FIG. 48, the axis of abscissa indicates the system frequency, while the axis of ordinate indicates the gain. A curve 700 indicated by a dotted line in the figure shows a frequency-gain characteristic in the vicinity of the central frequency fo of the digital filter 30A. A gain of the central frequency fo is shown by go. The symbol g1 indicates a gain of a frequency (fo−f'); g2 represents a gain of a frequency (fo+f'); g3 denotes a gain of a frequency (fo+2f'); and g4 represents a gain of a frequency (fo+3f').

A broken line 701 in the Figure is conceived as an approximate line for correcting the gain characteristics. Namely, this approximate line shows a correction function y for an adjustment to a constant gain by correcting the gain of the detected frequency to the gain go of the central frequency fo. The correction function y is expressed by the following formula:

$$y = \frac{1}{Kg \cdot f + Kb} \qquad (30)$$

where Kg and Kb are the correction coefficients.

Note that in every section of the broken line, the correction coefficients Kg and Kb are set in the following manner by previously examining the characteristics of the digital filter 300:
(1) Between the frequencies (fo−f') and fo ... kg1, kb1;
(2) Between the frequencies fo and (fo+f') ... kg2, kb2;
(3) Between the frequencies (fo+f') and (fo+2f') ... kg3, kb3; and
(4) Between the frequencies (fo+2f') and (fo+3f') ... kg4, kb4.

Incidentally, FIG. 48 shows the example where the frequencies in the vicinity of the central frequency are divided equally by 4. As a matter of course, those frequencies may be divided unequally and divided into more sections. Besides, not only a rectilinear approximation but also a curvilinear approximation are practicable.

By virtue of the gain correction of the frequency characteristics, the input signal is corrected in conformity with the following formula:

$$V = y \cdot Vfil \qquad (31)$$

where Vfil is the filtering-processed input signal.

Note that when performing the arithmetic operation, an arithmetic period of the frequency correcting operation is identical with or larger than that of the peak detecting operation.

Figure 49:
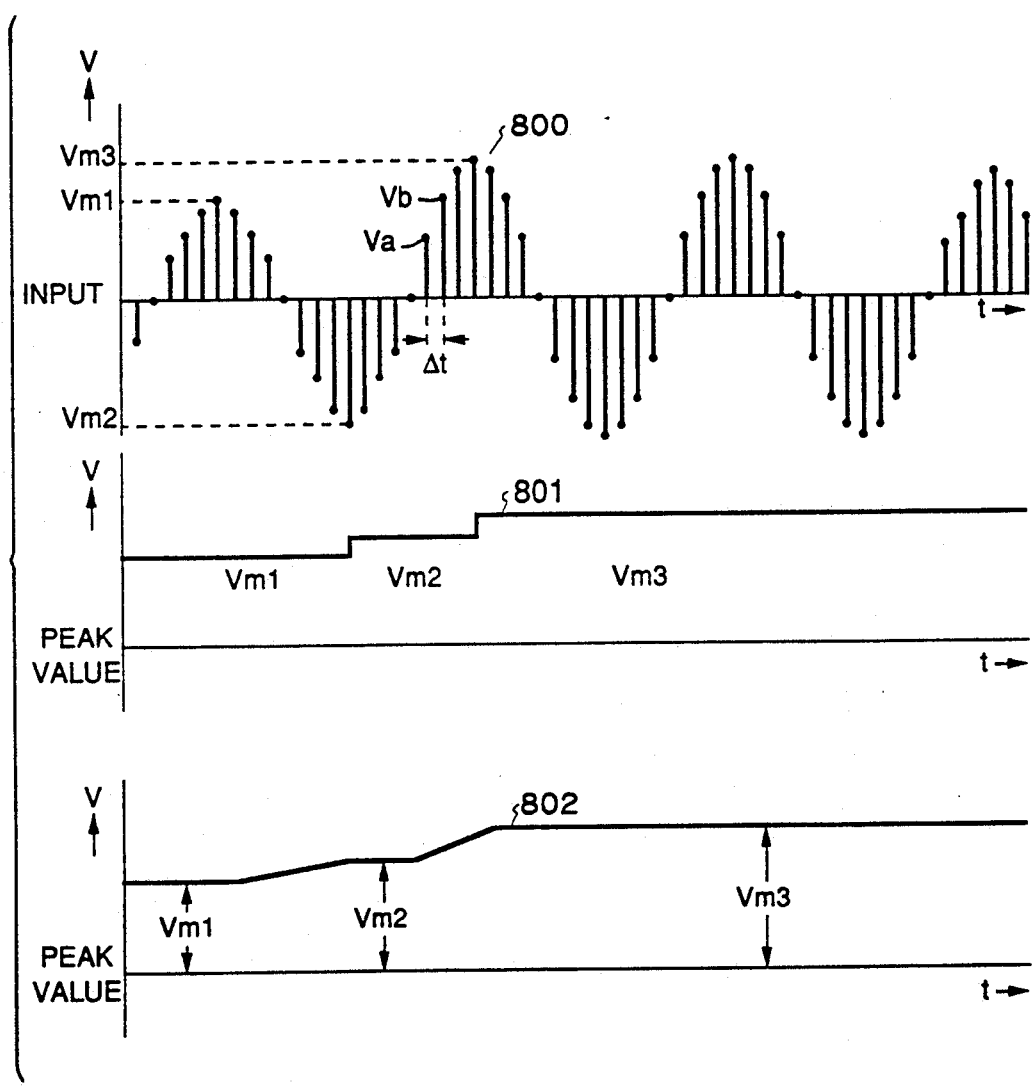
FIG. 49 is a diagram illustrating operating waveforms of a peak value detecting unit.

Next, the operation of the peak value detecting means 30D of FIG. 46 will be described with reference to FIG. 49. Designated at 800 is an input signal of the peak value detecting means 30D, i.e., a gain-corrected input signal V. To begin with, as shown by the numeral 801, absolute peak values (Vm1−Vm3) are detected from the data for a half-cycle of the input signal V taken in. The peak value can easily be detected only by a level comparison of the input signals. However, some errors are produced depending on the sampling phase. It is because that is not an actual peak. The peak values are therefore averaged.

Another embodiment of the method of detecting the peak value will be explained by using a waveform 802. Now let the symbols va and vb be the input signals inputted with a sampling period $\Delta t$ interposed therebetween. A relation between the input signals va and vb and a peak value Vp will be expressed by the following formulae:

$$va = Vp \sin \omega t \qquad (32)$$

$$vb = Vp \sin \omega(t+\Delta t) \qquad (33)$$

where $\omega$ is the angular frequency of the input signal. From the formulae (32) and (33), $$vb = va \cos \omega \Delta t + Vp \cos \omega t \cdot \sin \omega \Delta t \qquad (34)$$

$$Vp \cos \omega t = \frac{vb - va \cos \omega \Delta t}{\sin \omega \Delta t} \qquad (35)$$

Then, a sum thereof is obtained by squaring the formulae (32) and (35), respectively. The result is given by:

$$Vp^2 = va^2 + \left( \frac{vb - va \cos \omega \Delta t}{\sin \omega \Delta t} \right) \qquad (36)$$

Hence, the peak value Vp can arithmetically procured by the following formula:

$$Vp = \frac{\sqrt{va^2 + vb^2 - 2\, va\, vb \cos \omega \Delta t}}{\sin \omega \Delta t} \qquad (37)$$

Note that the arithmetic period for the peak value Vp may be identical with the sampling period T of the input signal but may also be longer than the period T—viz., the arithmetic may be effected by thinning out the data.

Next, the operation and processing of the effective value arithmetic means 30E depicted in FIG. 46 will be explained. There exists a relation between the peak value Vp obtained above and the effective value Vrms in the following equation. Based on this, the effective value Vrms is arithmetically given by:

$$Vrms = \frac{1}{\sqrt{2}} \cdot Vp \tag{38}$$

The averaging processing means 30F depicted in FIG. 46 takes an average, for a constant period, of the effective values Vrms acquired by the effective value arithmetic means 30E. An average effective value is then outputted.

As discussed above, in the embodiment shown in FIGS. 45 and 46, the frequency of the filtering-processed voltage signal is detected based on the frequency-gain characteristics of the digital filter 30A. The gain of the output voltage signal of the digital filter 30A is thereby corrected. An effect is therefore produced, wherein the peak value or the effective value is detectable from the voltage signal with a high accuracy even when the system frequency fluctuates.

Since the processes are executed by the DSP 6f, the sampling period T of the input signal Vi is twice or above as high as the conventional 600 Hz (or 720 Hz). Furthermore, the detection accuracy of the peak value or the effective value can be enhanced.

As explained earlier, the correction corresponding to the frequency-gain characteristics of the filter is carried out. The sampling period is reduced by use of the digital signal processor. With this arrangement, the effective value of the system voltage is detectable with a high accuracy without performing the interpolating operation of the complicated algorithm. As a result, the highly accurate input signal processing system can be actualized with no increase in size. The detection accuracy can be improved from 1-5% (12-sampling/one cycle) in the prior art to 0.1% (60-sampling/one cycle).

Because of the digital filter being applied, the problems incidental to the analog filter of the RC active filter consisting of a resistor and a capacitor are obviated. The problems include, for instance, a scatter in the element, deteriorations both in temperature characteristics and in property due to a change with a passage of time, or an inter-channel scatter in property. As a result, the accuracy of the input filter can be increased; and the quantization errors can remarkably be reduced.

However, the digital filter is not essentially characteristic of the present invention. Hence, the advantages relative to the gain correction according to this invention can be exhibited even when replacing the digital filter 30A of FIG. 46 with an analog filter.

Note that a function to correct the gain which corresponds to the gain correcting means 30C in the embodiment of FIG. 46 may be incorporated everywhere in rear of the frequency detecting means 30B of the embodiment shown in FIG. 46. For example, this function may be inserted on the output side of the peak value detecting means 30D or the effective value arithmetic means 30E.

The embodiment of FIG. 46 has dealt with the arrangement that the function is accomplished by using the DSP 6f. Instead, the function can be apparently attained by a general-purpose processor or a combination of this general-purpose processor and a coprocessor (floating point operation processor). Besides, digital filter 30A preferably involves the use of a fast DSP in terms of effecting the filtering process while reducing the sampling period. Therefore, the digital filter 30A and the frequency detecting means 30B are actualized by the DSP 6f of FIG. 45. The processes subsequent to the gain correcting means 30C are performed by the general-purpose processors provided in other units.

FIG. 50 is a block diagram showing another embodiment of this invention. FIG. 50 illustrates only the components corresponding to those of FIG. 46. These components are means actualized by the DSP 6f of FIG. 45. A different arrangement in this embodiment from FIG. 46 is that the effective value is directly detected without detecting the peak value. The same functions and the blocks having the same configurations as those of FIG. 46 are marked with the like symbols, and the description is therefore omitted. An effective value arithmetic means 30G depicted in FIG. 50 computes the effective value Vrms by the following formula (39). In the formula (39), the symbol Vfil represents an output voltage signal, indicated by a waveform 800 of FIG. 51, of the digital filter 30A. The symbol n denotes the number of sampling operations, and N represents the number of sampling data for the arithmetic operation.

$$Vrms = \sqrt{\sum_{n=0}^{N} V^2 fil} \tag{39}$$

Figure 52:
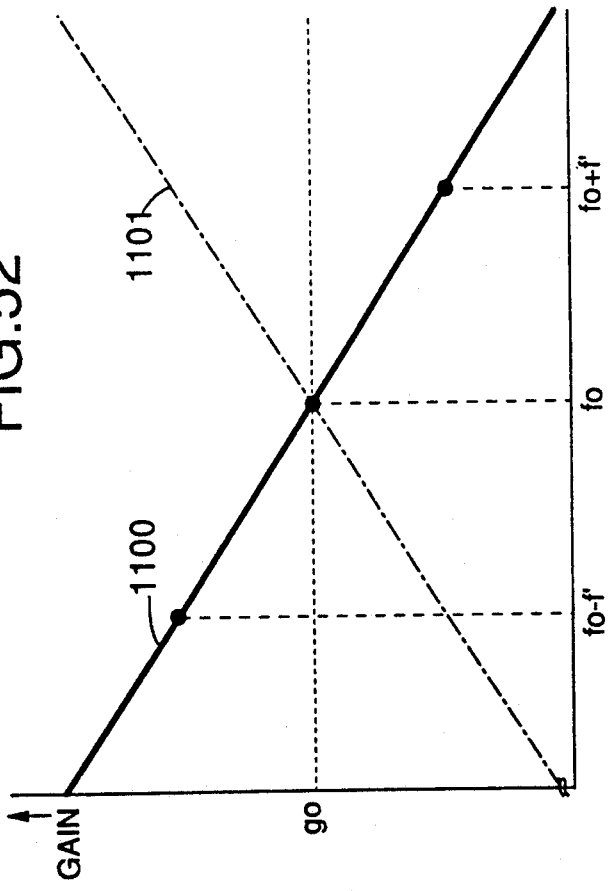
FIG. 52 is a diagram showing one example of a gain correcting function in the embodiment.

A variation in the effective value Vrms procured above is indicated by a waveform 1000 in FIG. 51. The thus obtained effective value Vrms exhibits such a characteristic that the gain thereof, as indicated by a line 1100 of FIG. 52, changes corresponding to variations in the system frequency. The gain-change depending on the frequency are corrected by a gain correcting means 30A disposed next in accordance with a correction function shown by a line 1101 of FIG. 52. The correction herein is carried out in the same procedures as those in the embodiment of FIG. 46. In this embodiment, however, a different point lies in the correction of the effective value Vrms. Considering that the gain correction is originally needed also in effective value operation processing of FIG. 46, it is possible to correct the gain in accordance with the frequency gain correction of the digital filter after calculating the effective value in this embodiment. The accuracy is thereby improved. The effective value is directly acquired without detecting the peak value, resulting in the advantage that the detection accuracy rises.

Figure 53:
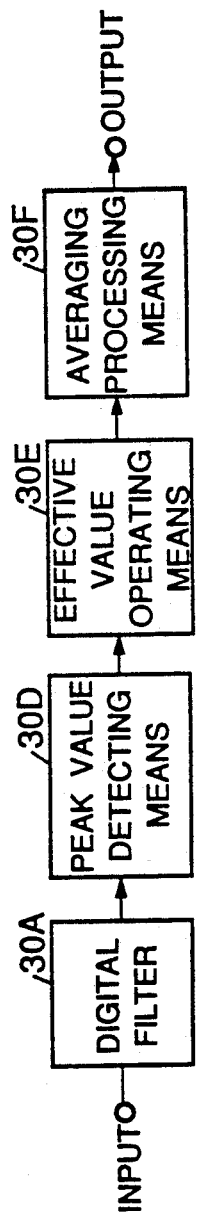
FIG. 53 is a block diagram showing another example of the voltage effective value detecting unit relative to this invention.
Figure 54:
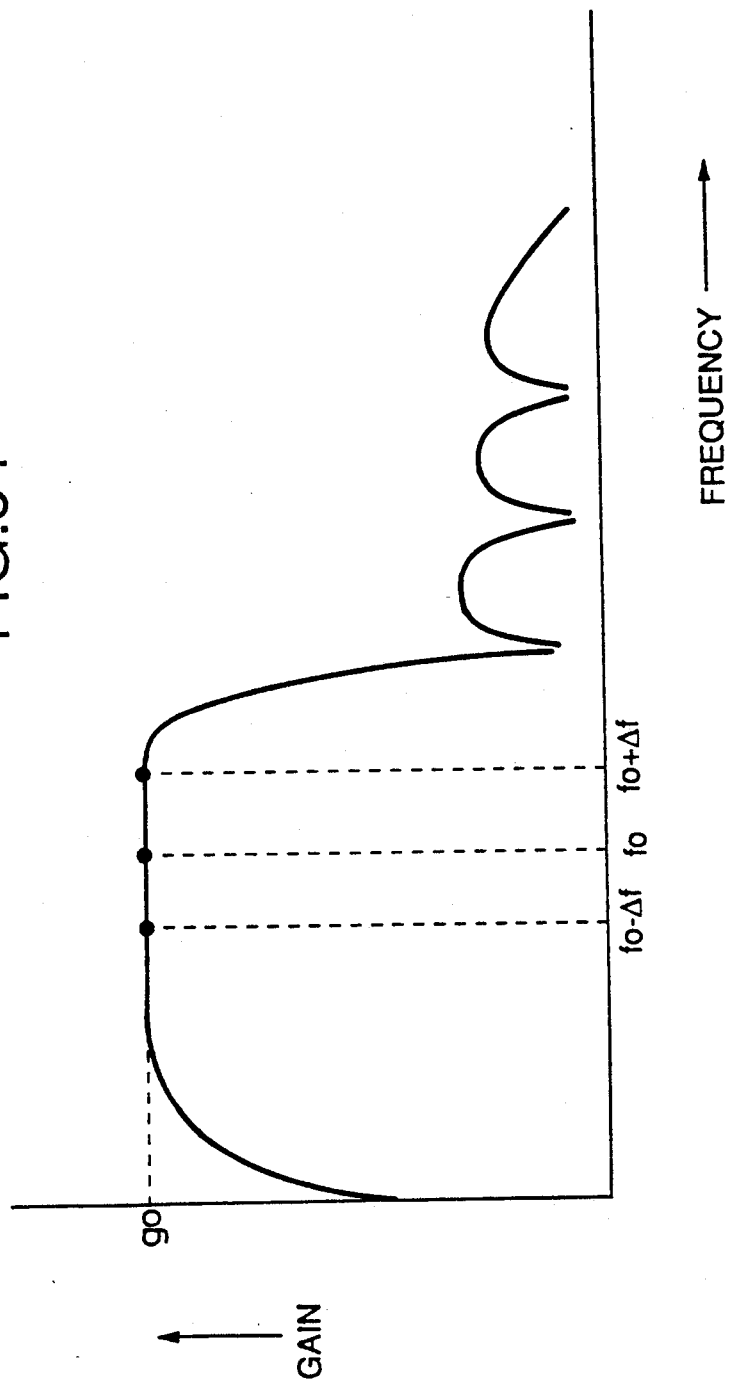
FIG. 54 is a diagram showing frequency-gain characteristics of the digital filter in the embodiment of FIG. 53.

FIG. 53 is a block diagram showing still another embodiment of the present invention. FIG. 53 shows only the components corresponding to those of FIG. 46. These components are conceived as means actualized by the DSP 6f. In FIG. 53, the peak value detecting means 30D through the averaging processing means 30F are the same as those shown in FIG. 46, and hence the description thereof is omitted. A different point of this embodiment from FIG. 46 is that the frequency-gain characteristics of a digital filter 30A are different from those of FIG. 46. To be more specific, in the digital filter 30A1 in this embodiment, as shown in a frequency-gain characteristic diagram of FIG. 54, a filter operation program and filter coefficients are adjustably set. Gains within a frequency fluctuation range (fpo+f) of the electric power system are adjustably constantly to go. Therefore, this embodiment eliminates the necessity for the frequency detecting means 30B and the gain correcting means 30C or 30H which are used in the embodiments of FIG. 46 and 50. Note that the characteristics shown in FIG. 54 are procured by improving the characteristics of the digital filter illustrated in FIGS. 32A and 32B. The filtering operation becomes more intricate than in the FIGS. 32A and 32B. The error concomitant with the gain correction does not, however, intervene, whereby the accuracy can be further increased.

Figure 55:
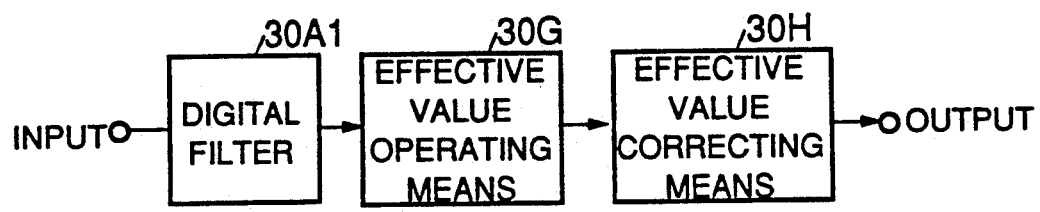
FIG. 55 is a block diagram showing still another example of the voltage effective value detecting unit relative to this invention.

FIG. 55 is a block diagram showing a further embodiment of the present invention. This embodiment takes such a form that the embodiment of FIG. 49 is combined with the digital filter 30A1 used in the embodiment of FIG. 52. The same high accuracy as that in the embodiment of FIG. 53 is acquired.

It should be noted that in the respective embodiments of FIGS. 46, 50, 53 and 55, the input filter involves the use of the digital filter 30A or 30A1. According to the present invention, as stated before, the analog filter is applicable. In this case, the outputs of the analog filter are sampled at a high speed (e.g., 24 times/one cycle) and then converted into the digital signals. Thereafter, the digital signals undergo the processes shown in the respective embodiments, thereby obtaining the voltage effective values from the voltage signals. The frequency-gain characteristics of the filter are compensated, with the result that the voltage effective value can be detected with the high accuracy.

Figure 56:
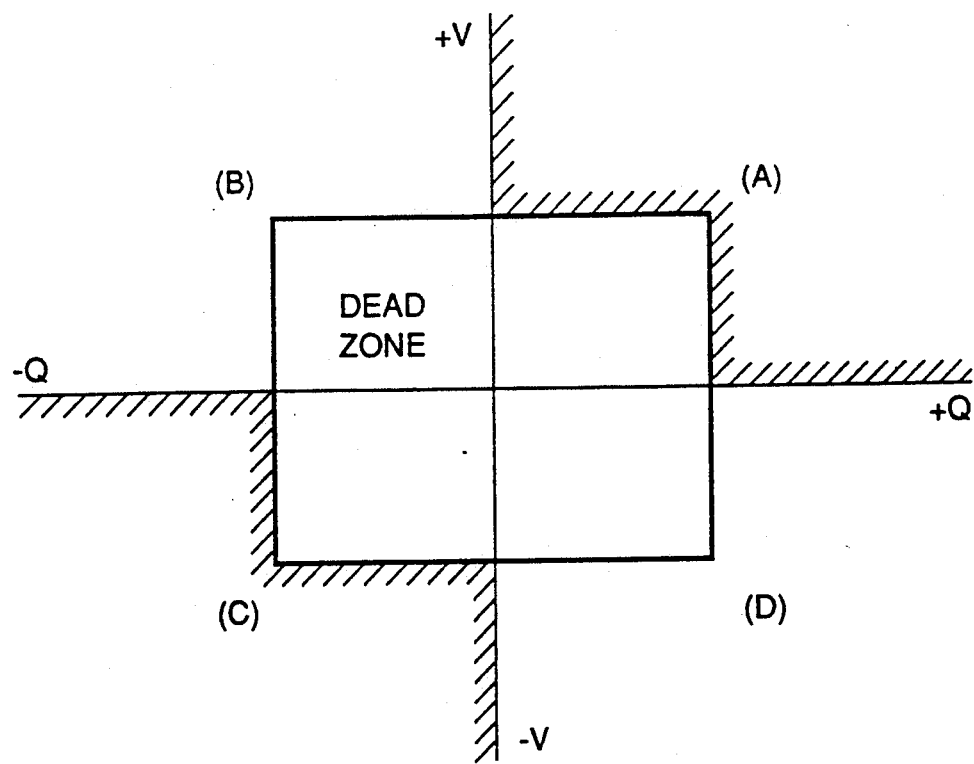
FIG. 56 is an explanatory diagram showing the operation of the voltage/reactive power control system.

The following is a description of the operation when the signal processing system in the foregoing embodiment is applied to the voltage/reactive power controlling system depicted in FIG. 42 in conjunction with FIG. 56.

FIG. 56 shows an example of control characteristics of the VQ control system. Under the control thereof, a target voltage and a reactive power value are at first set. A reactive power controller is set to match with these set values. Then, the reactive power controller and an LR tap are controlled to match therewith. Typically, the priority is given to maintenance of the target voltage. Simultaneously, there is made an attempt to reduce a loss in power transmission. The operating principle will be explained. While following up a voltage/reactive power flow pattern determined based on a certain prediction, a deviation of the target value from a real value is corrected under the adjustable control of a transformer tap, an electric power capacitor and a shunt reactor.

For instance, referring to FIG. 56, when the voltage reactive power is in a region (A) (V→high, Q→much), a manipulation is performed to lower an LR voltage. When in a region (B) (V→high, Q→less), an SC is opened, while an ShR is turned ON. When in a region (C) (V→low, Q→less), the LR voltage is boosted. When in a region (D) (V→low, Q→much), the SC is turned ON, while the ShR is opened. The voltage/reactive power is kept to the target value by these manipulations.

In accordance with this embodiment, the voltage effective value is detectable with the high accuracy. This in turn makes it possible to control the voltage/reactive power with the high accuracy.

Although the illustrative embodiments have been described in detail with reference to the accompanying drawings, it is to be understood that the present invention is not limited to those embodiments. Various changes or modifications may be effected therein by one skilled in the art without departing from the scope or spirit of the invention.

What is claimed is:

1. A method of processing a digital signal, comprising the steps of:

sampling an analog signal;

converting the sampled analog signal into a digital signal;

effecting a filtering process on the digital data by use of a digital filter, wherein the frequency for sampling said analog signal is so set that a noise generation region in which noises are caused due to disturbance noises and a quantization error falls within the blocking band of said digital filter; and arithmetically processing the filter-processed digital signal;

said blocking band of said digital filter being set to a higher frequency band than the pass band of the analog signal during said arithmetically processing step.

2. The method as set forth in claim 1, wherein a 1/N frequency (N: not less than 2) of the sampling frequency is set to a zero point frequency of said digital filter.

3. The method as set forth in claim 2, wherein the zero point frequency and attenuation characteristics of said digital filter are set in accordance with an actually measured value of noises which are caused due to the disturbance noises and the quantization error.

4. The method as set forth in claim 2, wherein the noise generating region associated with the disturbance noises and the quantization error and the magnitude of the noises are arithmetically obtained, and the zero point frequency and the attenuation characteristics of said digital filter are set based on these arithmetic results.

5. The method as set forth in claim 2, wherein the noise generating region associated with the disturbance noises and the quantization error and the magnitude of the noises undergo a spectrum analysis, the zero point frequency and the attenuation characteristics of said digital filter are set from the analytic results.

6. The method as set forth in claims 1, 2, 3, 4 or 5, wherein the analog signal is sampled with a period smaller than an operating period of a digital operating process.

7. A system for processing a digital signal, comprising:

sample hold means for sample-holding an analog signal;

analog-to-digital converting means for converting the analog signal held by said sample hold means into a digital signal;

digital filter means for effecting a filtering process on the digital signal outputted from said analog-to-digital converting means; and digital processing means for executing arithmetic processing on the digital signal outputted from said digital filter means;

said sampling frequency of said sample hold means being set such that a noise generation region in which noises are caused due to disturbance noises and a quantization error falls within the blocking band of said digital filter means, and the blocking band of said digital filter means is set to a higher frequency band than the pass band of the analog signal during arithmetic processing of the filter-processed digital signal.

8. The system as set forth in claim 7, wherein a zero point frequency of said digital filter means is set to a 1/N frequency (N: not less than 2) of the sampling frequency.

9. A system for processing a digital signal for an electric power system, comprising:

sample hold means for sample-holding analog signals relative to electrical quantities of an electric power system;

analog-to-digital converting means for converting the analog signal held by said sample hold means into a digital signal;

digital filter means for effecting a filtering process on the digital signal outputted from said analog-to-digital converting means; and digital processing means for judging whether or not an accident occurs in the electric power system based on the digital signal outputted from said digital filter means;

said sampling frequency of said sample hold means being set such that a noise generation region in which noises are caused due to disturbance noises and a quantization error falls within the blocking band of said digital filter means, and the blocking band of said digital filter means is set to a higher frequency band than the pass band of the analog signal during arithmetic processing of the filter-processed digital signal.

10. The system as set forth in claim 9, wherein the zero point frequency of said digital filter means is set to a 1/N frequency (N: not less than 2) of the sampling frequency.

11. A system for analyzing a digital signal, comprising:

sample hold means for sample-holding an analog signal relative to a physical quantity of an object for analysis;

analog-to-digital converting means for converting the analog signal held by said sample hold means into a digital signal;

digital filter means for effecting a filtering process on the digital signal outputted from said analog-to-digital converting means; and digital processing means for executing a spectrum analysis on the digital signal outputted from said digital filter means;

said sampling frequency of said sample hold means being set such that a noise generation region in which noises are caused due to disturbance noises and a quantization error falls within the blocking band of said digital filter means, and the blocking band of said digital filter means is set to a higher frequency band than the pass band of the analog signal during arithmetic processing of the filter-processed digital signal.

12. The digital signal analyzer as set forth in claim 11, wherein the zero point frequency of said digital filter means is set to a 1/N frequency (N: not less than 2) of the sampling frequency.

13. A system for processing a voice signal, comprising:

sample hold means for sample-holding an analog signal relative to a voice; analog-to-digital converting means for converting the analog signal held by said sample hold means into a digital signal;

digital filter means for effecting a filtering process on the digital signal outputted from said analog-to-digital converting means; and digital processing means for effecting an echo canceling process on the digital signal outputted from said digital filter means;

said sampling frequency of said sample hold means being set such that a noise generation region in which noises are caused due to disturbance noises and a quantization error falls within the blocking band of said digital filter means, and the blocking band of said digital filter means is set to a higher frequency band than the pass band of the analog signal during arithmetic processing of the filter-processed digital signal.

14. The system as set forth in claim 13, wherein the zero point frequency of said digital filter means is set to a 1/N frequency (N: not less than 2) of the sampling frequency.

15. A system for recording a digital signal, comprising:

sample hold means for sequentially sample-holding a plurality of analog signals;

analog-to-digital converting means for converting the analog signal held by said sample hold means into a digital signal;

digital filter means for effecting a filtering process on the digital signal outputted from said analog-to-digital converting means;

digital processing means for executing an arithmetic process on the digital signal outputted from said digital filter means; and digital signal recording means for recording the digital signal outputted from said digital processing means, wherein the sampling frequency of said sample hold means is so set that a noise generation region in which noises are caused due to disturbance noises and a quantization error falls within the blocking band of said digital filter means, and the blocking band of said digital filter means is set to a higher frequency band than the pass band of the analog signal during arithmetic processing of the filter-processed digital signal.

16. The system as set forth in claim 15, wherein the zero point frequency of said digital filter means is set to a 1/N frequency (N: not less than 2) of the sampling frequency.

17. A digital audio system, comprising:

sample hold means for sample-holding an analog signal relative to a voice;

analog-to-digital converting means for converting the analog signal held by said sample hold means into a digital signal;

digital filter means for effecting a filtering process on the digital signal outputted from said analog-to-digital converting means: and digital processing means for effecting an arithmetic process on the digital signal outputted from said digital filter means;

said sampling frequency of said sample hold means being set such that a noise generation region in which noises are caused due to disturbance noises and a quantization error falls within the blocking band of said digital filter means, and the blocking band of said digital filter means is set to a higher frequency band than the pass band of the analog signal during arithmetic processing of the filter-processed digital signal.

18. The system as set forth in claim 17, wherein the zero point frequency of said digital filter means is set to a 1/N frequency (N: not less than 2) of the sampling frequency.

19. A method of processing a digital signal, comprising the steps of:

converting an AC signal into a digital signal;

effecting a filtering process on the digital signal by use of a gain variable type digital filter;

detecting a frequency of the AC signal from an output signal of said digital filter when obtaining an electric quantity of the AC signal from the output signal of said digital filter; and adjusting a gain characteristic of said digital filter in accordance with the detected frequency.

20. A method of processing a digital signal, comprising the steps of:

converting an AC signal into a digital signal;

effecting a filtering process on the digital signal by use of a gain variable type digital filter;

detecting a frequency of the AC signal from an output signal of said digital filter when obtaining an electric quantity of the AC signal from the output signal of said digital filter;

calculating a filter coefficient for making the detected frequency coincident with a set frequency of said digital filter; and adjusting a gain characteristic of said digital filter in accordance with the calculated filter coefficient.

21. A method of processing a digital signal, comprising the steps of:

converting an AC signal into a digital signal;

effecting a filtering process on the digital signal by use of a gain variable type digital filter;

detecting a frequency of the AC signal from an output signal of said digital filter when obtaining an electric quantity of the AC signal from the output signal of said digital filter;

selecting a filter coefficient for making the detected frequency coincident with a set frequency of said digital filter on the basis of a detection frequency from a group of filter coefficients preset corresponding to specified frequencies; and adjusting a gain characteristic of said digital filter in accordance with the selected filter coefficient.

22. A method of processing a digital signal, comprising the steps of:

converting an AC signal into a digital signal;

effecting a filtering process on the digital signal by use of a gain variable type digital filter to produce a digital filter signal;

effecting a filtering process on the digital filter signal by inputting the digital filter signal to a gain fixed type digital filter when obtaining an electric quantity of the AC signal from said gain variable type digital filter;

detecting a frequency of the AC signal from an output of said gain fixed type digital filter;

calculating a filter coefficient for making the detected frequency coincident with a set frequency of said gain variable type digital filter; and adjusting a gain characteristic of said gain variable type digital filter in accordance with the calculated filter coefficient.

23. The method as set forth in claims 19, 20, 21, or 22, wherein a gain of an output signal with respect to a fundamental frequency of the AC signal among the output signals of said gain variable type digital filter is corrected to a constant value, and an electric quantity is obtained from the corrected signal.

24. The method as set forth in claims 19, 20 or 22 wherein a peak value of the AC signal is detected as an electric quantity of the AC signal from the output signal of said gain variable type digital filter, and an effective value of the AC signal is calculated from the detected peak value.

25. A system for processing a digital signal, comprising:

sample hold means for sample-holding an AC signal;

analog-to-digital converting means for converting the signal held by said sample hold means into a digital signal;

gain variable type digital filter means for extracting the digital signal of a specific frequency component by effecting a filtering process of the digital signal;

frequency detecting means for detecting a frequency of the AC signal from the output signal of said digital filter means;

gain adjusting means for adjusting a gain characteristic of said digital filter means on the basis of a detection output of said frequency detecting means; and electric quantity calculating means for calculating an electric quantity of the AC signal from the output signal of said digital filter means.

26. A system for processing a digital signal, comprising:

sample hold means for sample-holding an AC signal;

analog-to-digital converting means for converting the signal held by said sample hold means into a digital signal;

gain variable type digital filter means for detecting the digital signal of a specific frequency component by effecting a filtering process on the digital signal;

frequency detecting means for detecting a frequency of the AC signal from the output signal of said gain variable type digital filter means;

filter coefficient calculating means for detecting a filter coefficient for making the detected frequency coincident with a set frequency of said digital filter means on the basis of the detection output of said frequency detecting means;

gain adjusting means for adjusting a gain characteristic of said digital filter means in accordance with the filter coefficient calculated by said filter coefficient calculating means; and electric quantity calculating means for calculating an electric quantity of the AC signal from the output signal of said digital filter means.

27. An electric voltage/reactive power controlling system for controlling an electric power controller so that an AC signal of said electric power system is converted into a digital signal, an effective value of the AC signal is detected as an electric quantity of the AC signal from the converted digital signal, a reactive power of the AC signal is obtained, and the electric quantity is matched with a target value, comprising:

means for converting the AC signal of said electric power system into the digital signal, said converting means consisting of a system as claimed in claim 25 or claim 26.

28. A digital multimeter for displaying an effective value of an AC signal which is detected as an electric quantity thereof from a digital signal in which the AC signal is converted, comprising:

means for converting the AC signal into the digital signal, said converting means consisting of a system as claimed in claim 25 or claim 26.

29. A system for processing a signal of an electric power system, comprising:

an input filter for eliminating a higher harmonic of an AC signal supplied from said electric power system;

a frequency detecting means for detecting a frequency of the AC signal;

a gain correcting means for correcting an output signal of said input filter in accordance with a gain correction value corresponding to a detection output of said frequency detecting means, said gain correction value being extracted from gain correction values prescribed based on the frequency-gain characteristics of said input filter; and a physical quantity detecting means for detecting a physical quantity of the AC signal from an output signal of said gain correcting means.

30. A system for processing a signal of an electric power system, comprising:

an input filter for eliminating a higher harmonic of an AC signal supplied from said electric power system;

a frequency detecting means for detecting a frequency of the AC signal;

a physical quantity detecting means for detecting a physical quantity of the AC signal from an output signal of said input filter; and a gain correcting means for correcting an output signal of said physical quantity detecting means in accordance with a gain correction value corresponding to a detection output of said frequency detecting means, said gain correction value being extracted from gain correction values prescribed based on frequency-gain characteristics of said input filter.

31. A system for processing a signal of an electric power system, comprising:

sample hold means for sample-holding an AC signal supplied from said electric power system;

analog-to-digital converting means for converting a signal held by said sample hold means into a digital signal;

a digital filter for extracting a specific frequency component from the digital signal output from said analog-to-digital converting means;

frequency detecting means for detecting a frequency of the AC signal;

gain correcting means for correcting an output signal of said digital filter in accordance with a gain correction value corresponding to a detection output of said frequency detecting means, said gain correction value being extracted from gain correction values prescribed based on frequency-gain characteristics of said digital filter; and physical quantity detecting means for detecting a physical quantity of the AC signal from an output signal of said gain correcting means.

32. A system for processing a signal of in electronic power system, comprising:

a sample hold means for sample-holding an AC signal supplied from said electric power system;

an analog-to-digital converting means for converting a signal held by said sample hold means into a digital signal;

a digital filter for extracting a specific frequency component from the digital signal output from said analog-to-digital converting means;

frequency detecting means for detecting a frequency of the AC signal;

physical quantity detecting means for detecting a physical quantity of the AC signal from an output signal of said digital filter; and gain correcting means for correcting an output signal of said physical quantity detecting means in accordance with a gain correction value corresponding to a detection output of said frequency detecting means, said gain correction value being extracted from gain correction values prescribed based on frequency-gain characteristics of said digital filter.

33. The system as set forth in claims 31 or 32, wherein a sampling period is less than 1/24 of a fundamental frequency of the AC signal of said electric power system.

34. The system as set forth in claim 29 or 30, wherein said input filter is an analog input filter.

35. The system as set forth in claims 29, 30, 31, or 32, wherein the physical quantity is an effective value of the AC signal, and said physical quantity detecting means includes a peak value detecting means for obtaining a peak value of the gain-corrected AC signal and an effective value arithmetic means for obtaining the effective value of the AC signal from the obtained peak value.

36. The system as set forth in claims 29, 30, 31 or 32, wherein said physical quantity detecting means includes an averaging processing means for detecting peak values and effective values for a plurality of periods of the AC signals inputted thereto, averaging the effective values for the plurality of periods and outputting the averaged value thereof.

37. The system as set forth in claims 29, 30, 31, or 32, wherein the physical quantity is an effective value of the AC signal, and said physical quantity detecting means includes an effective value arithmetic means for obtaining the effective value by integrating the gain-corrected AC signal.

38. The system as set forth in claims 29, 30, 31, or 32, wherein the physical quantity is an effective value of the AC signal, and said physical quantity detecting means includes a peak value detecting means for obtaining the peak value of the AC signal outputted from said input filter and an effective value arithmetic means for obtaining the effective value of the AC signal. the effective value being then corrected by said gain correcting means.

39. The system as set forth in claims 29, 30, 31, or 32, wherein the physical quantity is an effective value of the AC signal, said physical quantity detecting means is an effective value arithmetic means for obtaining the effective value by integrating the AC signal outputted from said input filter, and said gain correcting means corrects the obtained effective value.

40. The system as set forth in claims 29, 30, 31, or 32, wherein the gain correction data are approximate functions set by rectilinear approximation in a plurality of sections formed by dividing a constant frequency range the reference of which is the fundamental frequency of the AC signal.

41. A system for processing a signal of an electric power system, comprising:

a digital input filter for eliminating a higher harmonic of an AC signal of said electric power system which is inputted with a constant sampling period; and a physical quantity detecting means for detecting a physical quantity, said physical quantity is an effective value of the AC signal outputted from said digital input filter, wherein a filter operation program and a filter coefficient are set so that a frequency-gain characteristic of said digital input filter becomes a constant value within a constant range, the reference of which is the fundamental frequency of the AC signal.

42. The system as set forth in claim 41, wherein said physical quantity detecting means includes a peak value detecting means for obtaining the peak value of the AC signal inputted thereto and an effective value arithmetic means for obtaining the effective value of the AC signal from the obtained peak value.

43. The system as set forth in claim 41, said physical quantity detecting means includes an effective value arithmetic means for obtaining an effective value of the AC signal by integrating the AC signal inputted thereto.

44. An electric power controlling system for controlling an electric power controller to cause a deviation between a predetermined target voltage and target reactive power to become zero, the deviation being obtained by inputting an effective value of an AC voltage of an electric rower system which is detected by said signal processing system claimed in any one of claims 29 through 32 and 41 through 43 and the reactive power detected by a reactive power detecting means.

* * * * *